(12) United States Patent
Yamashita

(10) Patent No.: US 11,282,873 B2
(45) Date of Patent: Mar. 22, 2022

(54) PHOTODETECTOR AND IMAGING DEVICE

(71) Applicant: FUJITSU LIMITED, Kawasaki (JP)

(72) Inventor: Hiroyasu Yamashita, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 366 days.

(21) Appl. No.: 16/445,533

(22) Filed: Jun. 19, 2019

(65) Prior Publication Data
US 2019/0305021 A1 Oct. 3, 2019

Related U.S. Application Data

(63) Continuation of application No. PCT/JP2017/046676, filed on Dec. 26, 2017.

(30) Foreign Application Priority Data

Jan. 6, 2017 (JP) .............................. JP2017-001228

(51) Int. Cl.
*H01L 27/146* (2006.01)
*H01L 27/142* (2014.01)
(Continued)

(52) U.S. Cl.
CPC ........ *H01L 27/14607* (2013.01); *H01L 27/14* (2013.01); *H01L 27/142* (2013.01);
(Continued)

(58) Field of Classification Search
CPC ..... H01L 27/14; H01L 27/142; H01L 27/146; H01L 27/14607; H01L 27/14625;
(Continued)

(56) References Cited

U.S. PATENT DOCUMENTS 5,818,066 A 10/1998 Duboz
6,423,980 B1 7/2002 Wilson et al.
(Continued)

FOREIGN PATENT DOCUMENTS

JP 9-55532 A 2/1997
JP 9-172227 A 6/1997
(Continued)

OTHER PUBLICATIONS

International Search Report dated Mar. 20, 2018, issued in counterpart application No. PCT/JP2017/046676, w/English translation (5 pages).
(Continued)

*Primary Examiner* — Matthew C Landau
*Assistant Examiner* — Dmitriy Yemelyanov
(74) *Attorney, Agent, or Firm* — Westerman, Hattori, Daniels & Adrian, LLP

(57) ABSTRACT

A photodetector includes: a photoelectric conversion layer including a first principal surface from which light enters and a second principal surface on the opposite side from the first principal surface and configured to perform photoelectric conversion on the light; a first diffraction grating formed on a side of the second principal surface and including a configuration where first surfaces which extend in a stripe state in a first direction and second surfaces which extend in a stripe state in the first direction and have a height difference with respect to the first surfaces are alternately arranged; metal wires provided at intervals over the first surfaces and the second surfaces and which extend in the first direction or a second direction perpendicular to the first direction; and a second diffraction grating formed over the first diffraction grating and including grooves which are formed at intervals and extend in the second direction.

12 Claims, 44 Drawing Sheets

(51) Int. Cl.
  *H01L 31/10* (2006.01)
  *H01L 27/14* (2006.01)
(52) U.S. Cl.
  CPC ...... *H01L 27/146* (2013.01); *H01L 27/14665* (2013.01); *H01L 31/10* (2013.01)
(58) Field of Classification Search
  CPC ......... H01L 27/14652; H01L 27/14665; H01L 31/02327; H01L 31/02363; H01L 31/035218; H01L 31/035236; H01L 31/10; H01L 31/105; Y02E 10/50
  See application file for complete search history.

(56) References Cited

U.S. PATENT DOCUMENTS

| | | | |
|---|---|---|---|
| 7,745,815 | B2 | 6/2010 | Bandara et al. |
| 2002/0088943 | A1 | 7/2002 | Masalkar |
| 2002/0117658 | A1* | 8/2002 | Bandara ................ H01L 31/101 257/14 |
| 2006/0072194 | A1 | 4/2006 | Lee |
| 2011/0110628 | A1 | 5/2011 | Okamoto et al. |
| 2011/0229079 | A1* | 9/2011 | Matsumoto ............ G02B 6/124 385/37 |
| 2012/0286163 | A1* | 11/2012 | Stiens ..................... G02F 1/015 250/340 |

FOREIGN PATENT DOCUMENTS

| | | |
|---|---|---|
| JP | 2000-156513 A | 6/2000 |
| JP | 2006-106758 A | 4/2006 |
| JP | 2010-114381 A | 5/2010 |
| JP | 2013-254215 A | 12/2013 |
| WO | 2010/021073 A1 | 2/2010 |

OTHER PUBLICATIONS

Apalkov et al., "Polarization Sensitivity of Quantum Well Infrared Photodetector Coupled to a Metallic Diffraction Grid", IEEE Journal of Quantum Electrics, 2010, vol. 46, No. 6, p. 877-883, cited in ISR (7 pages).

Antoni et al., "High contrast polarization sensitive quantum well infrared photodetectors", Applied Physics Letters, 2007, vol. 90, p. 201107-1 to 201107-3, cited in ISR (4 pages).

* cited by examiner

PHOTODETECTOR AND IMAGING DEVICE

CROSS-REFERENCE TO RELATED APPLICATION

This application is a continuation application of International Application PCT/JP2017/046676 filed on Dec. 26, 2017 and designated the U.S., the entire contents of which are incorporated herein by reference. The International Application PCT/JP2017/046676 is based upon and claims the benefit of priority of the prior Japanese Patent Application No. 2017-001228, filed on Jan. 6, 2017, the entire contents of which are incorporated herein by reference.

FIELD

The embodiments discussed herein are related to photodetectors and imaging devices.

BACKGROUND

There are various kinds of photodetectors that perform photoelectric conversion.

International Publication Pamphlet No. WO 2010/021073 and Japanese Laid-open Patent Publication No. 9-55532 are disclosed as related art.

SUMMARY

According to an aspect of the embodiments, a photodetector includes: a photoelectric conversion layer including a first principal surface from which light enters and a second principal surface on the opposite side from the first principal surface and configured to perform photoelectric conversion on the light; a first diffraction grating formed on a side of the second principal surface and including a configuration where a plurality of first surfaces which extend in a stripe state in a first direction and a plurality of second surfaces which extend in a stripe state in the first direction and have a height difference with respect to the first surfaces are alternately arranged; a plurality of metal wires provided at intervals over each of the first surfaces and the second surfaces and which extend in the first direction or a second direction perpendicular to the first direction; and a second diffraction grating formed over the first diffraction grating and including a plurality of grooves which are formed at intervals and extend in the second direction.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

As a photodetector, a quantum well infrared photodetector (QWIP) is a device that detects infrared light by using transitions between artificial levels formed in quantum well layers, and is capable of detecting infrared light with high sensitivity.

A quantum dot infrared photodetector (QDIP) that is developed from a QWIP is another example of a photodetector. A QDIP forms quantum dots to which electrons are bound, and is capable of detecting infrared light with high sensitivity, using transitions between bound states.

A focal plane array (FPA) in which QWIPs, QDIPs, or the like are arranged in an array is used in an imaging device, so that a high-sensitivity imaging device for infrared light can be formed.

In addition to a QWIP and a QDIP, a photovoltaic cell is yet another example of a photodetector.

Photodetectors such as the above described QWIPs, QDIPs, and photovoltaic cells still may have room for improvement in photoelectric conversion efficiency.

In one aspect, photoelectric conversion efficiency may be enhanced.

Before embodiments of the present invention are described, the aspects studied by the inventor of the present invention are explained.

As described above, examples of photodetectors include QWIPs and QDIPs. The following is a description of those photodetectors.

Figure 1:
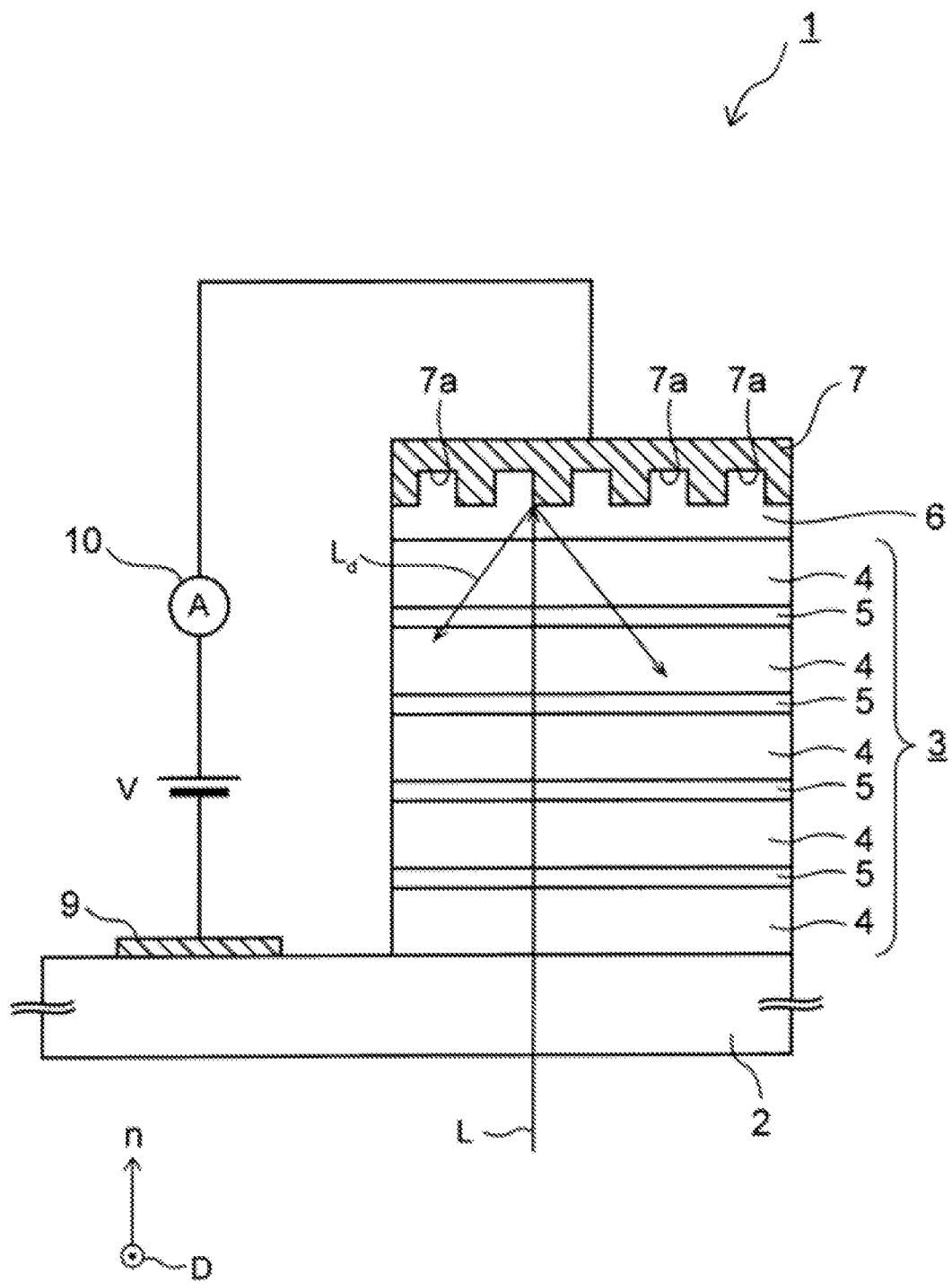
FIG. 1 is a cross-sectional view of a QWIP used in studies.

FIG. 1 is a cross-sectional view of a QWIP used in the studies.

A QWIP 1 includes a substrate 2 such as a GaAs substrate, and a photoelectric conversion layer 3 formed on the substrate 2.

The photoelectric conversion layer 3 has a function of performing photoelectric conversion on a light L entering through the substrate 2. In this example, a laminated film formed by alternately stacking barrier layers 4 and quantum well layers 5 is used as the photoelectric conversion layer 3.

A compound semiconductor having a wider bandgap than the material of the quantum well layers 5 is used as the material of the barrier layers 4. As a result, an artificial level is formed in the quantum well layers 5, and electrons serving as carriers are confined in the quantum well layers 5. The material capable of forming an artificial level in this manner is not limited to any particular material. For example, it is possible to form an artificial level by forming AlGaAs layers as the barrier layers 4 and n-type GaAs layers as the quantum well layers 5.

Further, a GaAs layer that transmits the light L is formed as an ohmic contact layer 6 on the photoelectric conversion layer 3, and a diffraction grating 7 for diffracting the light L is further provided on the ohmic contact layer 6.

The diffraction grating 7 is a metal layer such as a gold layer, and a plurality of grooves 7a is formed in the lower surface thereof.

Each groove 7a extends in a direction D perpendicular to the normal direction n of the substrate 2, and its surface is a reflective surface that reflects the light L. The diffraction grating 7 having the grooves 7a that extend one dimensionally in this manner is also called a one-dimensional grating.

The diffraction grating 7 also serves as an electrode of the QWIP 1, and a voltage V is applied between the diffraction grating 7 and an electrode layer 9 formed on the substrate 2.

With this QWIP 1, when the light L enters the quantum well layers 5, electrons bound to the quantum well layers 5 absorb the light L and are excited.

The electrons thus excited are then unbound from the quantum well layers 5, and are gathered in the diffraction grating 7 by the voltage V. As a result, a photocurrent flows between the electrode layer 9 and the diffraction grating 7, and the photocurrent is measured by an ammeter 10, to obtain an optical signal indicating the intensity of the light L.

The light L to be detected in the QWIP 1 is medium to long wavelength infrared light having a wavelength of about 3 μm to 10 μm.

As the diffraction grating 7 is adopted as in this example, it is possible to obtain a diffracted light $L_d$ having an electric field component in such a direction as to be easily absorbed by the quantum well layers 5 as described below.

Figure 2:
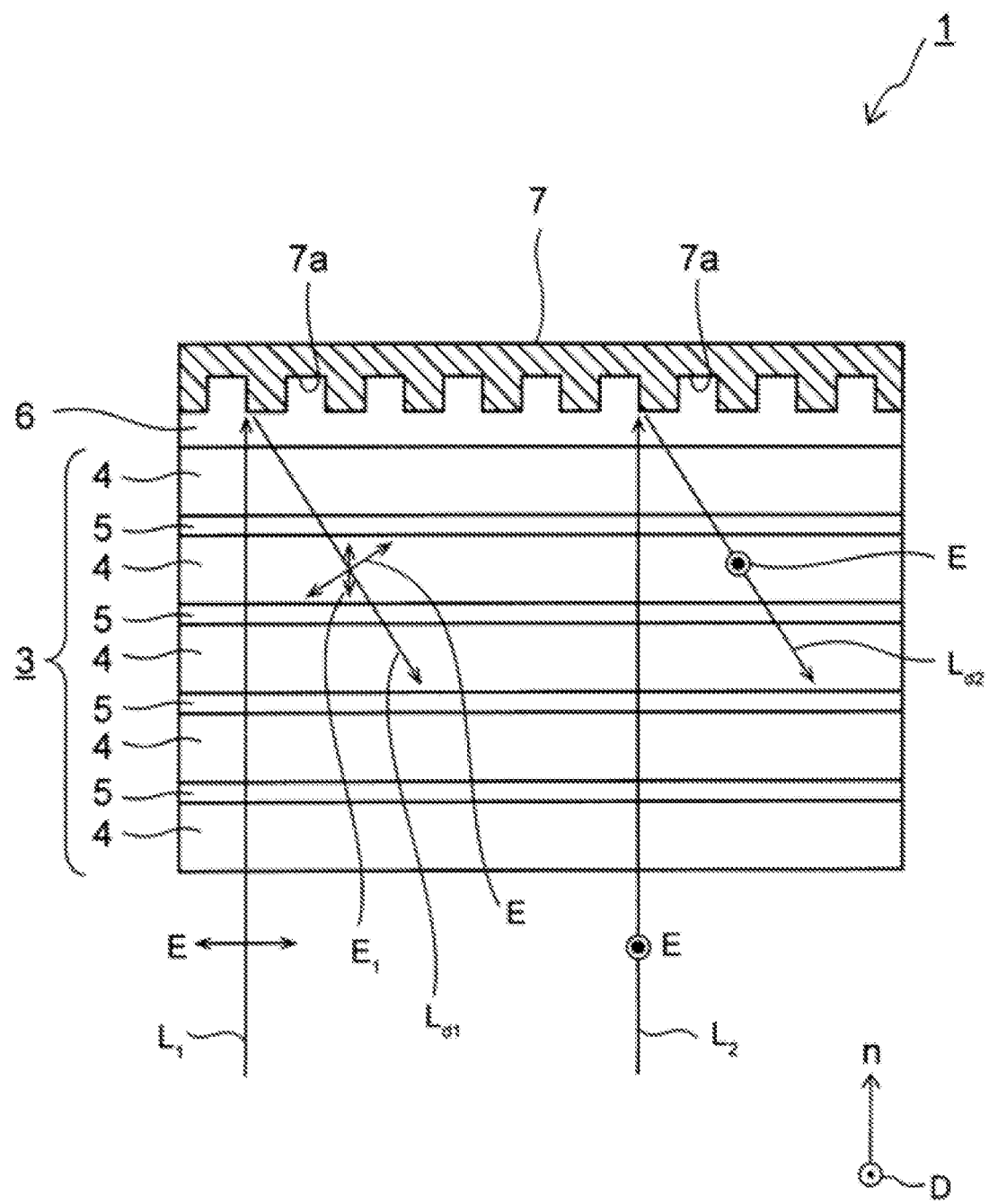
FIG. 2 is a schematic cross-sectional view for explaining an electric field component that is easily absorbed by quantum well layers.

FIG. 2 is a schematic cross-sectional view for explaining an electric field component that is easily absorbed by the quantum well layers 5.

In the QWIP 1, the electron transition between the subband levels formed by the quantum wells is used for light absorption. In this case, only the light having an electric field component parallel to the normal direction n of the substrate 2 is absorbed by each quantum well layer 5, according to the quantum mechanical selection rule.

In the example case illustrated in FIG. 2, a light $L_1$ having an electric field E in a direction perpendicular to the direction D in which the grooves 7a of the diffraction grating 7 extend, and a light $L_2$ having an electric field E in the same direction as the direction D each travel in the normal direction n and enter the QWIP 1.

Since the electric field E of the light $L_1$ is perpendicular to the normal direction n, the light $L_1$ is hardly absorbed in each quantum well layer 5.

On the other hand, the diffracted light $L_{d1}$ obtained by diffracting the light $L_1$ with the diffraction grating 7 is absorbed by each quantum well layer 5, because its electric field E has a component $E_1$ parallel to the normal direction n.

The light $L_2$ is not absorbed in each quantum well layer 5 regardless of the presence or absence of the diffraction grating 7, because the diffracted light $L_{d2}$ obtained by the diffraction grating 7 does not have an electric field component parallel to the normal direction n.

As described above, in the QWIP 1, the diffracted light $L_{d1}$ of the light $L_1$ is absorbed in each quantum well layer 5 by virtue of the presence of the diffraction grating 7, but the light $L_2$ whose polarization direction is perpendicular to that of the light $L_1$ Is not absorbed in each quantum well layer 5.

Next, a QDIP is explained.

Figure 3:
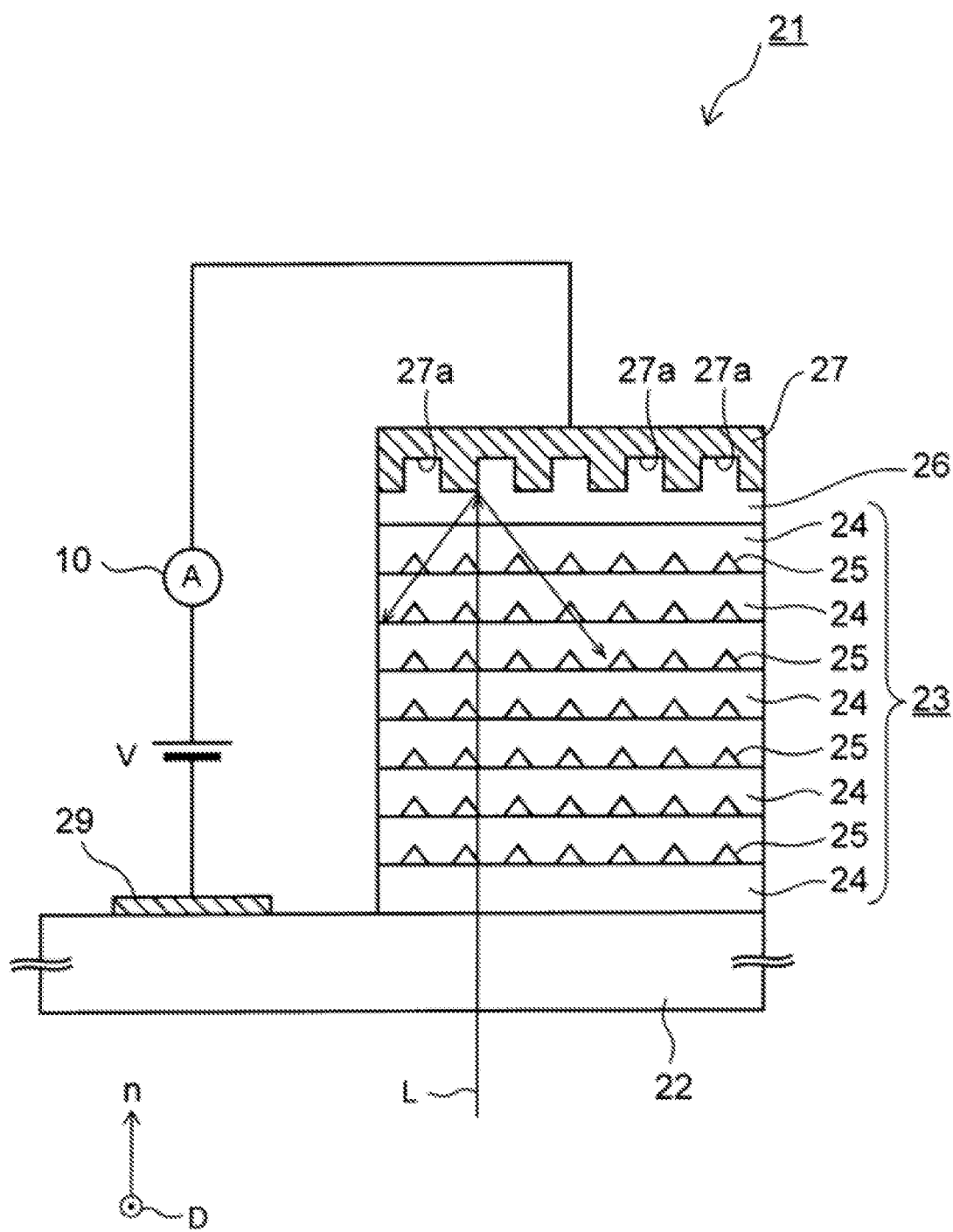
FIG. 3 is a cross-sectional view of a QDIP used in the studies.

FIG. 3 is a cross-sectional view of a QDIP used in the studies.

A QDIP 21 includes a substrate 22 such as a GaAs substrate, and a photoelectric conversion layer 23 formed on the substrate 22.

In this structure, the photoelectric conversion layer 23 is a laminated film formed by alternately stacking intermediate layers 24 and quantum dots 25, and performs photoelectric conversion on a light L entering through the substrate 22.

There are various combinations of materials of the intermediate layers 24 and the quantum dots 25. In this example, AlGaAs layers are formed as the intermediate layers 24, and InAs is used as the material of the quantum dots 25.

Further, a GaAs layer is formed as an ohmic contact layer 26 on the photoelectric conversion layer 23, and a diffraction grating 27 for diffracting the light L is further provided on the ohmic contact layer 26.

The diffraction grating 27 is a one-dimensional grating as in the example in FIG. 1, and is a gold layer in which grooves 27a are formed.

Each groove 27a functions as a reflective surface that reflects the light L, and extends in the direction D perpendicular to the normal direction n of the substrate 22.

The diffraction grating 27 also serves as an electrode of the QDIP 21, and a voltage V is applied between the diffraction grating 27 and an electrode layer 29 formed on the substrate 22.

With this QDIP 21, when the light L enters the quantum dots 25, electrons transit between bound states formed in the quantum dots 5, and the light L is absorbed by the quantum dots 25. The electrons unbound from the quantum dots 25 by the transition are then gathered in the diffraction grating 27 by the voltage V. As a result, a photocurrent flows between the electrode layer 29 and the diffraction grating 27, and the photocurrent is measured by an ammeter 10, to obtain an optical signal indicating the intensity of the light L.

The light L to be detected in the QDIP 21 is medium to long wavelength infrared light having a wavelength of about 3 μm to 10 μm.

In this example, the quantum dots 25 may absorb both light having an electric field parallel to the normal direction n and light having an electric field in a direction perpendicular to the normal direction n.

However, due to the quantum mechanical selection rule, light absorption in the quantum dots 25 occurs primarily when light having an electric field component in the same direction as the quantum confinement direction corresponding to the excitation level enters the quantum dots 25.

Accordingly, light absorption using electron transition to the excitation level corresponding to quantum confinement in a direction perpendicular to the normal direction n occurs frequently with light having an electric field component in the direction perpendicular to the normal direction n, and light absorption becomes more unlikely to occur as the electric field component in the direction becomes smaller.

The light L that has traveled in the normal direction n and entered from the substrate 22 has an electric field in the direction perpendicular to the normal direction n, and therefore, is absorbed by the quantum dots 25 without any change in the direction of the electric field in the diffraction grating 27.

However, the photoelectric conversion efficiency in the QDIP 21 can be enhanced by the presence of the diffraction grating 27 for the reasons described below.

Figure 4:
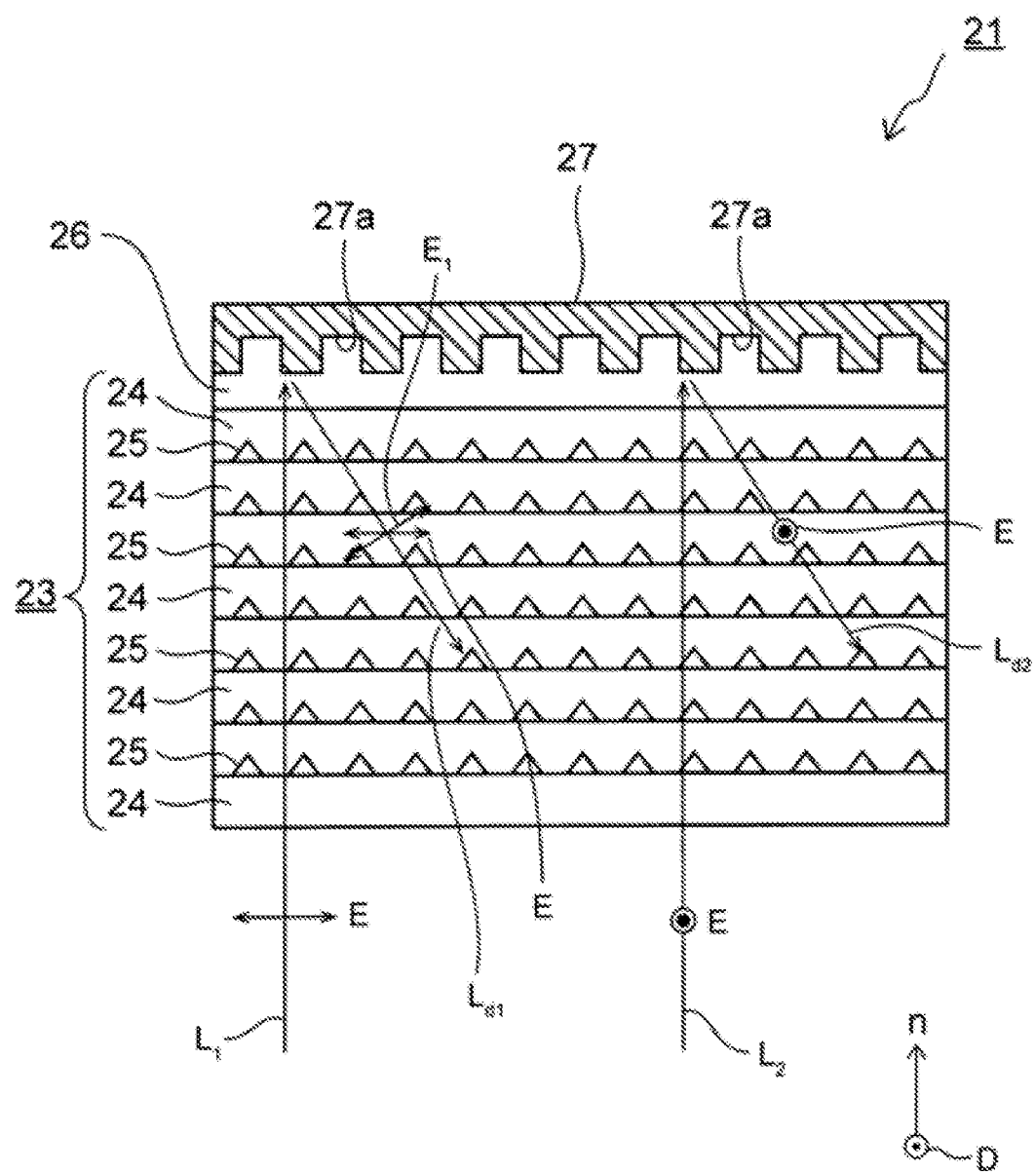
FIG. 4 is a cross-sectional view for explaining the functions of a diffraction grating.

FIG. 4 is a cross-sectional view for explaining the functions of the diffraction grating 27.

In an example case illustrated in FIG. 4, a light $L_1$ having an electric field E in a direction perpendicular to the direction D in which the grooves 27a of the diffraction grating 27 extend, and a light $L_2$ having an electric field E in the same direction as the direction D each travel in the normal direction n and enter the QDIP 21.

The light $L_1$ and the light $L_2$ each have an electric field E perpendicular to the normal direction n, and therefore, are absorbed in the quantum dots 25.

However, of the diffracted light $L_{d1}$ obtained by diffracting the light $L_1$ with the diffraction grating 27, an electric field component $E_1$ perpendicular to the normal direction n has a smaller magnitude than that of the original light $L_1$. Therefore, the diffracted light $L_{d1}$ becomes more unlikely to be absorbed in the quantum dots 25.

Even in this case, the diffracted light $L_{d1}$ is repeatedly reflected in the photoelectric conversion layer 23, and thus, the length of the optical path of the diffracted light $L_{d1}$ becomes longer. As a result, the opportunity for the diffracted light $L_{d1}$ to be absorbed in the quantum dots 25 can be increased, and the photoelectric conversion efficiency in the QDIP 21 can be enhanced.

As for the diffracted light $L_{d2}$ obtained by diffracting the light $L_2$ with the diffraction grating 27, the electric field E perpendicular to the normal direction n does not change before and after diffraction. Therefore, the diffracted light $L_{d2}$ does not become unlikely to be absorbed in the quantum dots 25.

As described above, in the QDIP 21, the length of the optical path of incident light is increased by the diffraction grating 27. Thus, the photoelectric conversion efficiency is enhanced.

Meanwhile, light is divided into a TE wave and a TM wave, depending on its polarization state. A TM wave and a TE wave are explained below.

Figure 5:
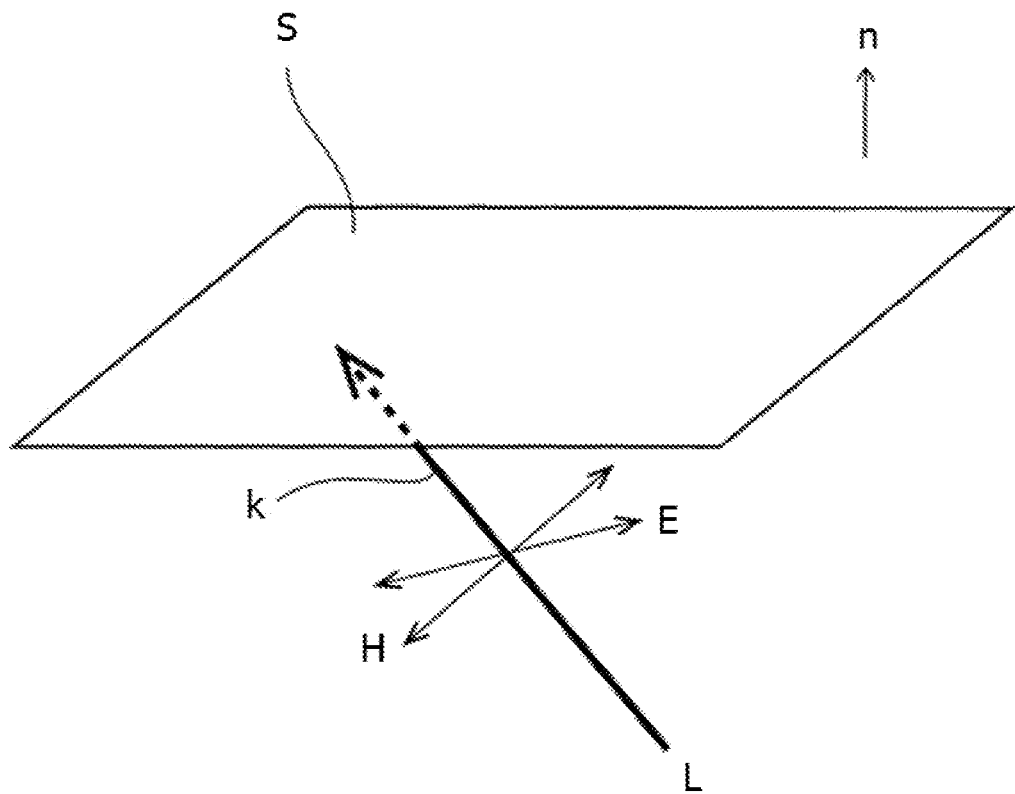
FIG. 5 is a perspective view for explaining a TM wave.

FIG. 5 is a perspective view for explaining a TM wave.

FIG. 5 illustrates an example case where a light L of a wave number vector k obliquely enters a crystal surface S. The crystal surface S may be any surface parallel to the surface of each of the substrates 2 and 22.

As illustrated in FIG. 5, a TM wave is defined as light having a magnetic field vector H parallel to the crystal surface S.

Since the electric field vector E of the light is perpendicular to the magnetic field vector H, the component of the electric field vector E in the normal direction n is not zero in the TM wave obliquely entering the crystal surface S. Further, as described with reference to FIG. 2, in a QWIP, only light having an electric field component parallel to the normal direction n is absorbed by the quantum well layers 5.

For this reason, a TM wave is regarded as light suitable for enhancing the photoelectric conversion efficiency of a QWIP.

Figure 6:
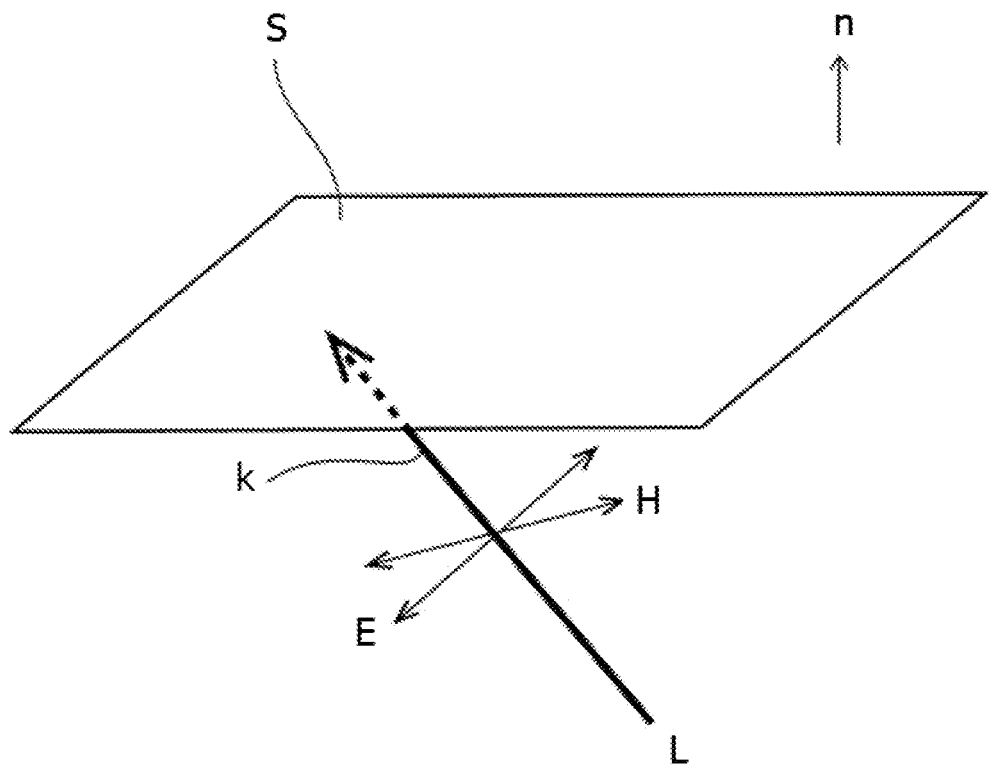
FIG. 6 is a perspective view for explaining a TE wave.

FIG. 6 is a perspective view for explaining a TE wave.

In FIG. 6, the same components as those in FIG. 5 are denoted by the same reference signs as those used in FIG. 5, and explanation thereof will not be repeated in the description below.

As illustrated in FIG. 6, a TE wave is defined as light having an electric field vector E parallel to the crystal surface S.

Next, effects to confine a TM wave and a TE wave are described.

Figure 7:
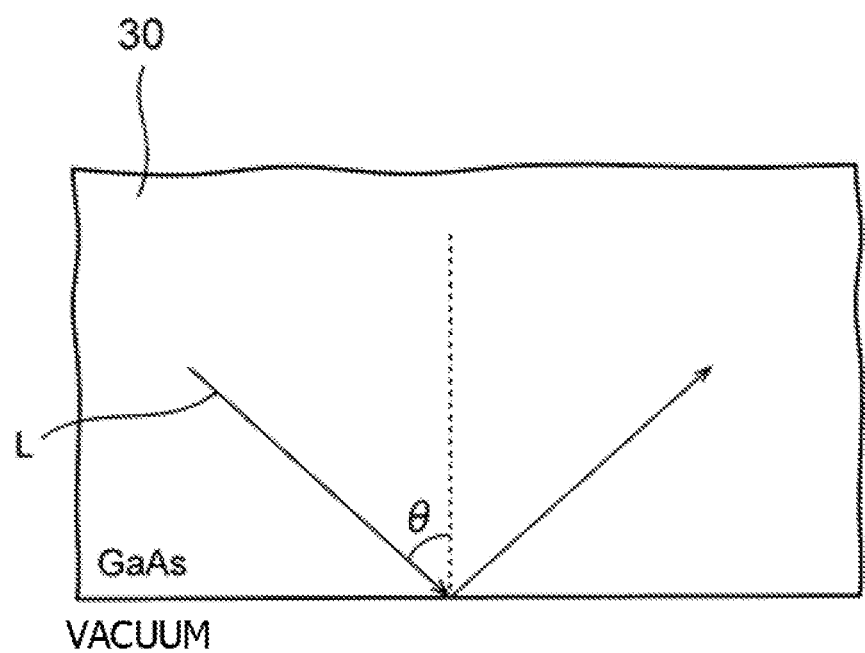
FIG. 7 is a schematic cross-sectional view for explaining a light confinement effect.

FIG. 7 is a schematic cross-sectional view for explaining a light confinement effect.

In this example, a light L travels from a crystal layer 30 such as a GaAs layer toward vacuum. In this case, the light L is reflected on the surface of the crystal layer 30. However, the larger the amount of the light L staying inside the crystal layer 30 due to the reflection, the higher the efficiency of confinement of the light L.

In view of this, the inventor examined the relationship between the reflection angle θ of the light L and the reflectance of the light L on the surface of the crystal layer 30. A GaAs layer having a refractive index of 3.3 was used as the crystal layer 30.

Figure 8:
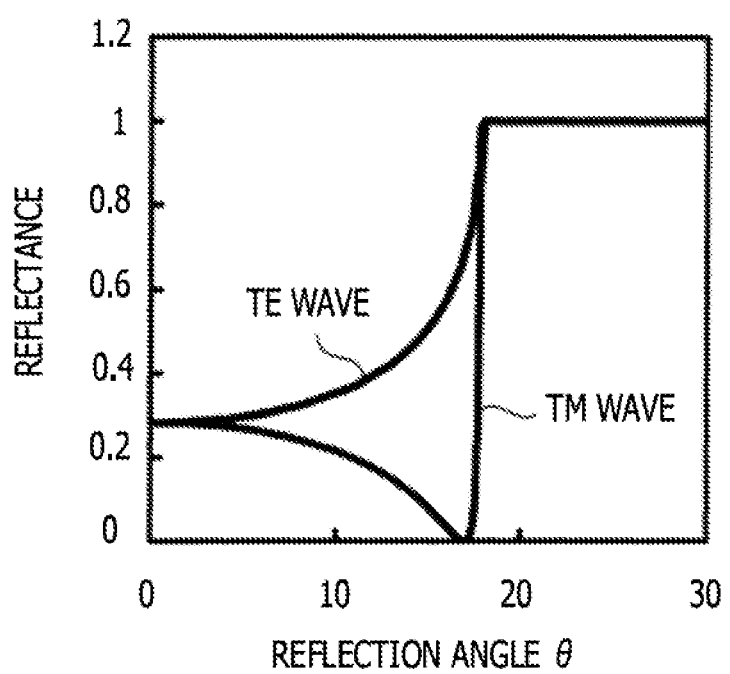
FIG. 8 is a graph obtained through an examination of the relationship between reflection angle and reflectance of light.

FIG. 8 illustrates the results of the examination.

As illustrated in FIG. 8, as for a TM wave, when the reflection angle increases from 0°, the reflectance temporarily decreases, and therefore, light leaks from the crystal layer 30.

As for a TE wave, on the other hand, as the reflection angle increases from 0°, the reflectance also increases, and accordingly, light hardly leaks from the crystal layer 30.

As is apparent from these results, a TE wave has a greater light confinement effect than a TM wave.

As described above, in the QDIP 21 (see FIG. 3), light is repeatedly reflected in the photoelectric conversion layer 23, so that the photoelectric conversion efficiency is enhanced. According to the results illustrated in FIG. 8, to keep light from leaking to the outside at the time of reflection, it is preferable to use a TE wave as the light that is to be repeatedly reflected in the QDIP 21.

From the above results, it has become apparent that photoelectric conversion efficiency is enhanced by a TE wave in a QDIP, and photoelectric conversion efficiency is enhanced by a TM wave in a QWIP.

The following is a description of respective embodiments capable of forming a TE wave or a TM wave regardless of the direction of polarization of incident light, and enhancing photoelectric conversion efficiency.

First Embodiment

A photodetector according to the present embodiment is now described in conjunction with its manufacturing process.

In the present embodiment, a QWIP is manufactured as a photodetector as described below.

FIGS. 9A through 14B are cross-sectional views of a photodetector according to the present embodiment in the manufacturing process. Each of these drawings illustrates a first cross-section, and a second cross-section perpendicular to the first cross-section.

Figure 9A:
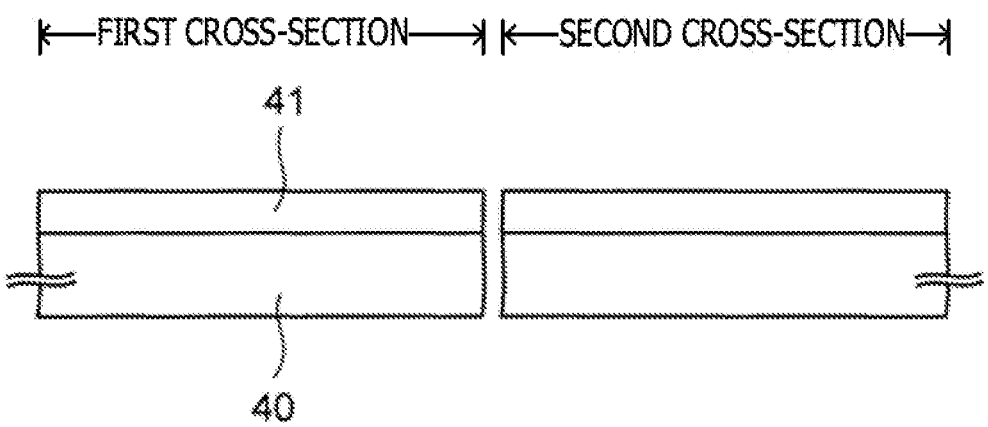
FIGS. 9A and 9B are cross-sectional views of a photodetector according to a first embodiment in the manufacturing process.

First, as illustrated in FIG. 9A, a GaAs substrate made of GaAs transparent to infrared light is prepared as a substrate 40. An n-type GaAs layer of about 1 μm in thickness is formed as a first ohmic contact layer 41 on the substrate 40 by metal organic vapor phase epitaxy (MOVPE). The n-type impurity with which the first ohmic contact layer 41 is doped is silicon, for example, and the concentration thereof is about $1 \times 10^{18}$ cm$^{-3}$.

Figure 9B:
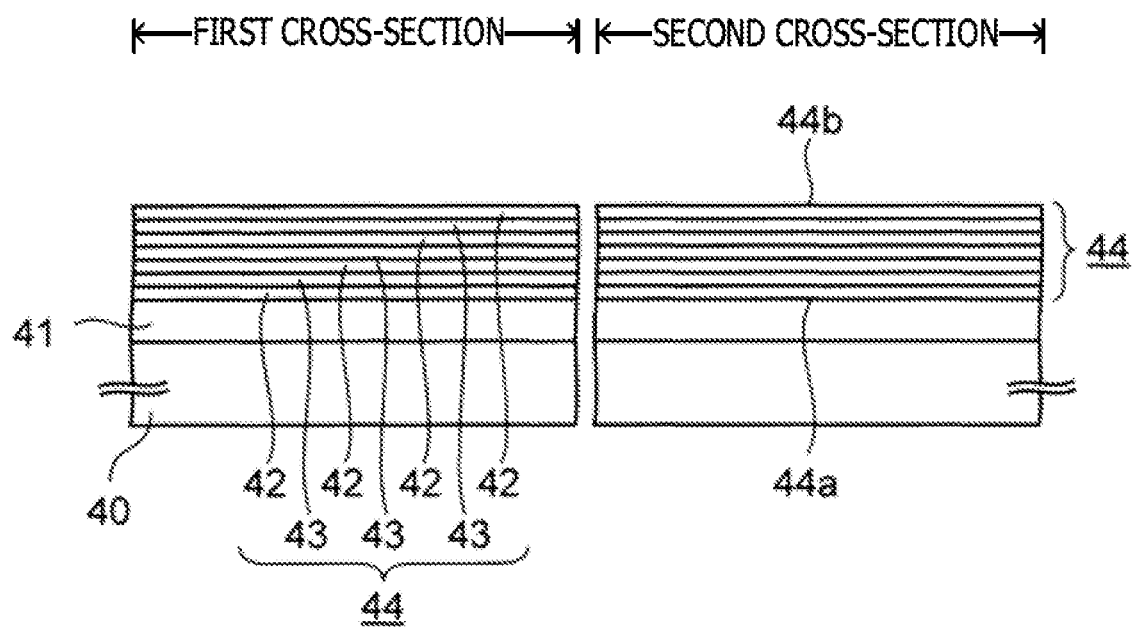

As illustrated in FIG. 9B, a plurality of barrier layers 42 and a plurality of quantum well layers 43 are then alternately stacked on the first ohmic contact layer 41 by MOVPE, and this laminated film is used as a photoelectric conversion layer 44.

The material of each of the layers forming the photoelectric conversion layer 44 is not limited to any particular material. In the present embodiment, $Al_{0.25}Ga_{0.75}As$ layers of about 40 nm in thickness are formed as the barrier layers 42, and n-type GaAs layers of about 5 nm in thickness are formed as the quantum well layers 43. The n-type impurity with which the quantum well layers 43 are doped is silicon with a concentration of about $4 \times 10^{17}$ cm$^{-3}$, for example.

The number of the barrier layers 42 is 21, and the number of the quantum well layers 43 is 20.

The photoelectric conversion layer 44 formed in this manner has a first principal surface 44a that the light to be detected is to enter, and a second principal surface 44b on the opposite side from the first principal surface 44a.

Photoelectric conversion is then performed in the photoelectric conversion layer 44 on light entering from the first principal surface 44a, and a diffraction grating for enhancing the photoelectric conversion efficiency is formed on the side of the second principal surface 44b through a process described below.

The light to be photoelectrically converted in the photoelectric conversion layer 44 is medium to long wavelength infrared light having a wavelength of about 3 μm to 10 μm.

Figure 10A:
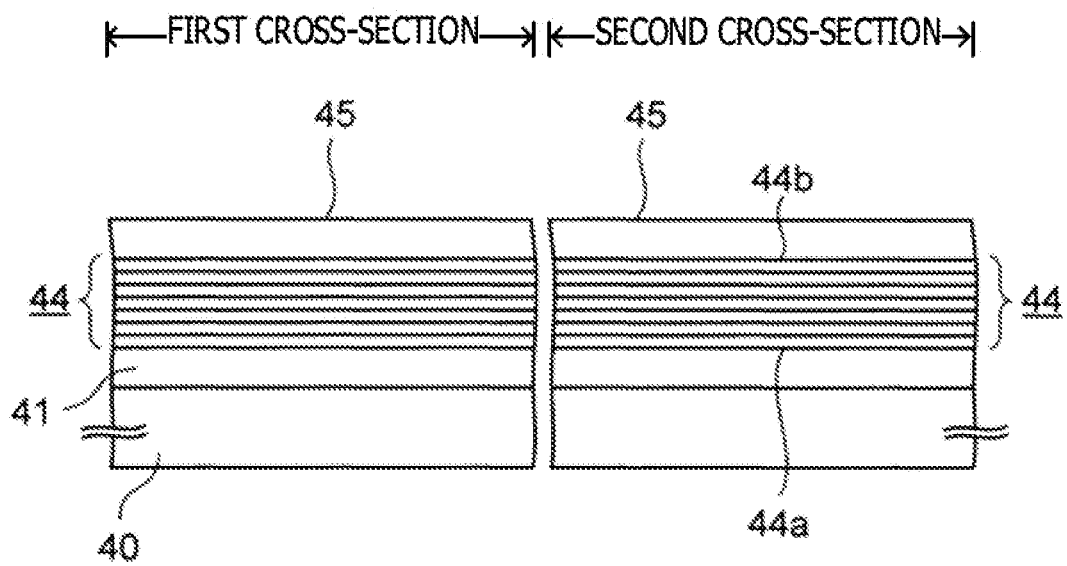
FIGS. 10A and 10B are cross-sectional views of the photodetector according to the first embodiment in the manufacturing process.

As illustrated in FIG. 10A, an n-type GaAs layer that is doped with silicon at a concentration of about $1 \times 10^{18}$ cm$^{-3}$ and has a thickness of about 1.5 μm is then formed on the second principal surface 44b of the photoelectric conversion layer 44 by MOVPE, and the GaAs layer is set as a first semiconductor layer 45.

Figure 10B:
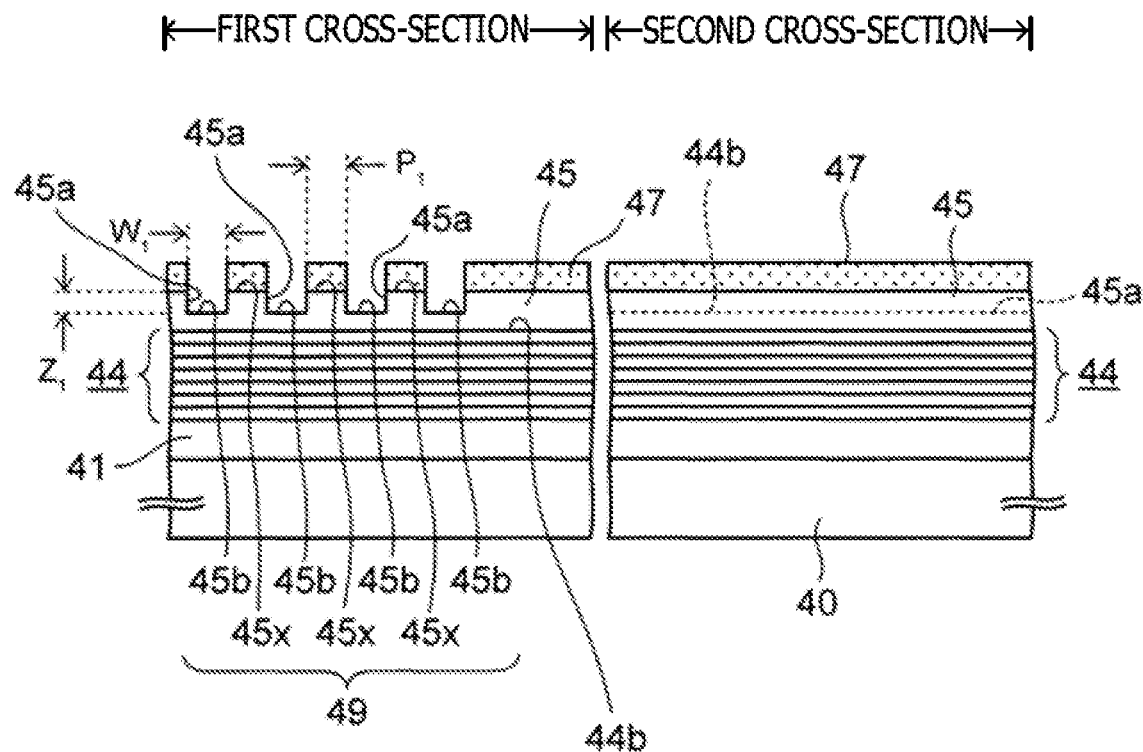

As illustrated in FIG. 10B, a photoresist is then applied onto the first semiconductor layer 45, and the photoresist is exposed and developed, to form a first resist layer 47.

With the first resist layer 47 being used as a mask, dry etching is then performed on the first semiconductor layer 45, so that a plurality of first grooves 45a is formed at intervals in a surface 45x of the first semiconductor layer 45.

As a result, a first diffraction grating 49 including the bottom surfaces 45b and the surfaces 45x of the first grooves 45a is formed on the side of the second principal surface 44b of the photoelectric conversion layer 44. The bottom surfaces 45b and the surfaces 45x are an example of the first surfaces and the second surfaces, respectively, and light is diffracted by a difference in height between these surfaces.

The size of the first grooves 45a is not particularly limited to any particular size, as long as the first grooves 45a are small enough to diffract light as described above. In the present embodiment, the depth $Z_1$ of the first grooves 45a is 0.75 μm, and the width $W_1$ thereof is 2.5 μm. The interval $P_1$ between each two adjacent first grooves 45a is 2.5 μm, for example.

After this step, the first resist layer 47 is removed.

Figure 15:
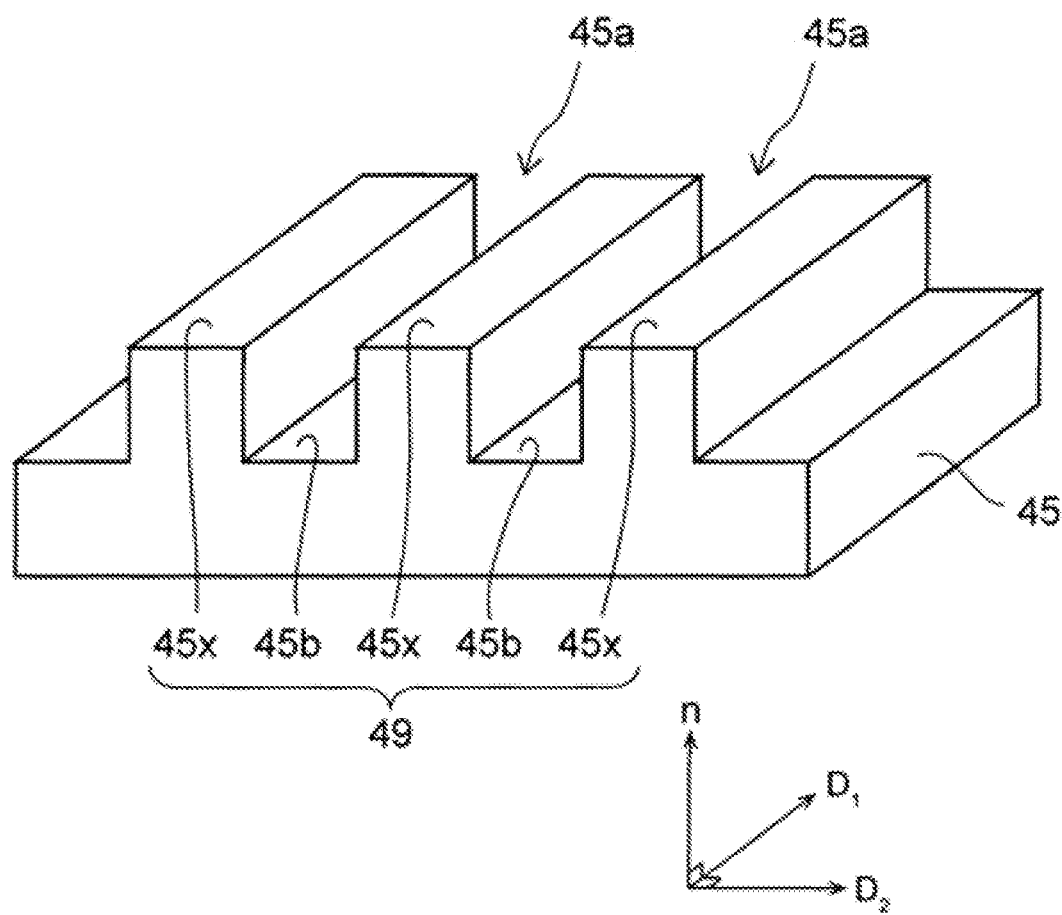
FIG. 15 is a perspective view of a first diffraction grating according to the first embodiment.

FIG. 15 is a perspective view of the first diffraction grating 49 after this step is completed.

As illustrated in FIG. 15, the respective bottom surfaces 45b and the respective surfaces 45x extend in a stripe state in a first direction $D_1$ perpendicular to the normal direction n of the substrate 40, and are alternately formed in a second direction $D_2$ perpendicular to both the first direction $D_1$ and the normal direction n.

The first cross-section in each of FIGS. 9A through 14B is a cross-section taken along a section plane perpendicular to the first direction $D_1$, and the second cross-section is a cross-section taken along a section plane perpendicular to the second direction $D_2$.

Figure 11A:
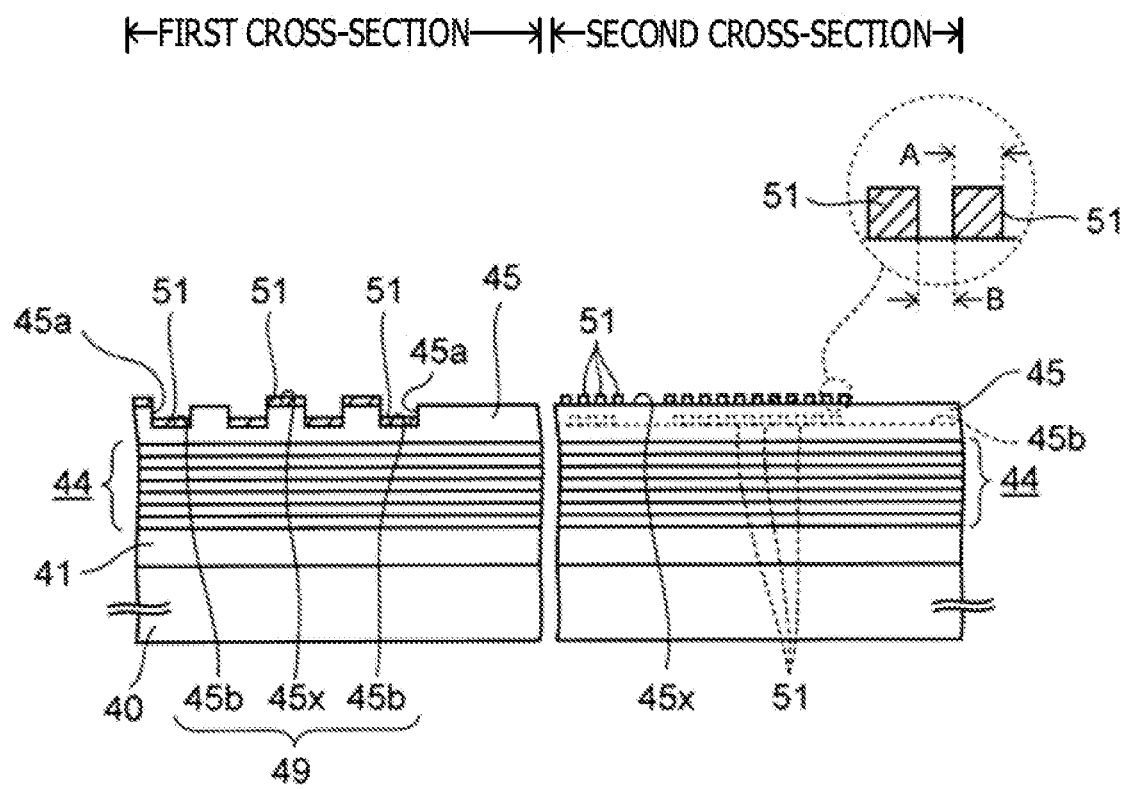
FIGS. 11A and 11B are cross-sectional views of the photodetector according to the first embodiment in the manufacturing process.

As illustrated in FIG. 11A, a gold layer of about 0.25 μm in thickness is then formed on each of the surfaces 45x and the bottom surfaces 45b of the first diffraction grating 49 by a vapor deposition technique, and the gold layer is subjected to patterning into linear forms by a liftoff technique, so that a plurality of metal wires 51 is formed at intervals.

The width of and the intervals between the metal wires 51 are not limited to limited to any particular width and intervals. In this example, the width A of each metal wire 51 is about 0.25 μm, and the interval B between each two adjacent metal wires 51 is about 0.25 μm.

Figure 16:
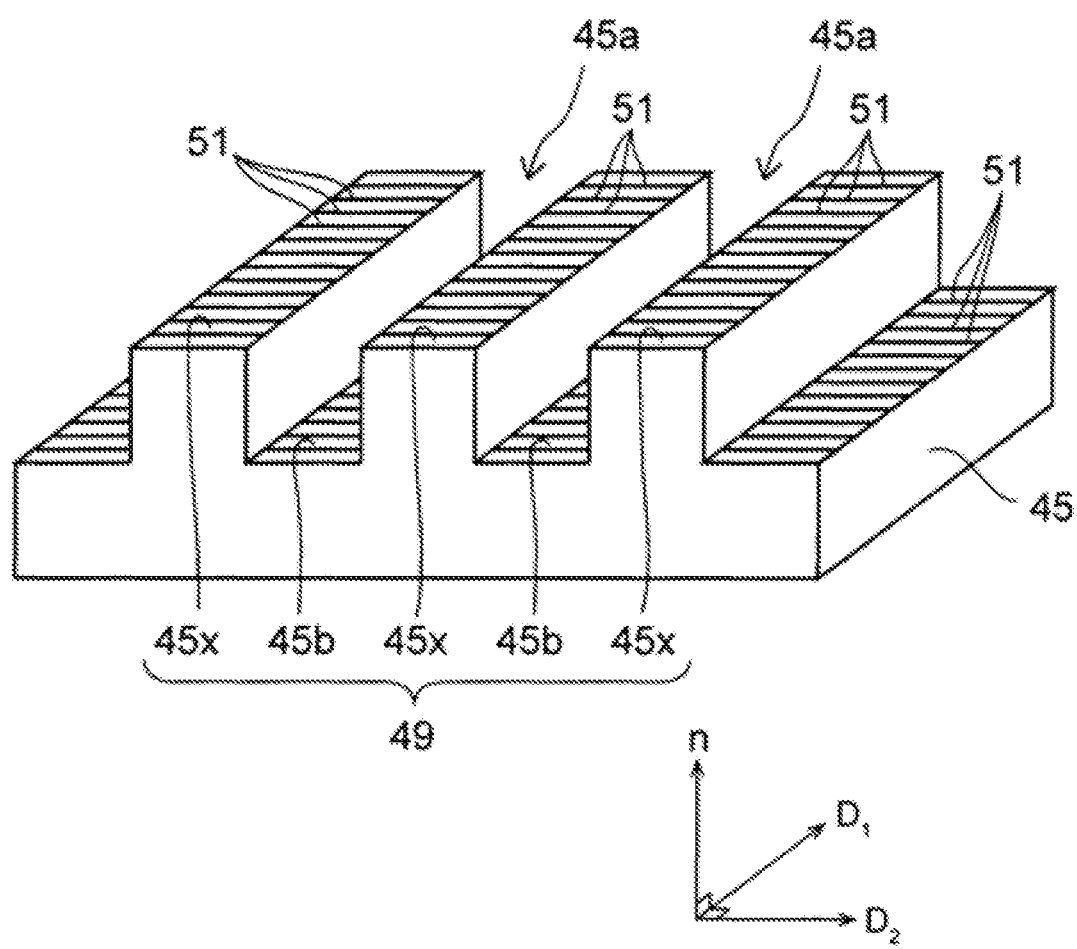
FIG. 16 is a perspective view of the first diffraction grating after metal wires are formed in the first embodiment.

FIG. 16 is a perspective view of the first diffraction grating 49 after this step is completed.

As illustrated in FIG. 16, each metal wire 51 extends in the second direction $D_2$.

As will be described later, the respective metal wires 51 arranged at very short intervals transmit or reflect light, depending on the polarization direction of the light. Each metal wire 51 having such a function is also called a wire grid polarizer.

Figure 11B:
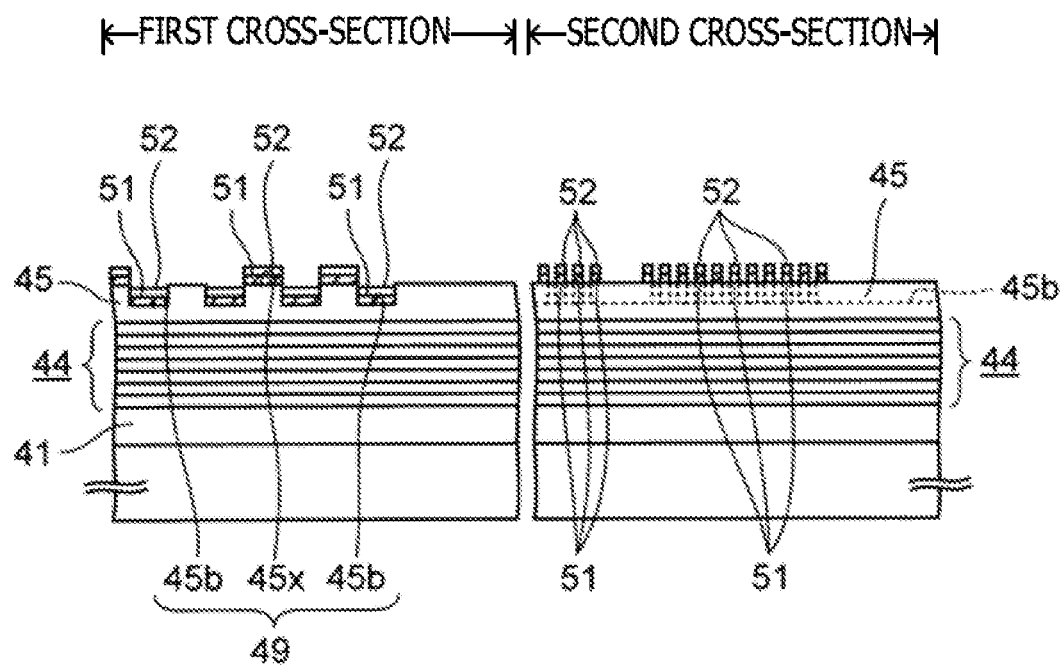

As illustrated in FIG. 11B, a silicon oxide layer 52 of about 100 nm in thickness is then formed on the entire upper surface of the substrate 40 by chemical vapor deposition (CVD). After that, patterning is performed on the silicon oxide layer 52, to leave the silicon oxide layer 52 only on the metal wires 51.

Figure 12A:
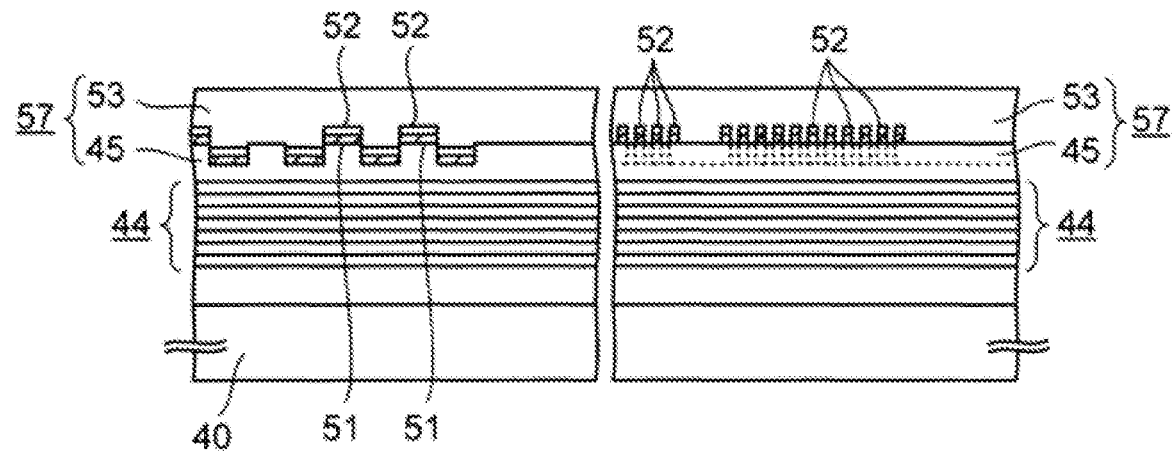
FIGS. 12A and 12B are cross-sectional views of the photodetector according to the first embodiment in the manufacturing process.

As illustrated in FIG. 12A, an n-type GaAs layer of about 2 μm in thickness is then formed as a second semiconductor layer 53 on the first semiconductor layer 45 and the silicon oxide layer 52 by MOVPE, and the semiconductor layers 45 and 53 form a second ohmic contact layer 57.

At this stage, if the second semiconductor layer 53 is formed directly on the respective metal wires 51, the crystallinity of the GaAs in the second semiconductor layer 53 is degraded. However, as the silicon oxide layer 52 is formed beforehand as in this example, a GaAs layer with excellent crystallinity is formed. The same applies to each of the embodiments described later.

The n-type impurity with which the second semiconductor layer 53 is doped is silicon, for example, and the concentration thereof is about $1 \times 10^{18}$ cm$^{-3}$.

After that, the upper surface of the second semiconductor layer 53 is polished and planarized by chemical mechanical polishing (CMP).

Figure 12B:
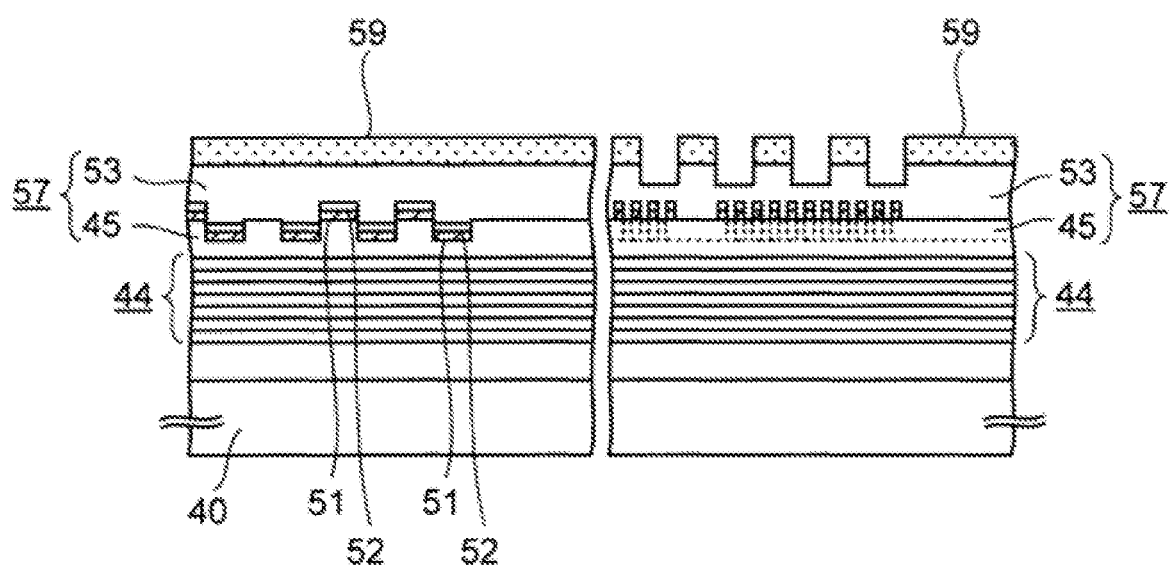

As illustrated in FIG. 12B, a photoresist is then applied onto the second ohmic contact layer 57, and the photoresist is exposed and developed, to form a second resist layer 59.

Further, with the second resist layer 59 being used as a mask, dry etching is performed on the second ohmic contact layer 57, so that a plurality of irregularities is formed in the surface of the second ohmic contact layer 57.

Although the etching gas to be used in the dry etching is not limited to any particular gas, chlorine gas is used as the etching gas in the present embodiment.

Figure 13A:
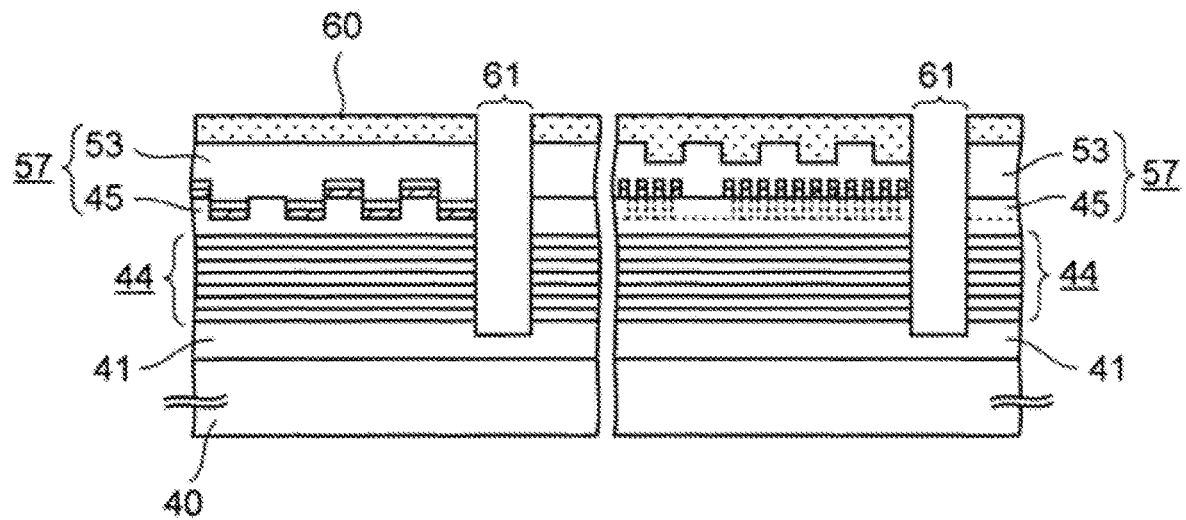
FIGS. 13A and 13B are cross-sectional views of the photodetector according to the first embodiment in the manufacturing process.

As illustrated in FIG. 13A, a third resist layer 60 is then formed on the second ohmic contact layer 57.

With the third resist layer 60 being used as a mask, wet etching is performed on the respective ohmic contact layers 41 and 57 and the photoelectric conversion layer 44, so that holes 61 having such a depth as to reach the first ohmic contact layer 41 are formed.

In the wet etching, hydrofluoric acid is used as the etching solution, for example.

After that, the third resist layer 60 is removed.

Figure 13B:
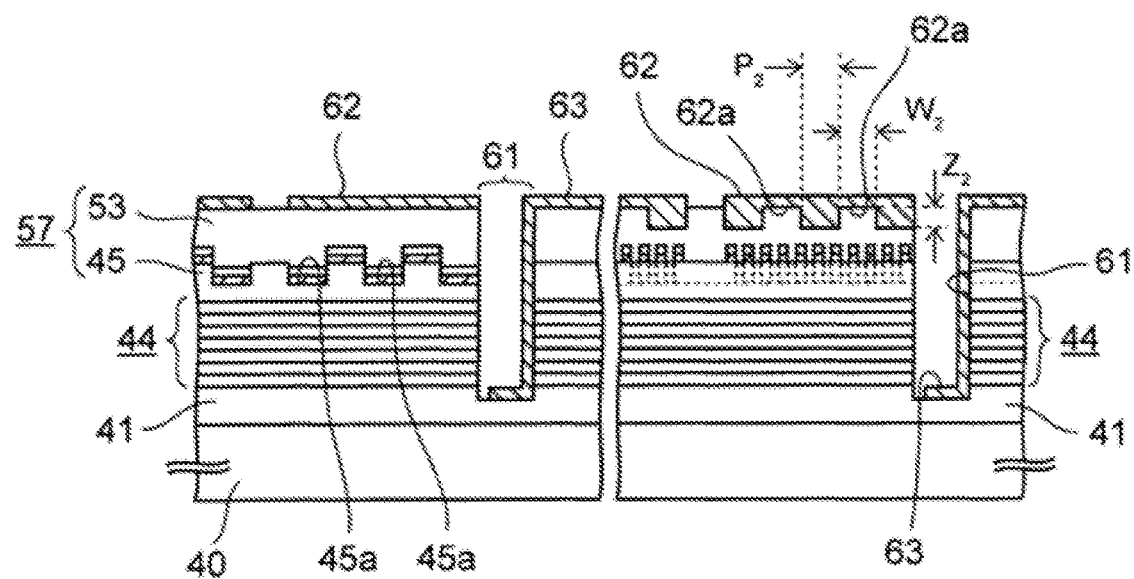

As illustrated in FIG. 13B, a metal layer is then formed in the holes 61 and on the second ohmic contact layer 57 by a vapor deposition technique, and patterning is performed on the metal layer by a liftoff technique, so that a second diffraction grating 62 and an electrode layer 63 are formed. The metal layer is a laminated film in which an alloy layer of gold and germanium, and a gold layer are stacked in this order, for example.

The electrode layer 63 is connected to the first ohmic contact layer 41 via the holes 61, and voltage is applied between the electrode layer 63 and the second diffraction grating 62.

In the second diffraction grating 62, a plurality of second grooves 62a reflecting the irregularities of the second ohmic contact layer 57 is formed.

The size of the second grooves 62a is about the same as that of the first grooves 45a, the depth $Z_2$ is about 0.75 μm, and the width $W_2$ is about 2.5 μm. The interval $P_2$ between each two adjacent second grooves 62a is 2.5 μm, for example.

Figure 17:
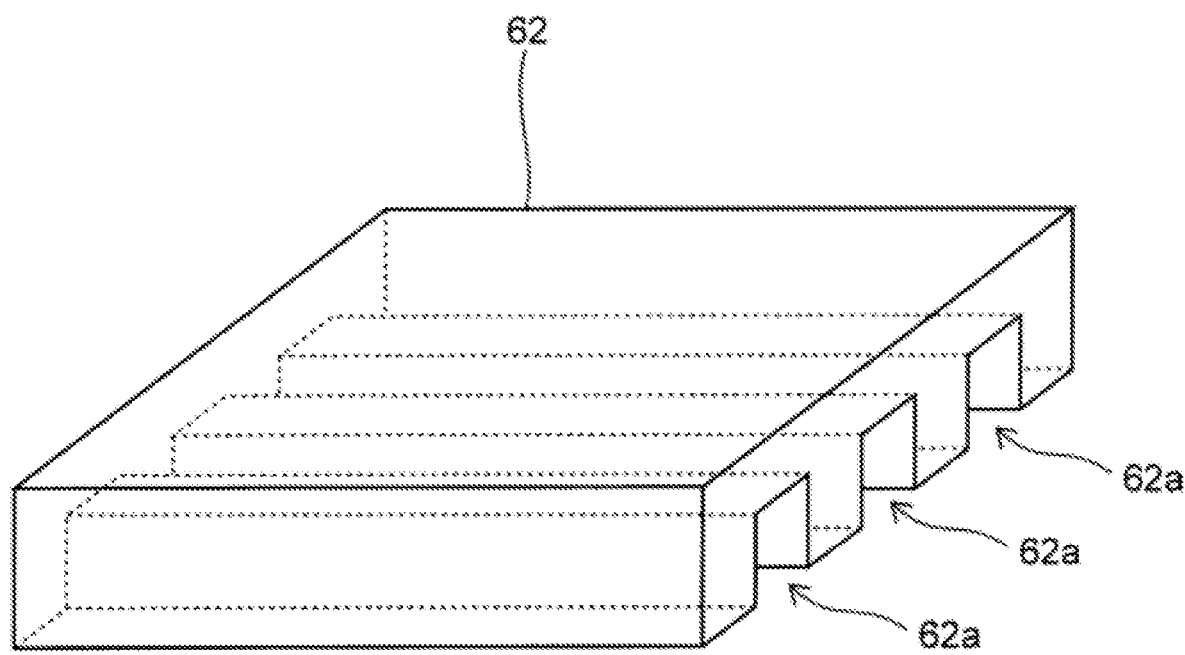
FIG. 17 is a perspective view of a second diffraction grating according to the first embodiment.
Figure 17:
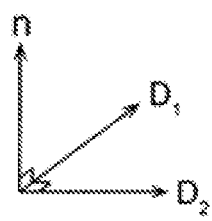

FIG. 17 is a perspective view of the second diffraction grating 62.

As illustrated in FIG. 17, the second grooves 62a extend in the second direction $D_2$ perpendicular to the first direction $D_1$.

Figure 14A:
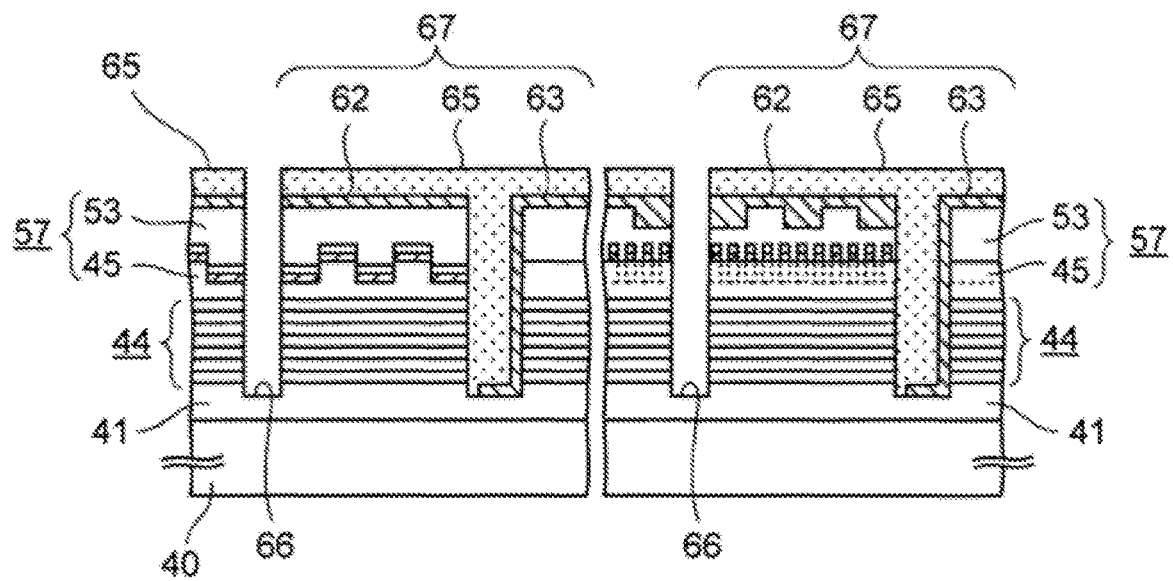
FIGS. 14A and 14B are cross-sectional views of the photodetector according to the first embodiment in the manufacturing process.

As illustrated in FIG. 14A, a fourth resist layer 65 is formed on the second ohmic contact layer 57, the second diffraction grating 62, and the electrode layer 63.

With the fourth resist layer 65 being used as a mask, dry etching is performed on the respective ohmic contact layers 41 and 57 and the photoelectric conversion layer 44, so that element separation grooves 66 are formed, and a plurality of pixels 67 is defined by the element separation grooves 66.

Figure 14B:
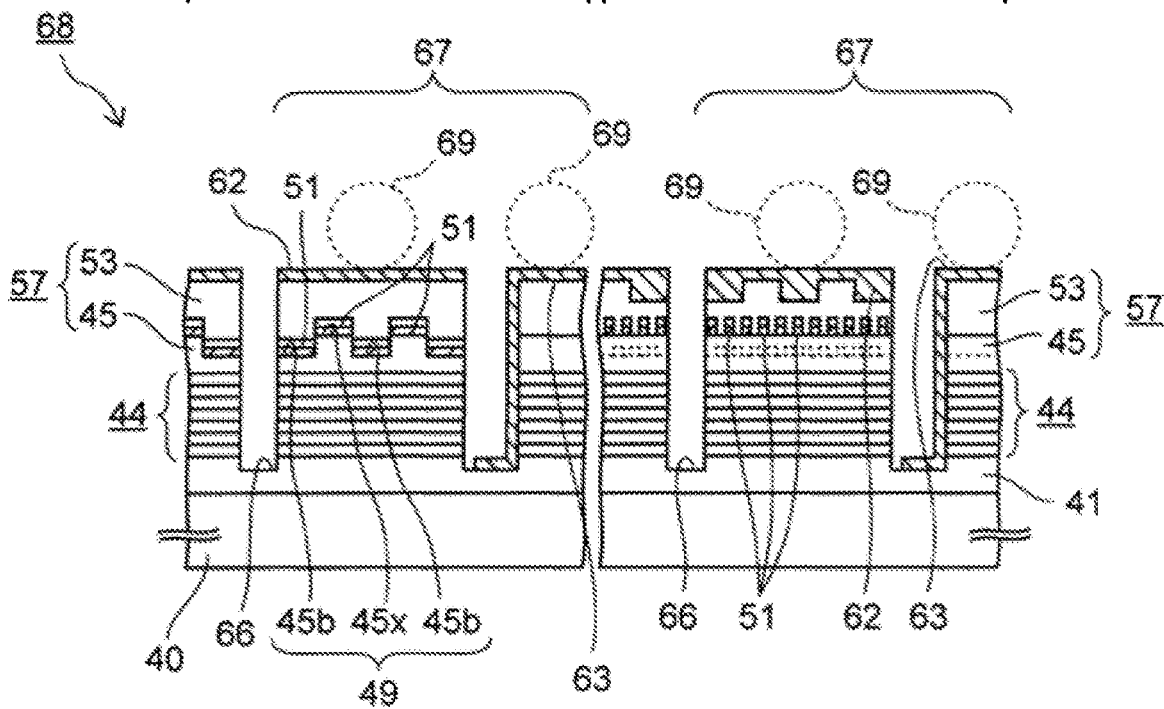

As illustrated in FIG. 14B, the fourth resist layer 65 is then removed.

After that, indium bumps 69 are bonded to the second diffraction grating 62 and the electrode layer 63, and thus, the fundamental structure of a photodetector 68 according to the present embodiment is completed.

The photodetector 68 is an FPA in which the plurality of pixels 67 is arranged in an array in a planar view.

Next, operation of the photodetector 68 is described.

Figure 18:
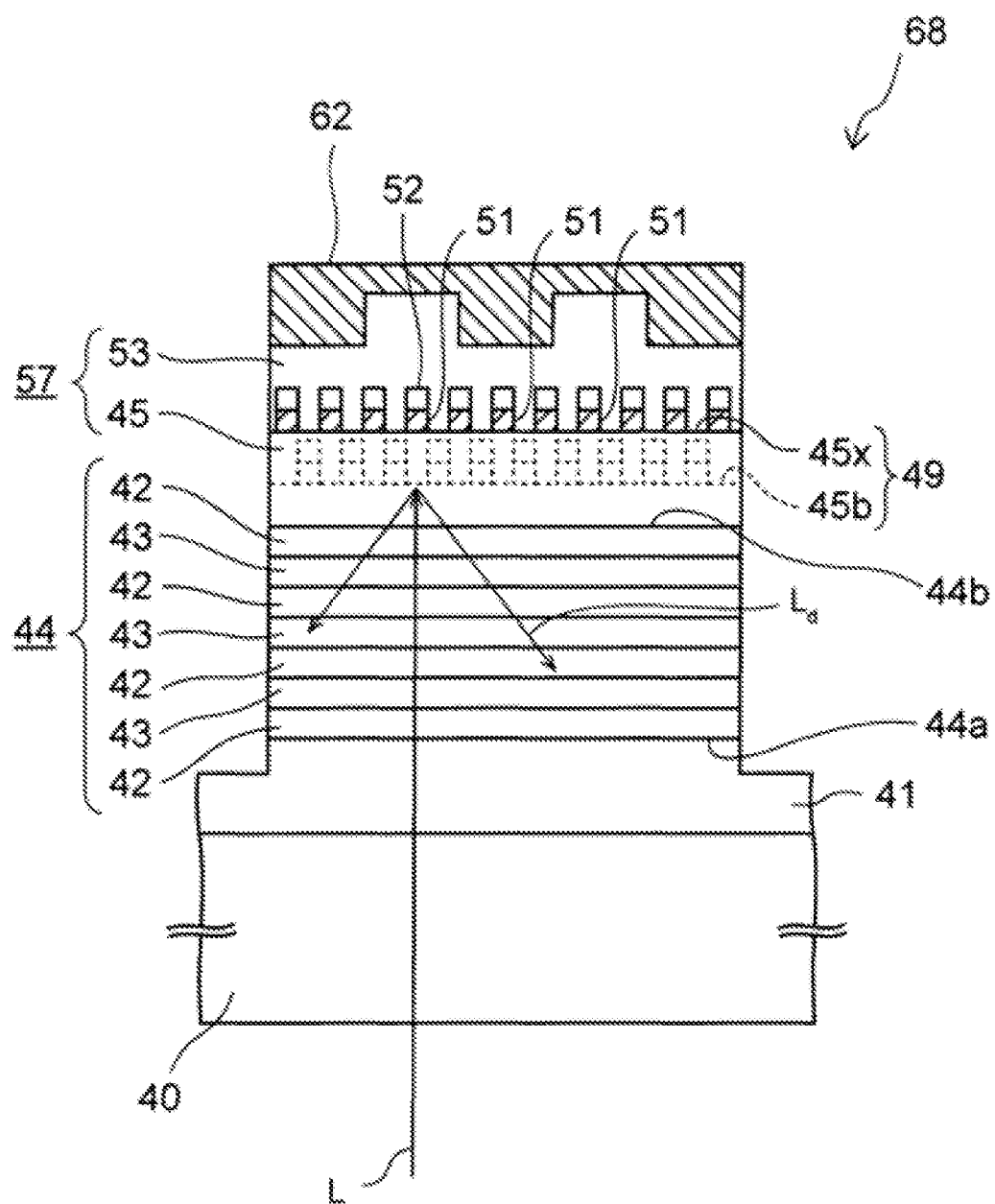
FIG. 18 is a schematic cross-sectional view for explaining operation of the photodetector according to the first embodiment.

FIG. 18 is a schematic cross-sectional view for explaining operation of the photodetector 68.

The photodetector 68 is a QWIP, and the light L to be detected enters through the substrate 40 while voltage is being applied between the first ohmic contact layer 41 and the second diffraction grating 62 so that the potential of the second diffraction grating 62 becomes higher than that of the first ohmic contact layer 41.

The light L is diffracted by the first diffraction grating 49 or the second diffraction grating 62, depending on the polarization state. As a result, the diffracted light $L_d$ is generated. As the diffracted light $L_d$ is absorbed in the quantum well layers 43, the electrons bound to the quantum well layers 43 are excited and move toward the second diffraction grating 62. Thus, a photocurrent is obtained.

Whether the light L is diffracted by the first diffraction grating 49 depends on the polarization state of the light L.

Figure 19:
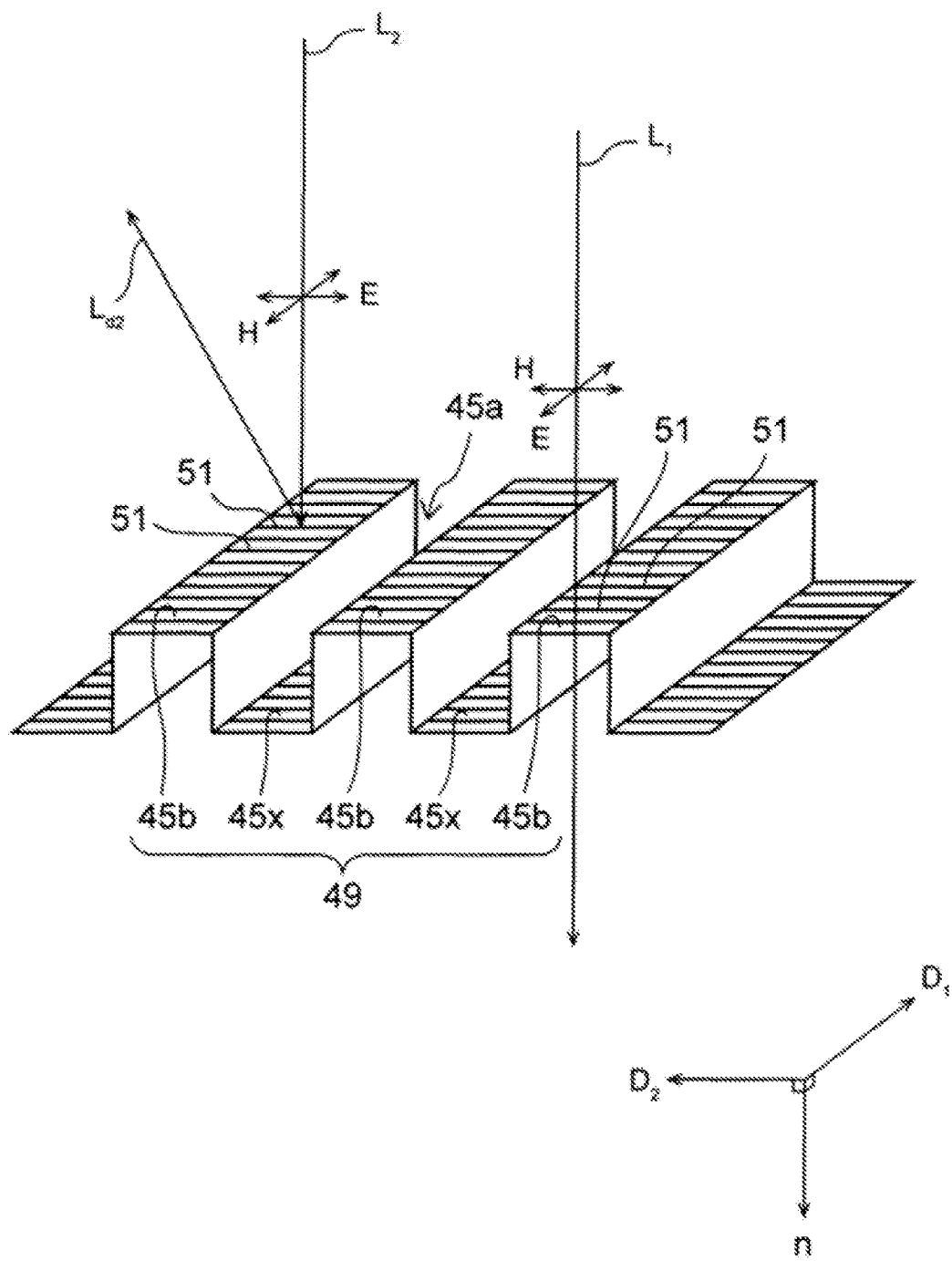
FIG. 19 is a perspective view for schematically explaining how the first diffraction grating behaves depending on the polarization state of light in the first embodiment.

FIG. 19 is a perspective view for schematically explaining how the first diffraction grating 49 behaves depending on the polarization state of the light L.

In an example case illustrated in FIG. 19, the light $L_1$ having an electric field E parallel to the first direction $D_1$ and the light $L_2$ having an electric field E parallel to the second direction $D_2$ each travel in the normal direction n and enter the first diffraction grating 49.

In a case where the light $L_2$ enters the first diffraction grating 49, the direction of the electric field E of the light $L_2$ is the same as the direction in which the metal wires 51 extend. Therefore, the electrons in the metal wires 51 are oscillated along the metal wires 51 by the electric field E, and the light $L_2$ is reflected by each of the metal wires 51.

Thus, in this case, the first diffraction grating 49 functions as a diffraction grating for the light $L_2$, and the first grooves 45a generate the diffracted light $L_{d2}$ of the light $L_2$.

The diffracted light $L_{d2}$ travels in a plane perpendicular to the first direction $D_1$ in which the first grooves 45a extend. The direction of the magnetic field H of the light $L_2$ prior to diffraction is parallel to the first direction $D_1$. Therefore, the direction of the magnetic field H does not change before and after the diffraction, and the diffracted light $L_{d2}$ becomes a TM wave having a magnetic field H parallel to the respective principal surfaces 44a and 44b (see FIG. 18).

In a case where the light $L_1$ enters the first diffraction grating 49, on the other hand, the direction of the electric field E of the light $L_1$ is perpendicular to the direction in which the metal wires 51 extend. Therefore, the electrons in the metal wires 51 are not oscillated by the electric field E, and the light $L_1$ travels between the respective metal wires 51.

Thus, in this case, the light $L_1$ passes through the first diffraction grating 49, and the light $L_1$ is diffracted by the second diffraction grating 62.

Figure 20:
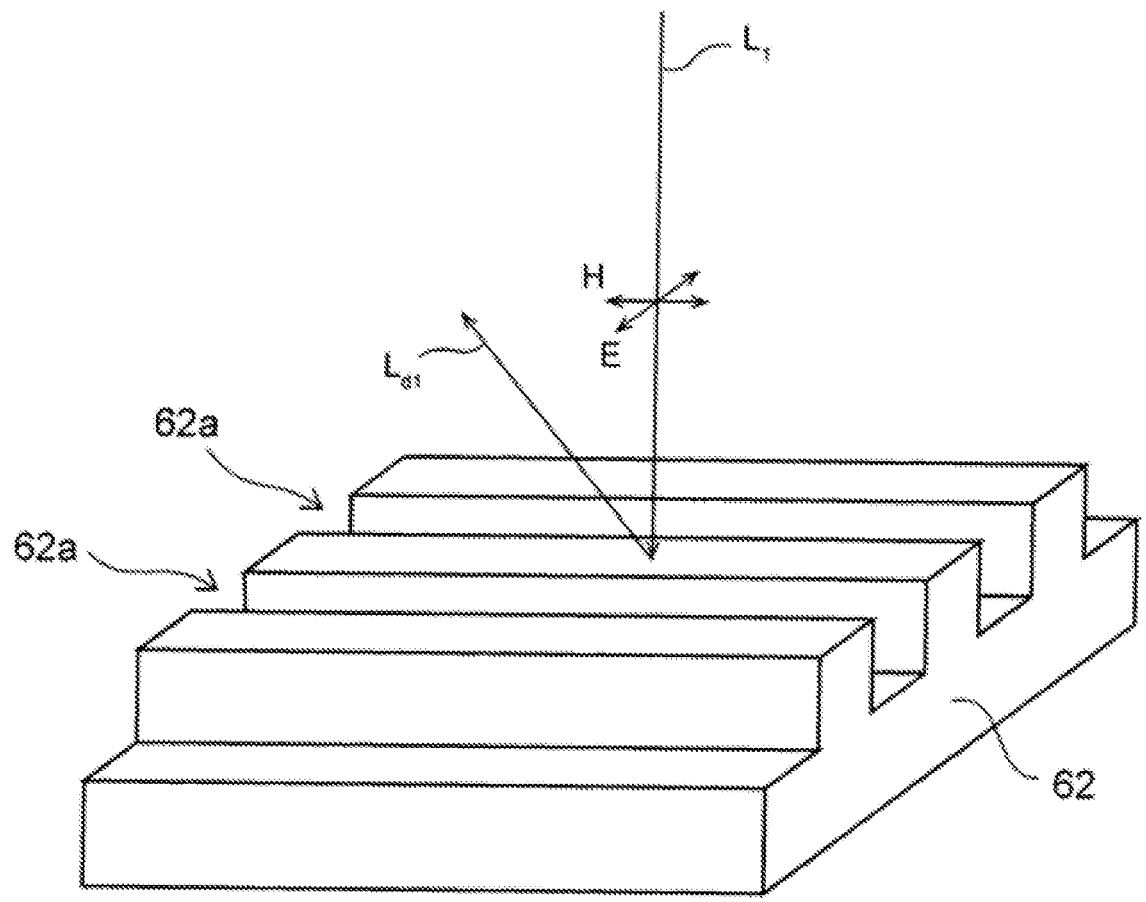
FIG. 20 is a perspective view illustrating how light that has passed through the first diffraction grating is diffracted by the second diffraction grating in the first embodiment.
Figure 20:
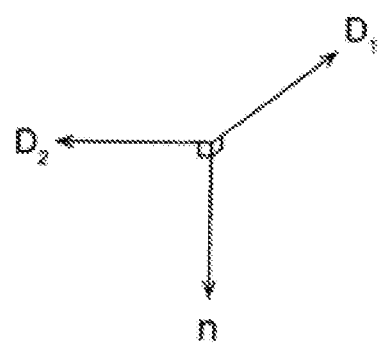

FIG. 20 is a perspective view illustrating how the light $L_1$ that has passed through the first diffraction grating 49 as above is diffracted by the second diffraction grating 62.

When the light $L_1$ enters the second diffraction grating 62, the light $L_1$ is diffracted by the second grooves 62a, so that the diffracted light $L_{d1}$ is generated.

The diffracted light $L_{d1}$ travels in a plane perpendicular to the second direction $D_2$ in which the second grooves 62a extend. The direction of the magnetic field H of the light $L_1$ prior to diffraction is parallel to the second direction $D_2$. Therefore, the direction of the magnetic field H does not change before and after the diffraction, and the diffracted light $L_{d2}$ becomes a TM wave having a magnetic field H parallel to the respective principal surfaces 44a and 44b (see FIG. 18).

Since the direction of the electric field E of the diffracted light $L_{d1}$ is perpendicular to the second direction $D_2$ in which the metal wires 51 (see FIG. 19) extend, the diffracted light $L_{d1}$ passes through the first diffraction grating 49 and enters the photoelectric conversion layer 44 (see FIG. 18), to excite electrons in the quantum well layers 43.

As described above, with this photodetector 68, a TM wave can be generated, regardless of the direction of polarization of the light L entering the substrate 40.

As described above, a TM wave is light suitable for enhancing the photoelectric conversion efficiency of a QWIP. Accordingly, it is possible to enhance the photoelectric conversion efficiency of the photodetector 68 by generating a TM wave, irrespective of the polarization state of incident light, as in the present embodiment.

Although the photodetector 68 is an FPA as described above, the purposes of use of the photodetector 68 are not limited to imaging. For example, the photoelectric conversion layer 44 may not be separated into the pixels 67 by the element separation grooves 66, and the presence or absence of infrared light may be detected by the photoelectric conversion layer 44. In this manner, the photodetector 68 may be used as a human sensor. The same applies to the second embodiment described later.

Second Embodiment

A photodetector according to the present embodiment is now described in conjunction with its manufacturing process.

FIGS. 21A through 26B are cross-sectional views of a photodetector according to the present embodiment in the manufacturing process.

In FIGS. 21A through 26B, the same components as those of the first embodiment are denoted by the same reference signs as those used in the first embodiment, and explanation thereof will not be repeated in the description below.

Each of these drawings illustrates a first cross-section, and a second cross-section perpendicular to the first cross-section, as in the first embodiment.

In the present embodiment, a QDIP is manufactured as a photodetector as described below.

Figure 21A:
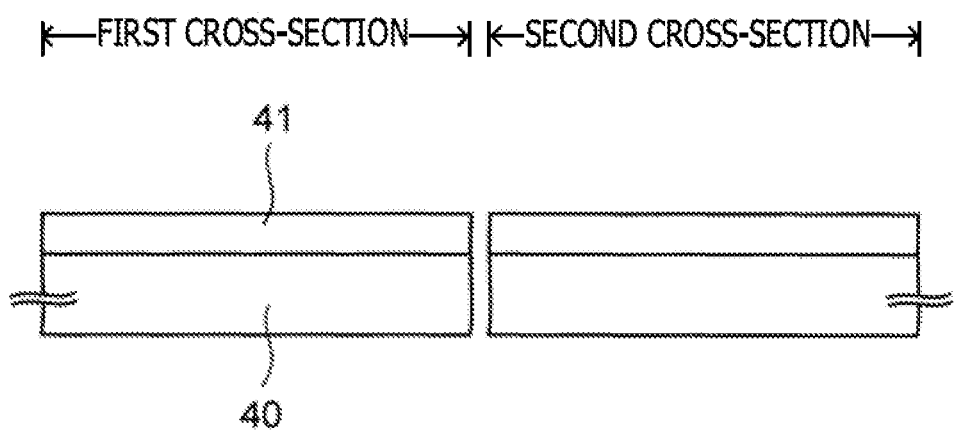
FIGS. 21A and 21B are cross-sectional views of a photodetector according to a second embodiment in the manufacturing process.

First, as illustrated in FIG. 21A, the step illustrated in FIG. 9A of the first embodiment is carried out, to form a first ohmic contact layer 41 on a substrate 40 made of GaAs.

As described in the first embodiment, a GaAs layer doped with silicon as an n-type impurity at a concentration of about $1 \times 10^{18}$ cm$^{-3}$ may be formed as the first ohmic contact layer 41.

Figure 21B:
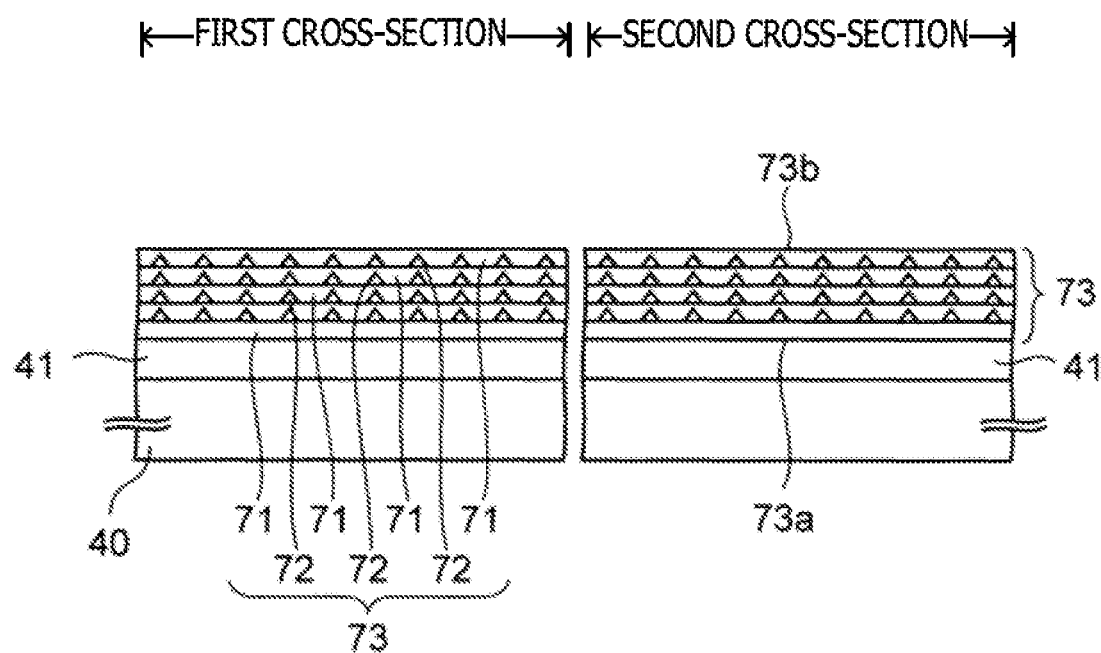

As illustrated in FIG. 21B, a plurality of intermediate layers 71 and a plurality of quantum dots 72 are then alternately stacked on the first ohmic contact layer 41, and this laminated film is used as a photoelectric conversion layer 73.

The film forming conditions for the respective layers in the photoelectric conversion layer 73 are not limited to any particular conditions. In the present embodiment, an n-type $Al_{0.2}Ga_{0.8}As$ layer of about 50 nm in thickness is formed as each intermediate layer 71 by molecular beam epitaxy (MBE). The n-type impurity with which the intermediate layers 71 are doped is silicon with a concentration of about $1 \times 10^{16}$ cm$^{-3}$, for example.

The quantum dots 72 are formed by stacking two atomic layers of InAs at a growth temperature of 470° C. by MBE. The quantum dots 72 thus formed each have a disk-like shape with a diameter of about 15 nm and a height of about 2 nm.

Further, the number of the layers stacked in the photoelectric conversion layer 73 is not limited to any particular number. In this example, however, the number of the intermediate layers 71 is 21, and the number of the layers of the quantum dots 72 is 20.

The photoelectric conversion layer 73 formed in this manner has a first principal surface 73a that the light to be detected is to enter, and a second principal surface 73b on the opposite side from the first principal surface 73a.

Photoelectric conversion is then performed in the photoelectric conversion layer 73 on light entering from the first principal surface 73a, and a diffraction grating for enhancing the photoelectric conversion efficiency is formed on the side of the second principal surface 73b through a process described below.

The light to be photoelectrically converted in the photoelectric conversion layer 73 is medium to long wavelength infrared light having a wavelength of about 3 μm to 10 μm.

Figure 22A:
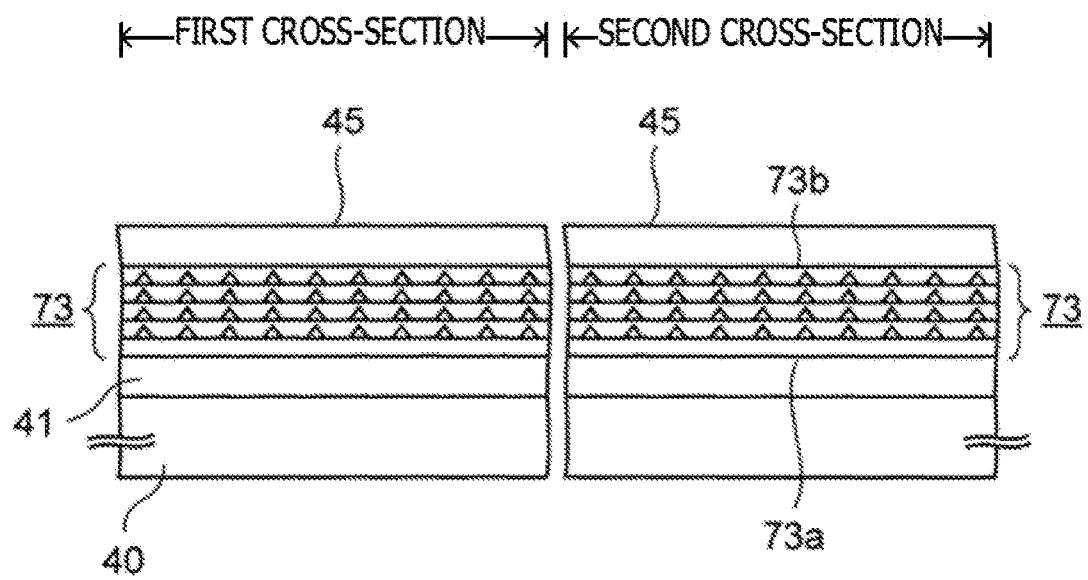
FIGS. 22A and 22B are cross-sectional views of the photodetector according to the second embodiment in the manufacturing process.

As illustrated in FIG. 22A, an n-type GaAs layer of about 1.5 μm in thickness is then formed on the second principal surface 73b of the photoelectric conversion layer 73 by MBE, and the GaAs layer is set as a first semiconductor layer 45.

As in the first embodiment, the GaAs layer is doped with silicon as an n-type impurity at a concentration of about $1 \times 10^{18}$ cm$^{-3}$.

Figure 22B:
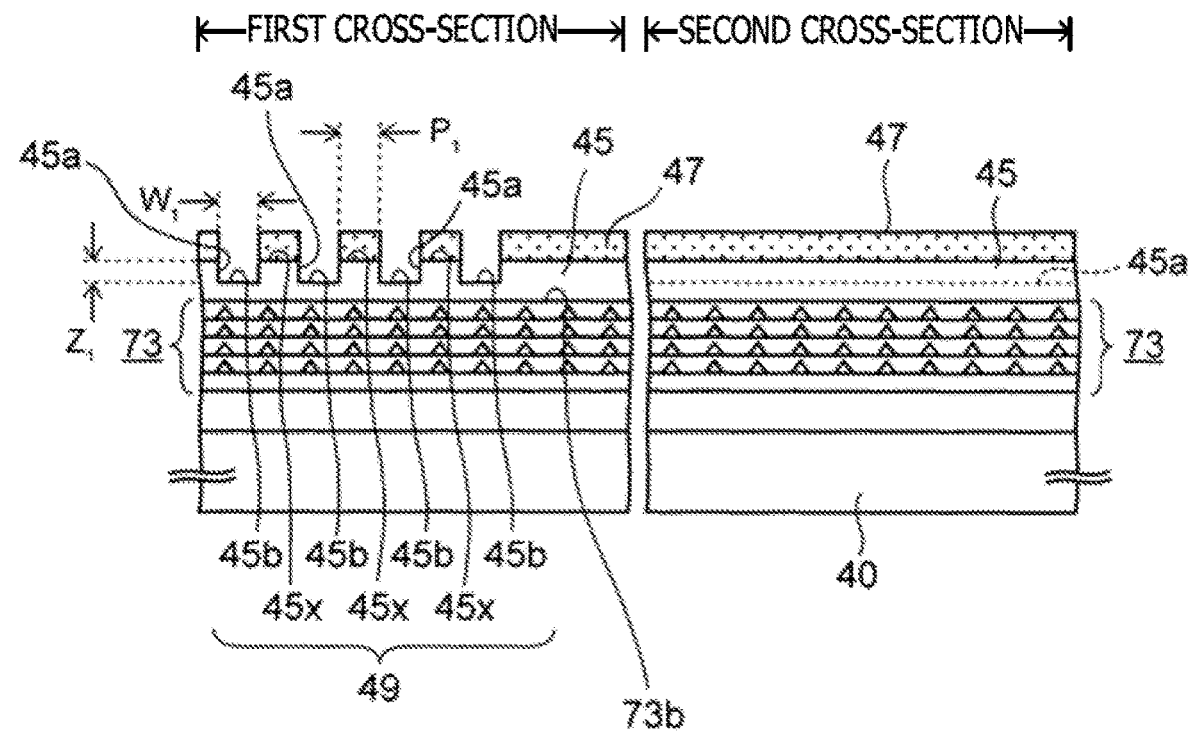

As illustrated in FIG. 22B, a first resist layer 47 is then formed on the first semiconductor layer 45 in the same manner as in the first embodiment. With the first resist layer 47 being used as a mask, dry etching is performed on the first semiconductor layer 45, so that a plurality of first grooves 45a is formed.

As a result, a first diffraction grating 49 including the bottom surfaces 45b and the surfaces 45x of the first grooves 45a is formed on the side of the second principal surface 73b of the photoelectric conversion layer 73, as in the first embodiment.

The size of the first grooves 45a is the same as that of the first embodiment, the depth $Z_1$ is 0.75 μm, for example, and the width $W_1$ is 2.5 μm, for example. The interval $P_1$ between each two adjacent first grooves 45a is 2.5 μm, for example.

After this step, the first resist layer 47 is removed.

Figure 23A:
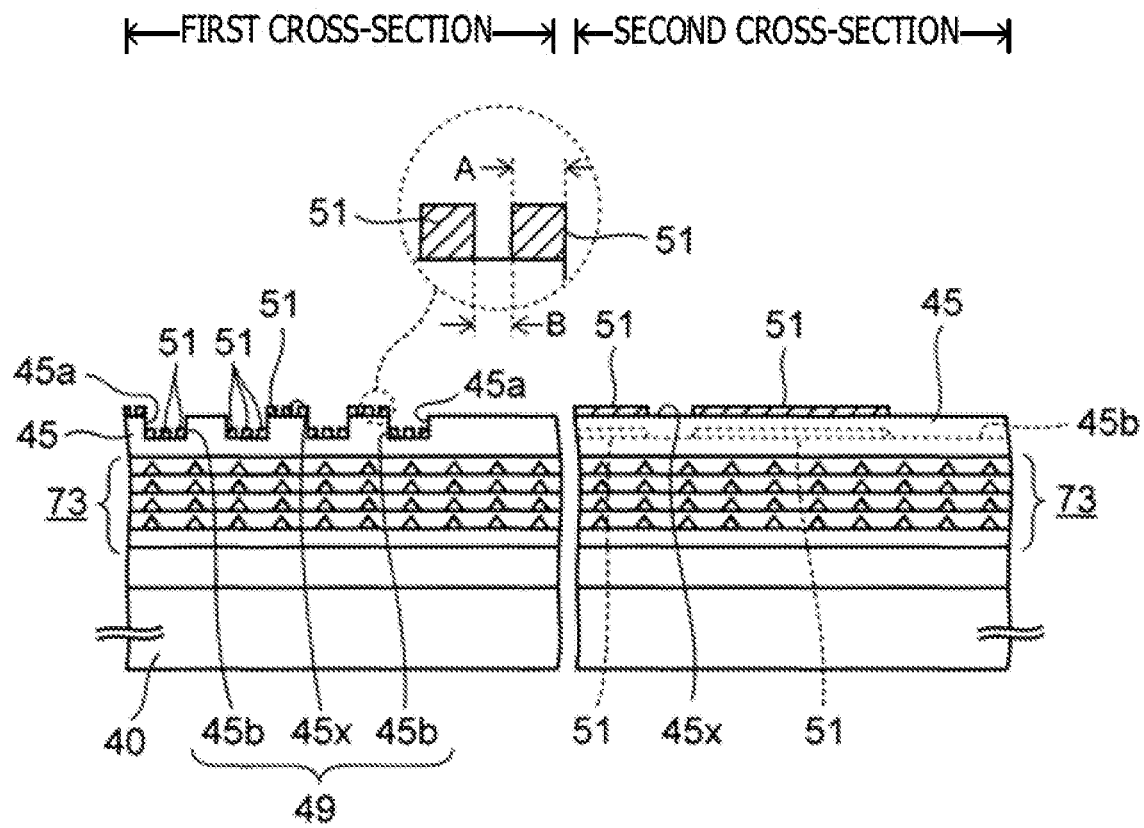
FIGS. 23A and 23B are cross-sectional views of the photodetector according to the second embodiment in the manufacturing process.

As illustrated in FIG. 23A, a gold layer of about 0.25 μm in thickness is then formed on the surfaces 45x of the first diffraction grating 49 by a vapor deposition technique, and the gold layer is subjected to patterning into linear forms by a liftoff technique, so that a plurality of metal wires 51 is formed at intervals.

The width A of each metal wire 51 and the interval B between each two adjacent metal wires 51 are both about 0.25 μm, as in the first embodiment.

Figure 27:
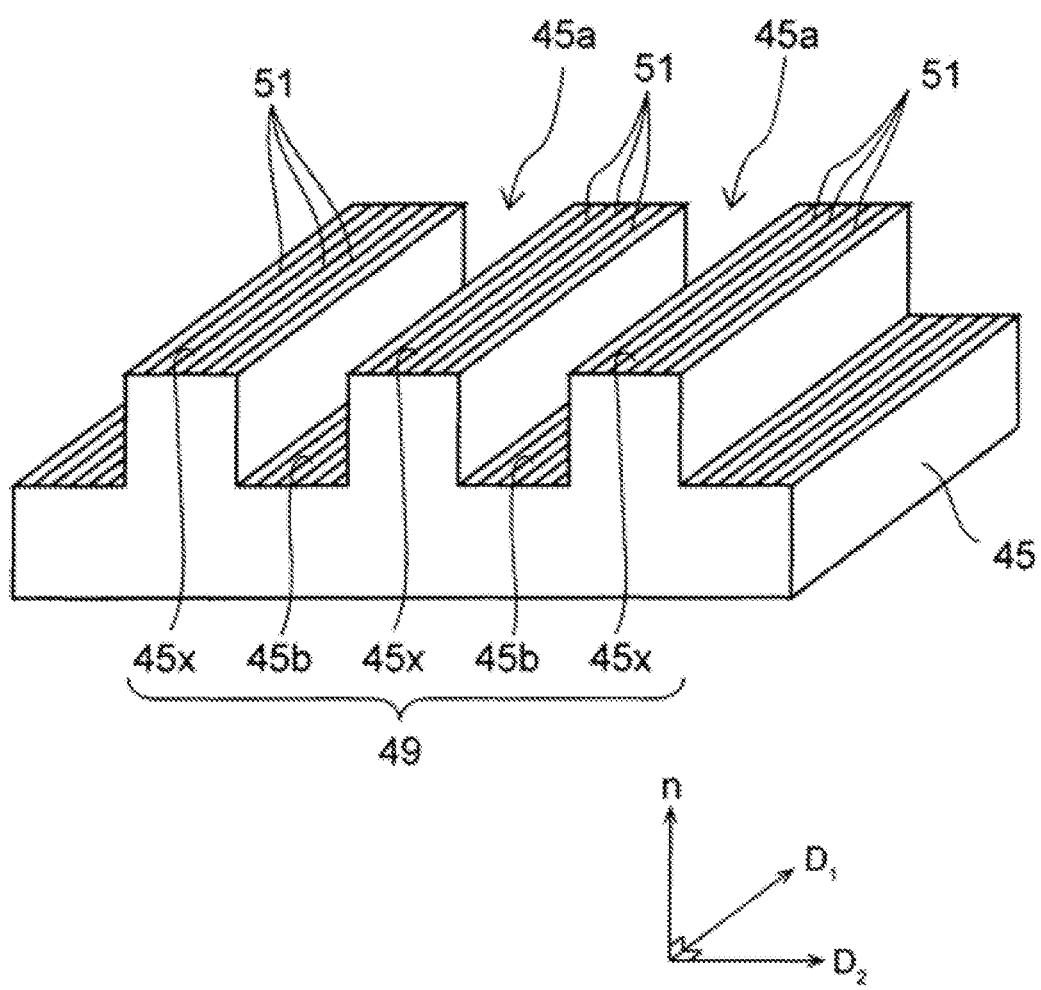
FIG. 27 is a perspective view of a first diffraction grating according to the second embodiment.

FIG. 27 is a perspective view of the first diffraction grating 49 after this step is completed.

In the first embodiment, the respective metal wires 51 are formed to extend in the second direction $D_2$. In the present embodiment, however, the respective metal wires 51 are formed to extend in the first direction $D_1$, which is the direction in which the first grooves 45a extend, as illustrated in FIG. 27.

These metal wires 51 function as wire grid polarizers that transmit or reflect light, depending on the polarization direction of the light.

The first cross-section in each of FIGS. 21A through 26B is a cross-section taken along a section plane perpendicular to the first direction $D_1$, and the second cross-section is a cross-section taken along a section plane perpendicular to the second direction $D_2$.

Figure 23B:
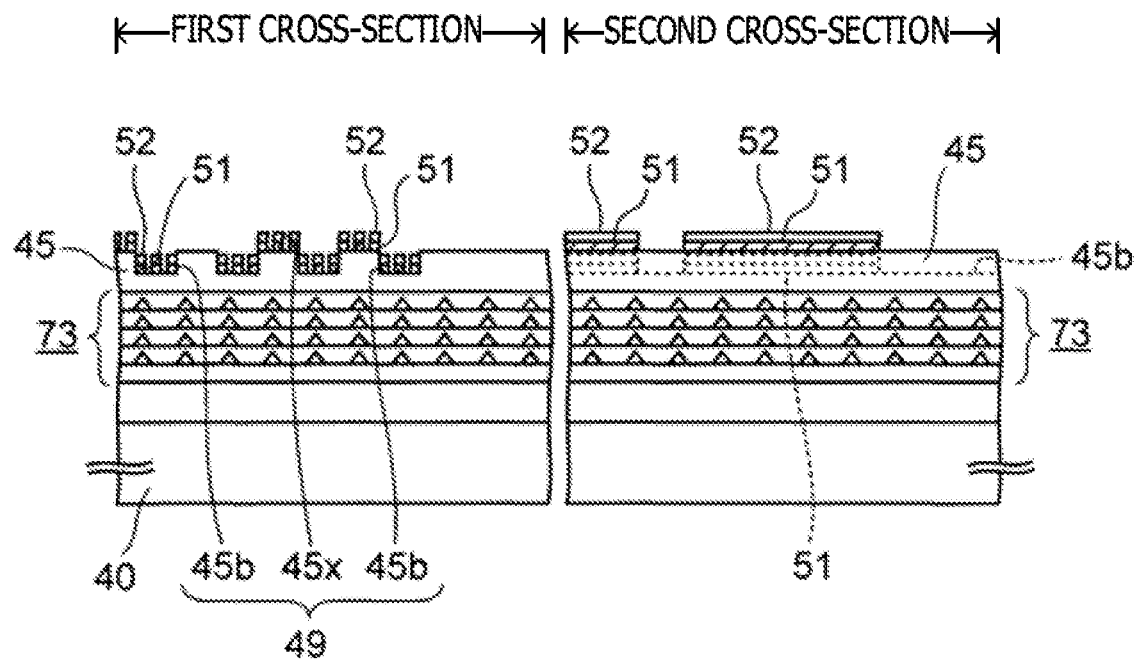

As illustrated in FIG. 23B, a silicon oxide layer 52 is then formed on the metal wires 51 in the same manner as in the first embodiment.

Figure 24A:
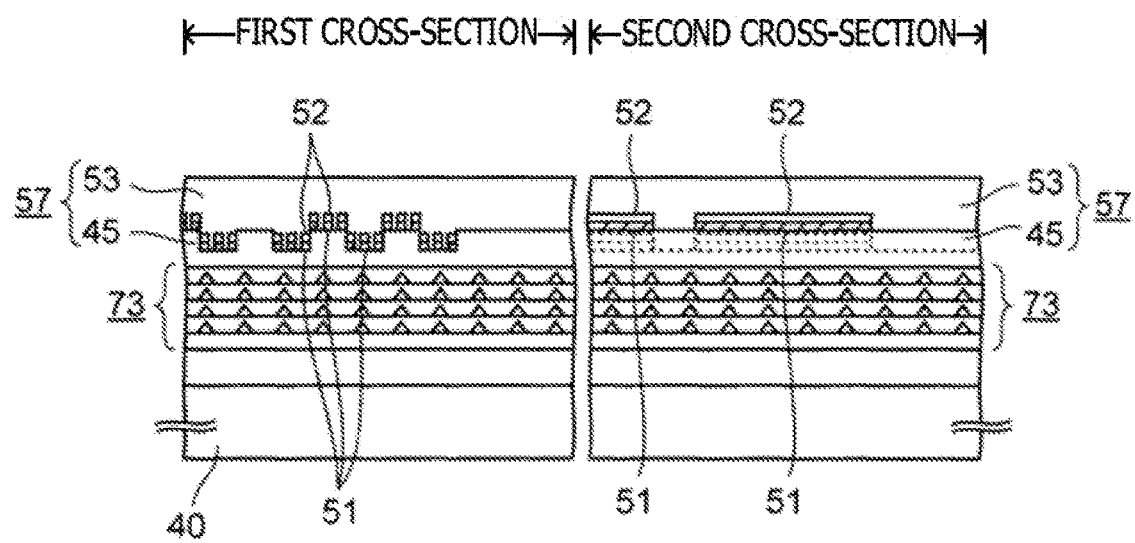
FIGS. 24A and 24B are cross-sectional views of the photodetector according to the second embodiment in the manufacturing process.

As illustrated in FIG. 24A, the step illustrated in FIG. 12A of the first embodiment is then carried out, so that an n-type GaAs layer is formed as a second semiconductor layer 53 on the first semiconductor layer 45 and the silicon oxide layer 52, and the semiconductor layers 45 and 53 form a second ohmic contact layer 57.

After that, the upper surface of the second semiconductor layer 53 is polished and planarized by CMP.

Figure 24B:
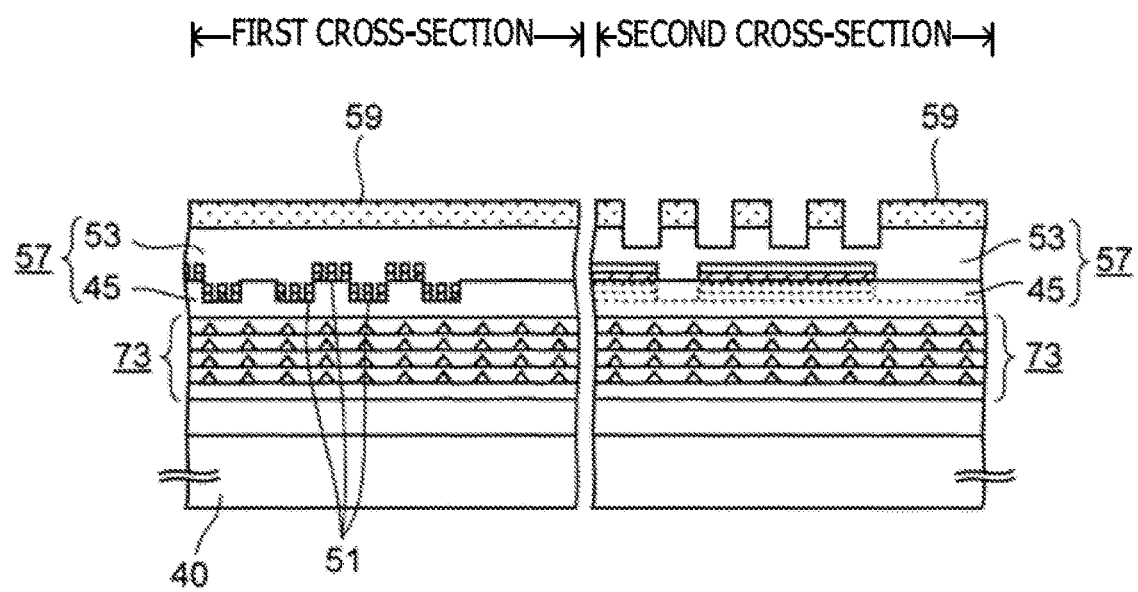

As illustrated in FIG. 24B, a second resist layer 59 is then formed on the second ohmic contact layer 57.

With the second resist layer 59 being used as a mask, dry etching is performed on the second ohmic contact layer 57, so that a plurality of irregularities is formed in the surface of the second ohmic contact layer 57. In the dry etching, chlorine gas may be used as the etching gas, for example.

After that, the second resist layer 59 is removed.

Figure 25A:
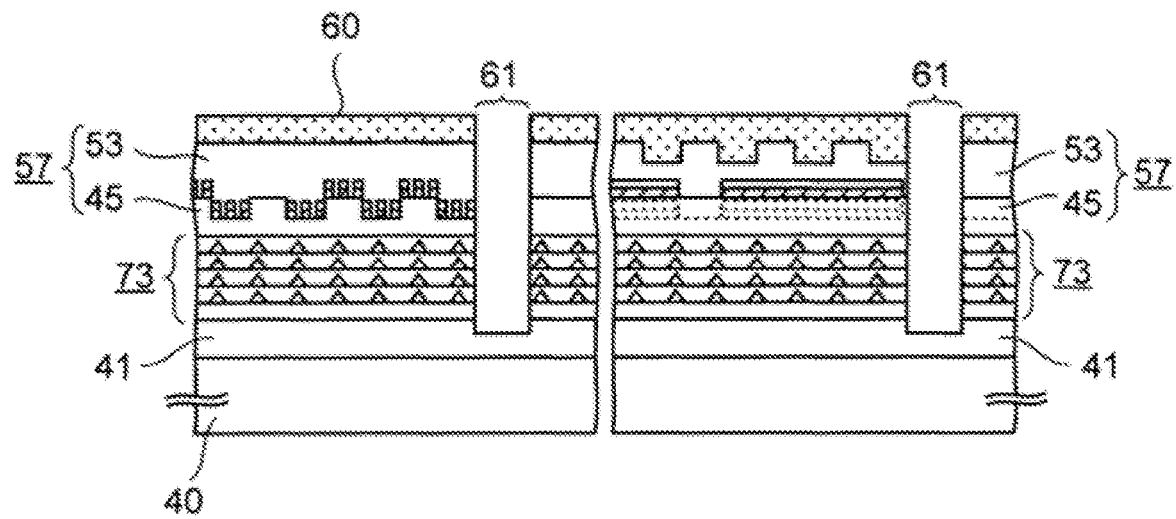
FIGS. 25A and 25B are cross-sectional views of the photodetector according to the second embodiment in the manufacturing process.

As illustrated in FIG. 25A, a third resist layer 60 is then formed on the second ohmic contact layer 57.

With the third resist layer 60 being used as a mask, wet etching using hydrofluoric acid as the etching solution is performed, so that holes 61 are formed in the respective ohmic contact layers 41 and 57 and the photoelectric conversion layer 73.

After that, the third resist layer 60 is removed.

Figure 25B:
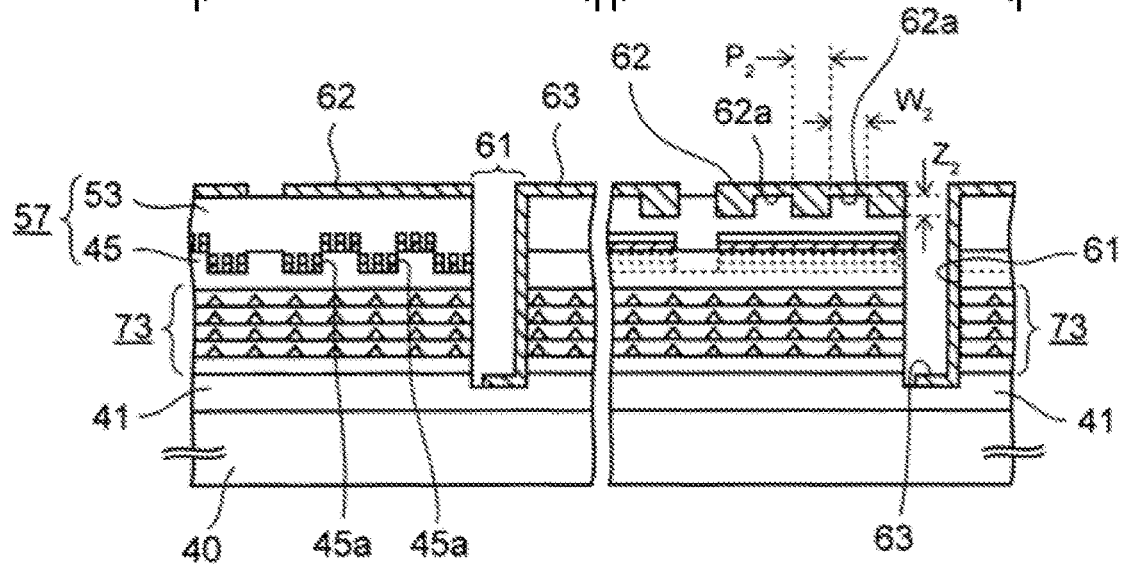

As illustrated in FIG. 25B, an electrode layer 63 is then formed in the holes 61, and a second diffraction grating 62 is formed on the second ohmic contact layer 57.

As in the first embodiment, patterning is performed by a liftoff technique on a laminated film in which an alloy layer of gold and germanium and a gold layer are stacked in this order. Thus, the second diffraction grating 62 and the electrode layer 63 are formed.

The electrode layer 63 is connected to the first ohmic contact layer 41 via the holes 61, and voltage is applied between the electrode layer 63 and the second diffraction grating 62.

In the second diffraction grating 62, a plurality of second grooves 62a that reflects the irregularities of the second ohmic contact layer 57 is formed.

The size of the second grooves 62a is about the same as that of the first grooves 45a, the depth $Z_2$ is about 0.75 μm, and the width $W_2$ is about 2.5 μm. The interval $P_2$ between each two adjacent second grooves 62a is 2.5 μm, for example.

Figure 28:
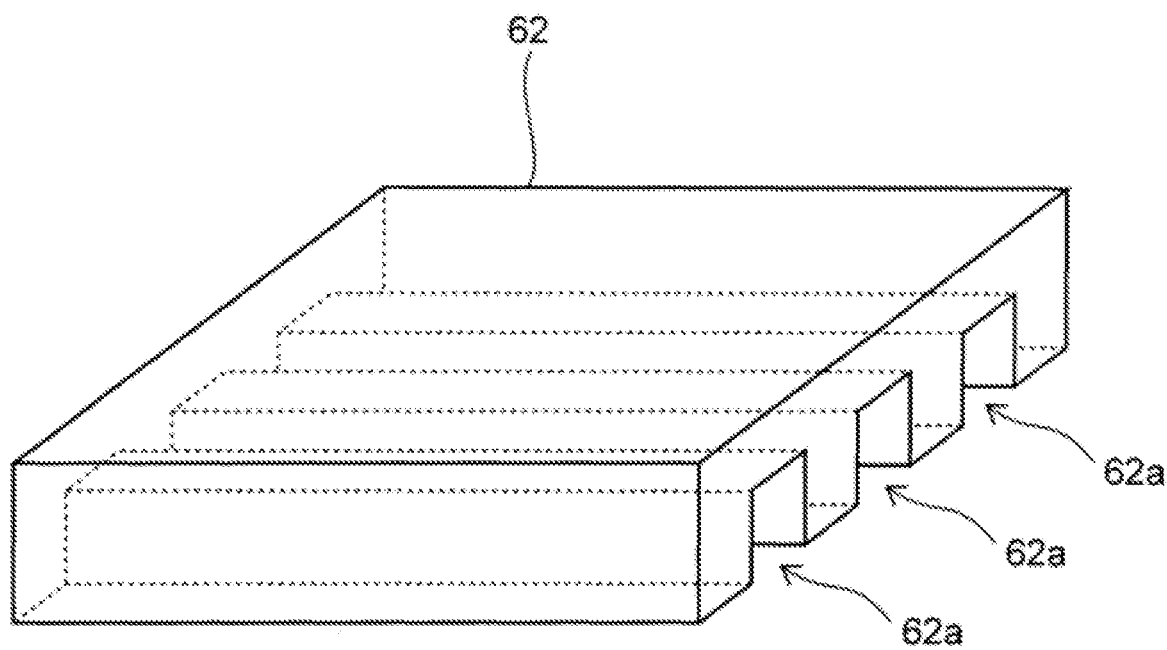
FIG. 28 is a perspective view of a second diffraction grating according to the second embodiment.
Figure 28:
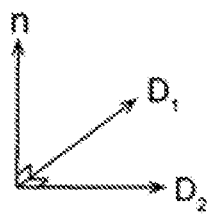

FIG. 28 is a perspective view of the second diffraction grating 62.

As illustrated in FIG. 28, the second grooves 62a extend in the second direction $D_2$ perpendicular to the first direction $D_1$, as in the first embodiment.

Figure 26A:
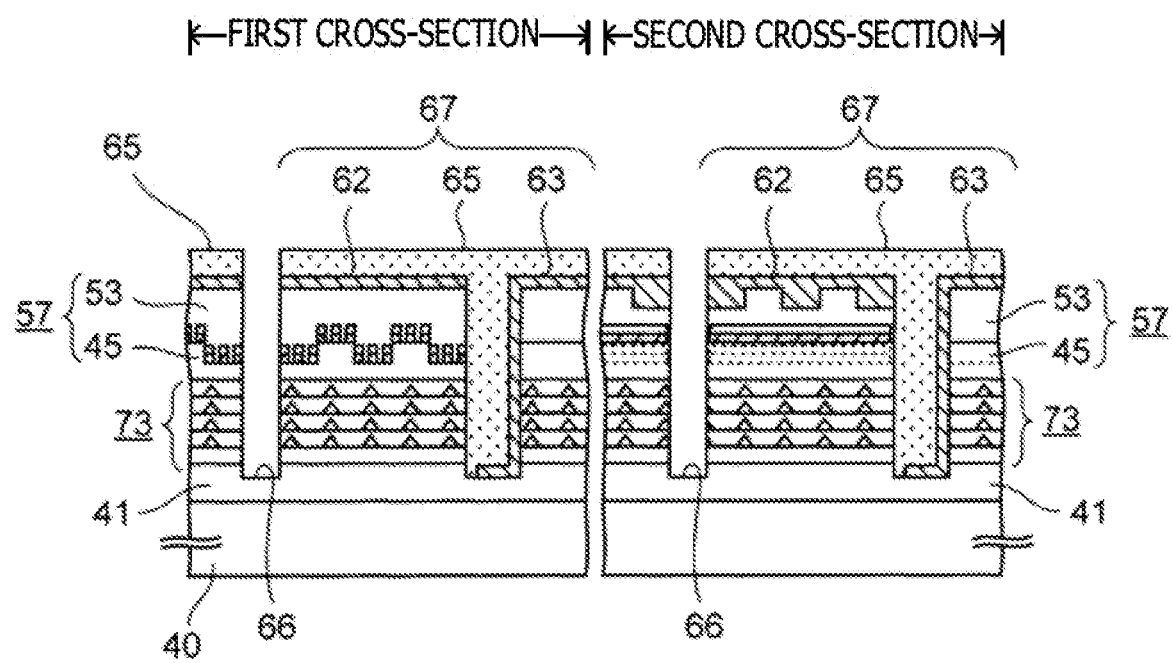
FIGS. 26A and 26B are cross-sectional views of the photodetector according to the second embodiment in the manufacturing process.

As illustrated in FIG. 26A, a photoresist is then applied onto the entire upper surface of the substrate 40, and the photoresist is exposed and developed, to form a fourth resist layer 65.

With the fourth resist layer 65 being used as a mask, dry etching is then performed on the respective ohmic contact layers 41 and 57 and the photoelectric conversion layer 73, so that element separation grooves 66 that define a plurality of pixels 67 are formed.

Figure 26B:
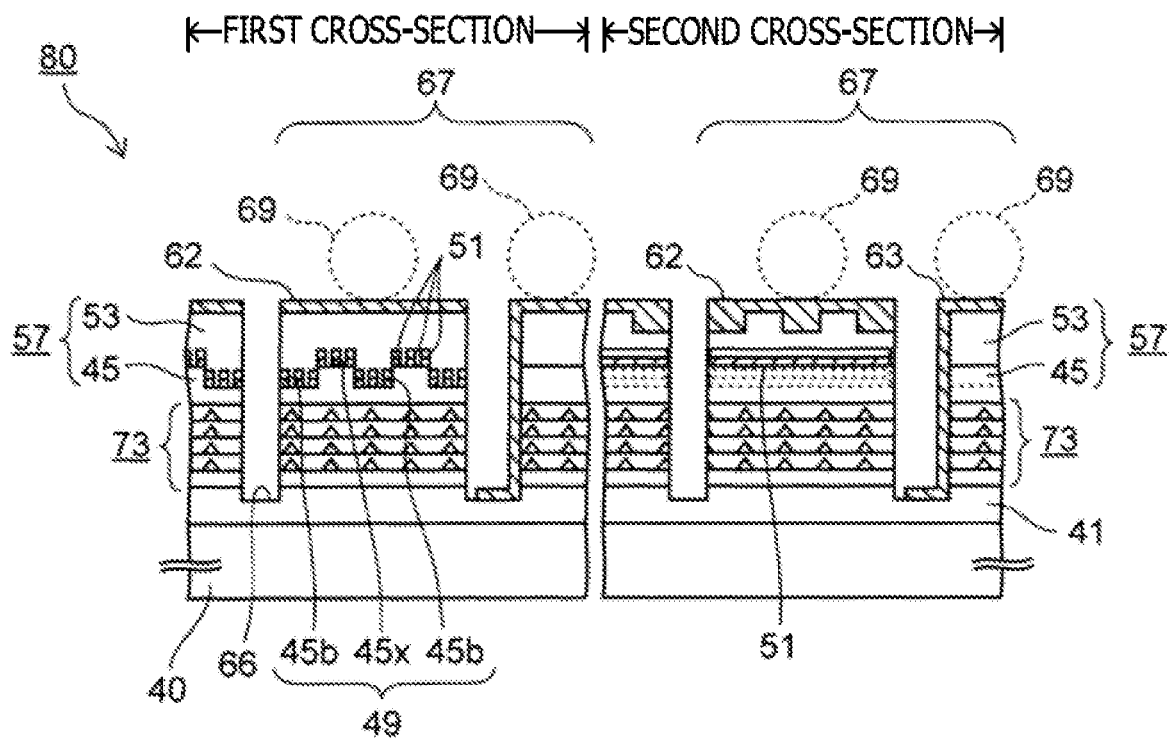

As illustrated in FIG. 26B, the fourth resist layer 65 is then removed.

After that, indium bumps 69 are bonded to the second diffraction grating 62 and the electrode layer 63, and thus, the fundamental structure of a photodetector 80 according to the present embodiment is completed.

As in the first embodiment, the photodetector 80 is an FPA in which a plurality of pixels 67 is arranged in an array in a planar view.

Next, operation of the photodetector 80 is described.

Figure 29:
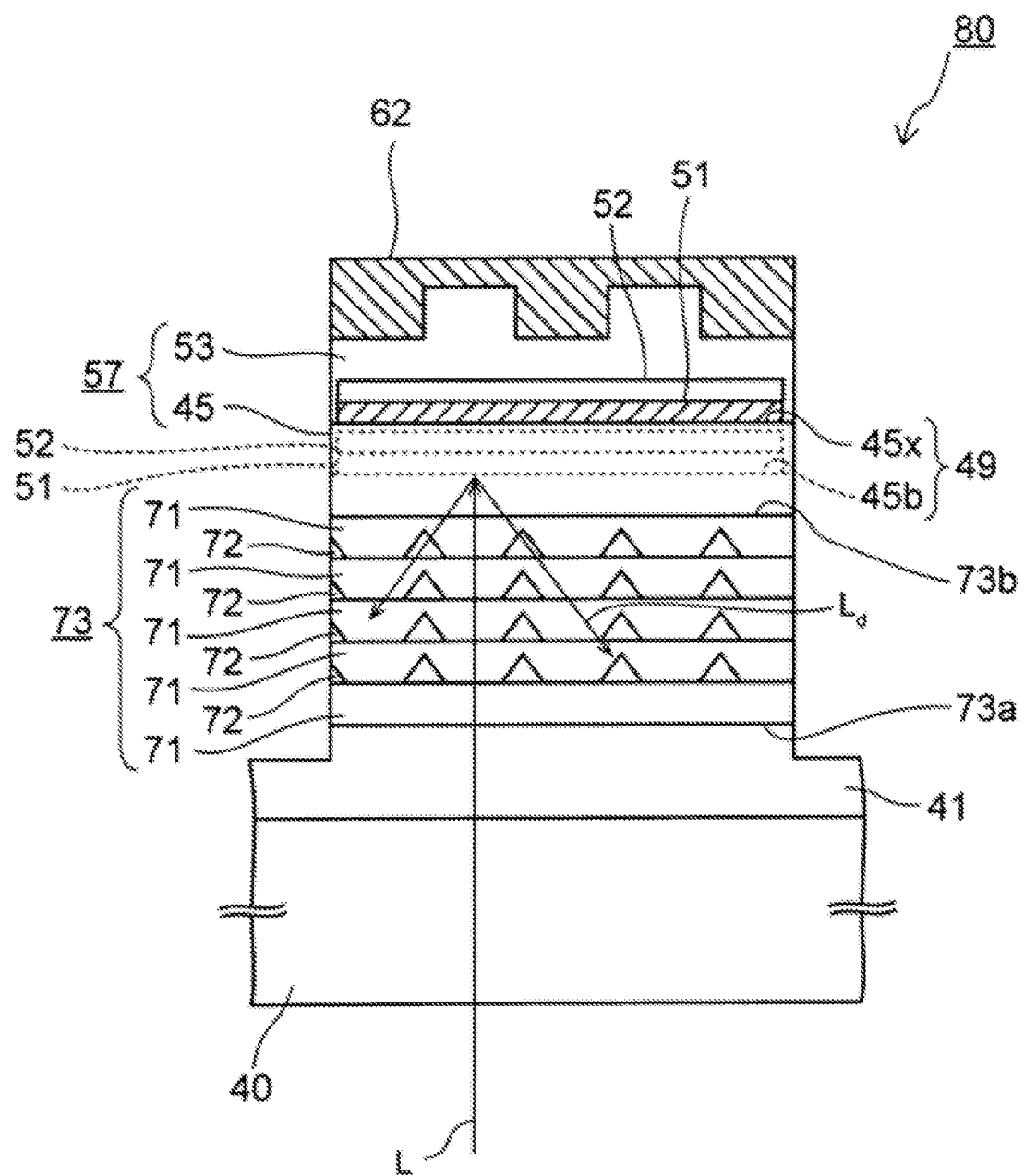
FIG. 29 is a schematic cross-sectional view for explaining operation of the photodetector according to the second embodiment.

FIG. 29 is a schematic cross-sectional view for explaining operation of the photodetector 80.

The photodetector 80 is a QDIP, and the light L to be detected enters through the substrate 40 while voltage is being applied between the first ohmic contact layer 41 and the second diffraction grating 62 so that the potential of the second diffraction grating 62 becomes higher than that of the first ohmic contact layer 41.

The light L is diffracted by the first diffraction grating 49 or the second diffraction grating 62, depending on the polarization state. As a result, the diffracted light $L_d$ is generated. As the diffracted light $L_d$ is absorbed in the quantum dots 72, the electrons bound to the quantum dots 72 are excited and move toward the second diffraction grating 62. Thus, a photocurrent is obtained.

Whether the light L is diffracted by the first diffraction grating 49 depends on the polarization state of the light L, as in the first embodiment.

In the present embodiment, however, the direction in which the metal wires 51 extend is the first direction $D_1$ in which the first grooves 45a also extend as illustrated in FIG. 27, and therefore, the behavior of the first diffraction grating 49 is differs from that in the first embodiment as described below.

Figure 30:
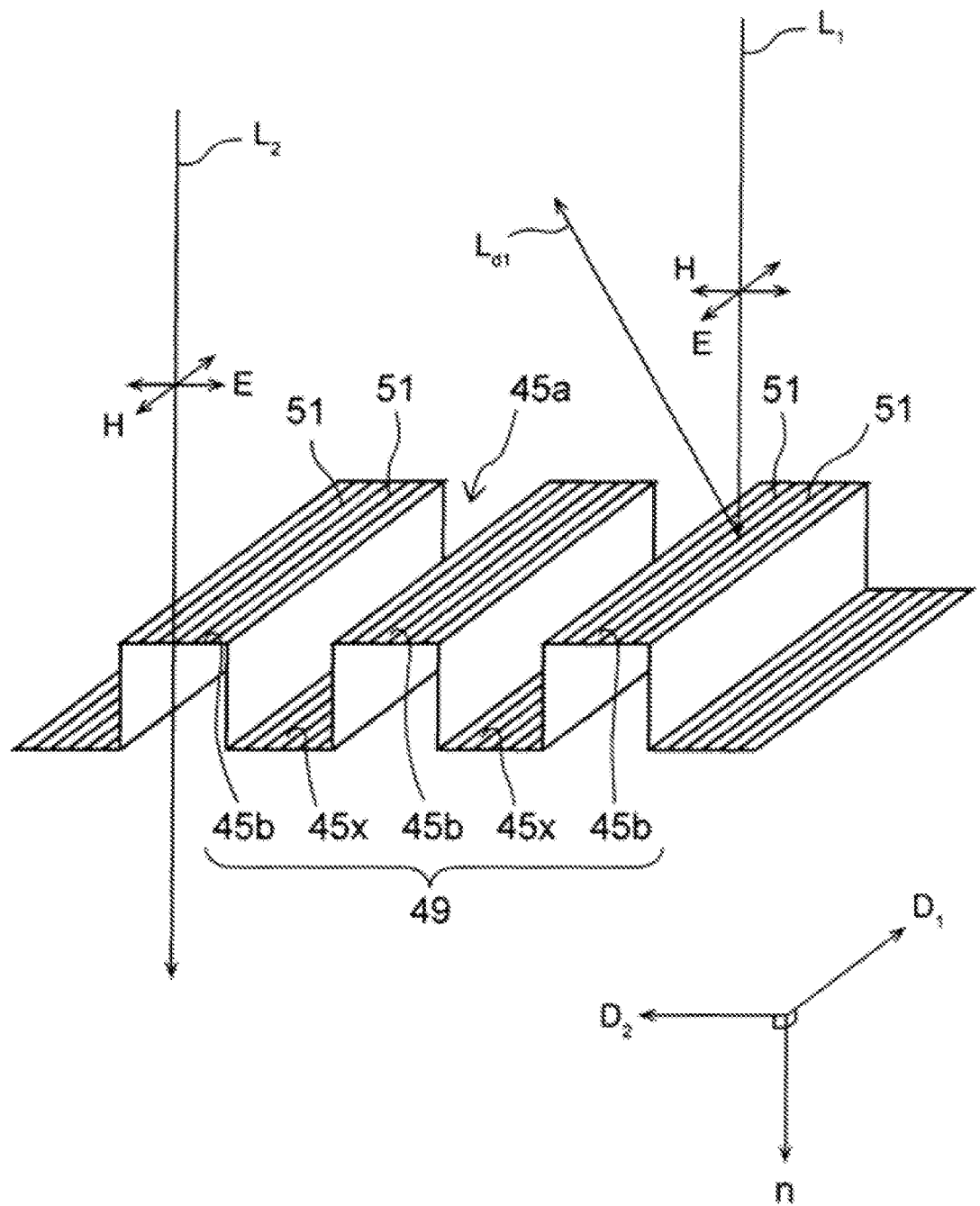
FIG. 30 is a perspective view for schematically explaining how the first diffraction grating behaves depending on the polarization state of light in the second embodiment.

FIG. 30 is a perspective view for schematically explaining how the first diffraction grating 49 behaves depending on the polarization state of the light L in the present embodiment.

Like FIG. 19, FIG. 30 illustrates an example case where the light $L_1$ having an electric field E parallel to the first direction $D_1$ and the light $L_2$ having an electric field E parallel to the second direction $D_2$ each travel in the normal direction n and enter the first diffraction grating 49.

In a case where the light $L_1$ enters the first diffraction grating 49, the direction of the electric field E of the light $L_1$ is the same as the direction in which the metal wires 51 extend. Therefore, the electrons in the metal wires 51 are oscillated along the metal wires 51 by the electric field E, and the light $L_1$ is reflected by each of the metal wires 51.

Thus, in this case, the first diffraction grating 49 functions as a diffraction grating for the light $L_1$, and the first grooves 45a generate the diffracted light $L_{d1}$ of the light $L_1$.

The diffracted light $L_{d1}$ travels in a plane perpendicular to the first direction $D_1$ in which the first grooves 45a extend. The direction of the electric field E of the light $L_1$ prior to diffraction is parallel to the first direction $D_1$. Therefore, the direction of the electric field E does not change before and after the diffraction, and the diffracted light $L_{d1}$ becomes a TE wave having an electric field E parallel to the respective principal surfaces 73a and 73b (see FIG. 29).

In a case where the light $L_2$ enters the first diffraction grating 49, on the other hand, the direction of the electric field E of the light $L_2$ is perpendicular to the direction in which the metal wires 51 extend. Therefore, the electrons in the metal wires 51 are not oscillated by the electric field E, and the light $L_2$ travels between the respective metal wires 51.

Thus, in this case, the light $L_2$ passes through the first diffraction grating 49, and the light $L_2$ is diffracted by the second diffraction grating 62.

Figure 31:
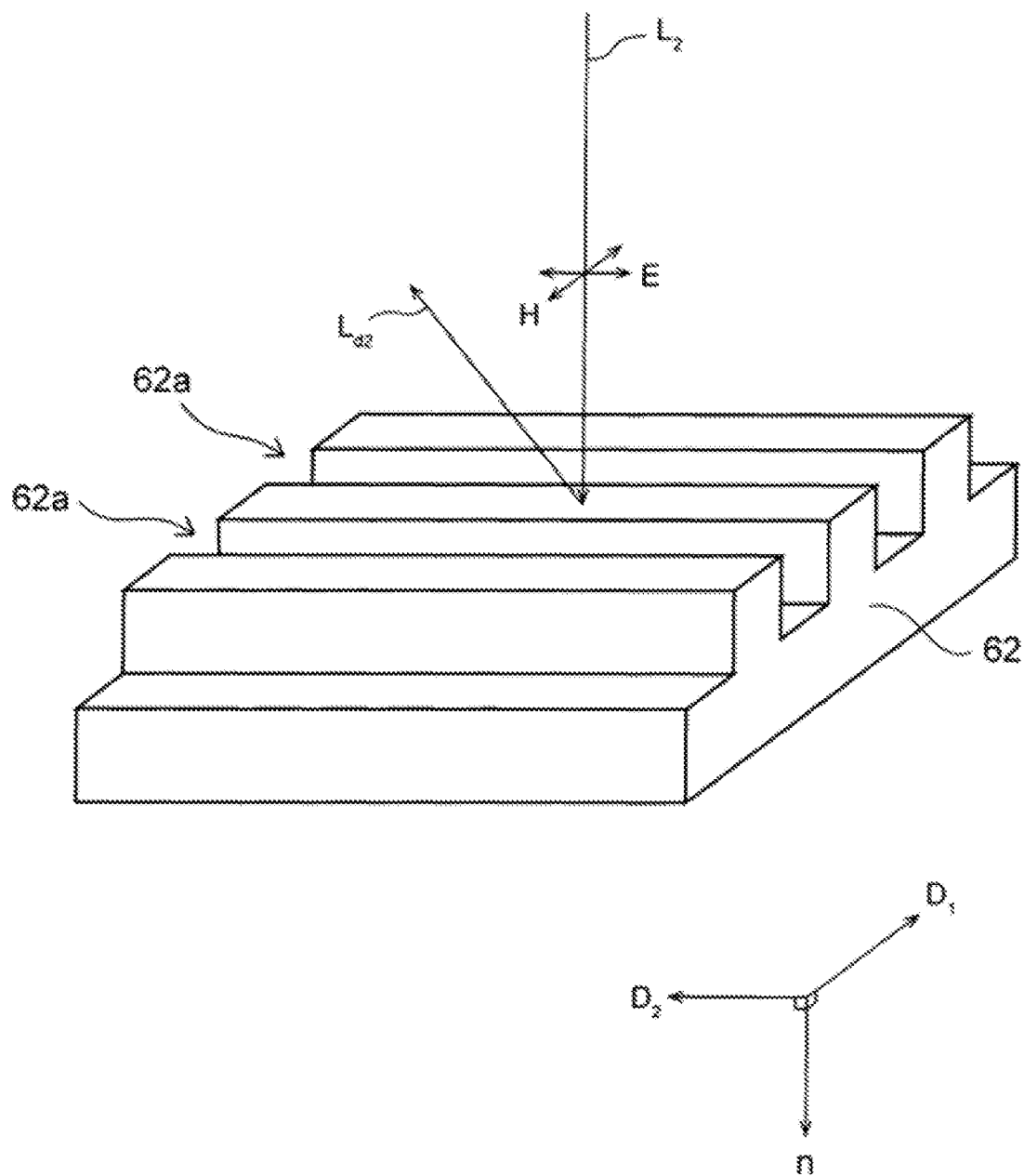
FIG. 31 is a perspective view illustrating how light that has passed through the first diffraction grating is diffracted by the second diffraction grating in the second embodiment.

FIG. 31 is a perspective view illustrating how the light $L_2$ that has passed through the first diffraction grating 49 as above is diffracted by the second diffraction grating 62.

When the light $L_2$ enters the second diffraction grating 62, the light $L_2$ is diffracted by the second grooves 62a, so that the diffracted light $L_{d2}$ is generated.

The diffracted light $L_{d2}$ travels in a plane perpendicular to the second direction $D_2$ in which the second grooves 62a extend. The direction of the electric field E of the light $L_2$ prior to diffraction is parallel to the second direction $D_2$. Therefore, the direction of the electric field E does not change before and after the diffraction, and the diffracted light $L_{d2}$ becomes a TE wave having an electric field E parallel to the respective principal surfaces 73a and 73b (see FIG. 29).

As described above, with this photodetector 80, a TE wave can be generated, regardless of the direction of polarization of the light L entering the substrate 40.

As described above with reference to FIG. 7, a TE wave is more likely to stay in a crystal layer such as the photoelectric conversion layer 73 than a TM wave, and the optical path thereof is longer. Thus, it is possible to increase the opportunity for the quantum dots 72 to be exposed to light.

Accordingly, it is possible to enhance the photoelectric conversion efficiency of the photodetector 80 by generating a TE wave, irrespective of the polarization state of incident light, as in the present embodiment.

Third Embodiment

In the present embodiment, the first diffraction grating 49 and the second diffraction grating 62 are used in a photovoltaic cell, so that the photoelectric conversion efficiency in the photovoltaic cell is enhanced.

FIGS. 32A through 38B are cross-sectional views of a photodetector according to the present embodiment in the manufacturing process.

In FIGS. 32A through 38B, the same components as those described in the first embodiment and the second embodiment are denoted by the same reference signs as those used in the first embodiment and the second embodiment, and explanation thereof will not be repeated in the description below.

Each of these drawings illustrates a first cross-section, and a second cross-section perpendicular to the first cross-section, as in the first embodiment and the second embodiment.

Figure 32A:
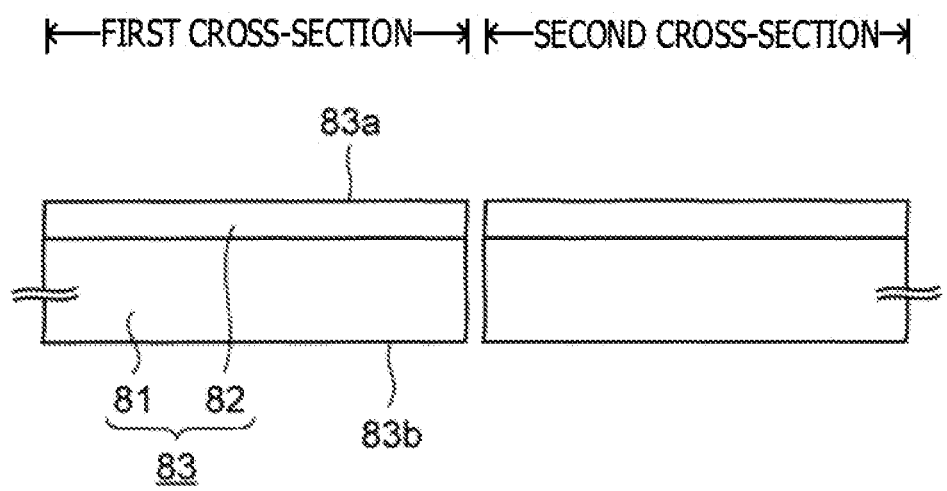
FIGS. 32A and 32B are cross-sectional views of a photodetector according to a third embodiment in the manufacturing process.

First, as illustrated in FIG. 32A, an n-type GaAs substrate is prepared as an n-type semiconductor substrate 81. The n-type impurity with which the n-type semiconductor substrate 81 is doped is not limited to any particular material. For example, the n-type semiconductor substrate 81 may be doped with silicon at a concentration of about $1 \times 10^{18}$ cm$^{-3}$.

A p-type GaAs layer of about 500 nm in thickness is then formed as a p-type semiconductor layer 82 on the n-type semiconductor substrate 81 by MOVPE, and the n-type semiconductor substrate 81 and the p-type semiconductor layer 82 constitute a photoelectric conversion layer 83.

In the photoelectric conversion layer 83, a pn junction is formed between the n-type semiconductor substrate 81 and the p-type semiconductor layer 82. When light enters the pn junction, a photocurrent is generated in the photoelectric conversion layer 83.

The photoelectric conversion layer 83 has a first principal surface 83a and a second principal surface 83b on the opposite sides, and light enters from the first principal surface 83a on the side of the p-type semiconductor layer 82.

Figure 32B:
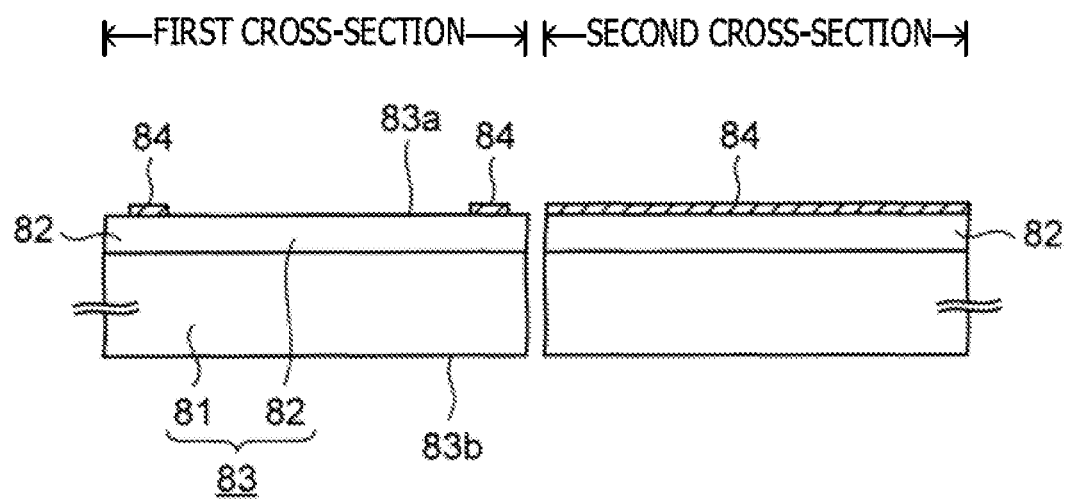

As illustrated in FIG. 32B, a metal layer of about 200 nm in thickness is then formed on the first principal surface 83a of the photoelectric conversion layer 83 by a vapor deposition technique. After that, patterning is performed on the metal layer by a liftoff technique, so that surface electrodes 84 are formed.

The metal layer is a laminated film in which an alloy layer of gold and germanium, and a gold layer are stacked in this order, for example.

Figure 33A:
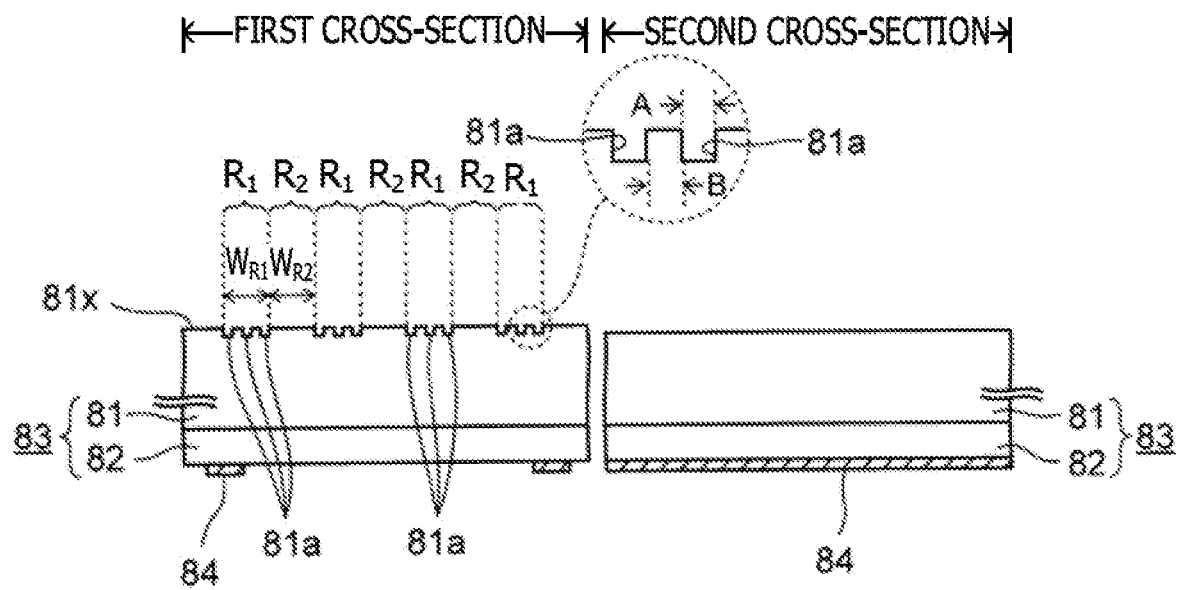
FIGS. 33A and 33B are cross-sectional views of the photodetector according to the third embodiment in the manufacturing process.

As illustrated in FIG. 33A, the photoelectric conversion layer 83 is then turned upside down, and patterning is performed on the n-type semiconductor substrate 81, so that a plurality of first fine grooves 81a is formed in a surface 81x of the n-type semiconductor substrate 81. Although the etching gas to be used in the patterning is not limited to any particular gas, chlorine gas may be used as the etching gas, for example.

The size of the first fine grooves 81a is not limited to any particular size, either. In the present embodiment, the width A of each first fine groove 81a is about 100 nm, and the interval B between each two adjacent first fine grooves 81a is about 100 nm. The depth of the first fine grooves 81a is about 100 nm, for example.

In this example, a plurality of first regions $R_1$ and a plurality of second regions $R_2$ are alternately formed on the surface 81x. The first fine grooves 81a are formed only in the first regions $R_1$, and are not formed in the second regions $R_2$.

The respective widths $W_{R1}$ and $W_{R2}$ of the first regions $R_1$ and the second regions $R_2$ are both about 0.5 μm.

Figure 33B:
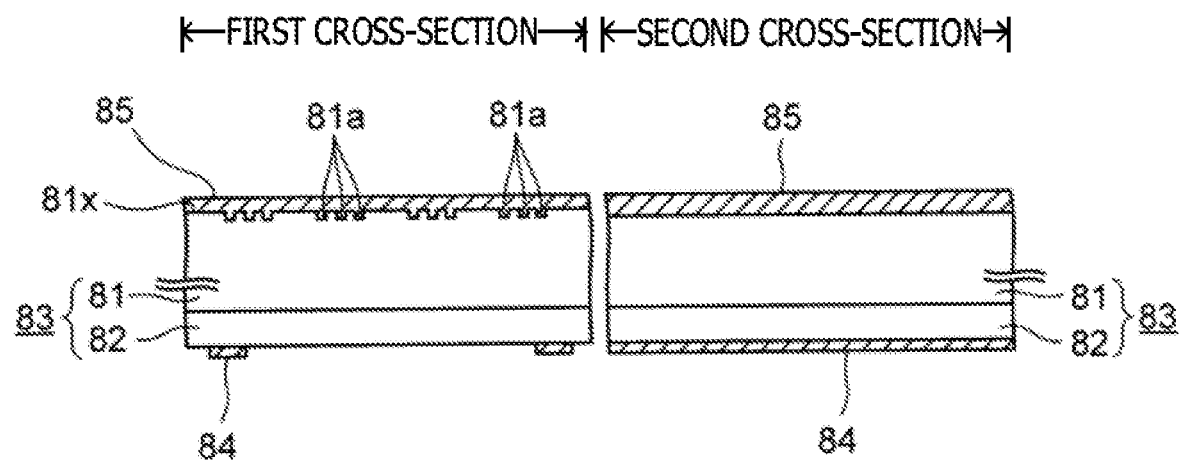

As illustrated in FIG. 33B, a platinum layer of about 10 nm in thickness is then formed on the surface 81x of the n-type semiconductor substrate 81 by sputtering. A gold layer of about 200 nm in thickness is further formed on the platinum layer by electrolytic plating, and the first fine grooves 81a are filled with a metal layer 85 including the platinum layer and the gold layer.

Figure 34A:
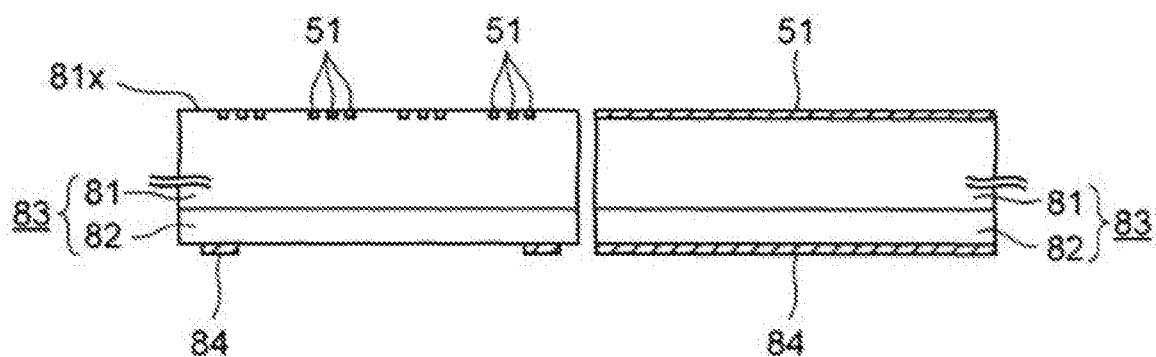
FIGS. 34A and 34B are cross-sectional views of the photodetector according to the third embodiment in the manufacturing process.

After that, as illustrated in FIG. 34A, the metal layer 85 is polished by chemical mechanical polishing (CMP), so that the metal layer 85 is removed from the surface 81x, and the metal layer 85 is left as metal wires 51 only in the first fine groove 81a.

The width of each metal wire 51 formed in this manner is about 100 nm, and the interval between each two adjacent metal wires 51 is about 100 nm. The thickness of each metal wire 51 is about 100 nm.

Figure 34B:
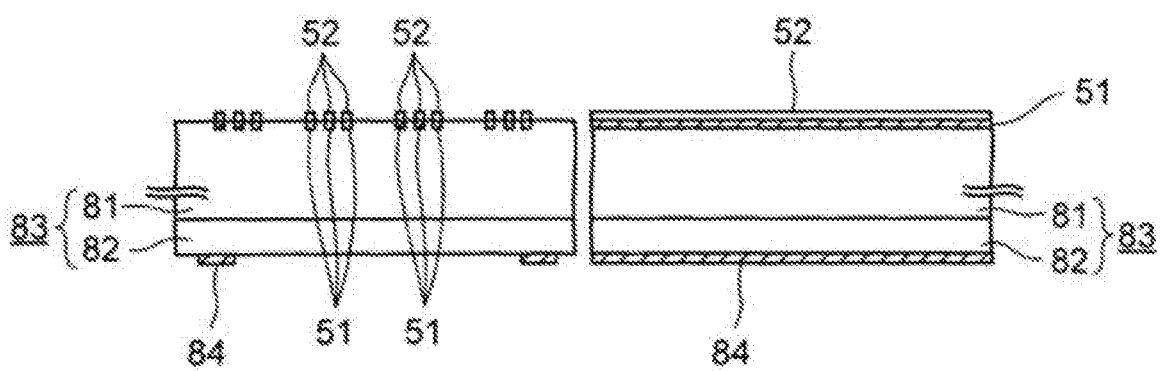

As illustrated in FIG. 34B, a silicon oxide layer 52 is then formed on the metal wires 51 in the same manner as in the first embodiment.

Figure 35A:
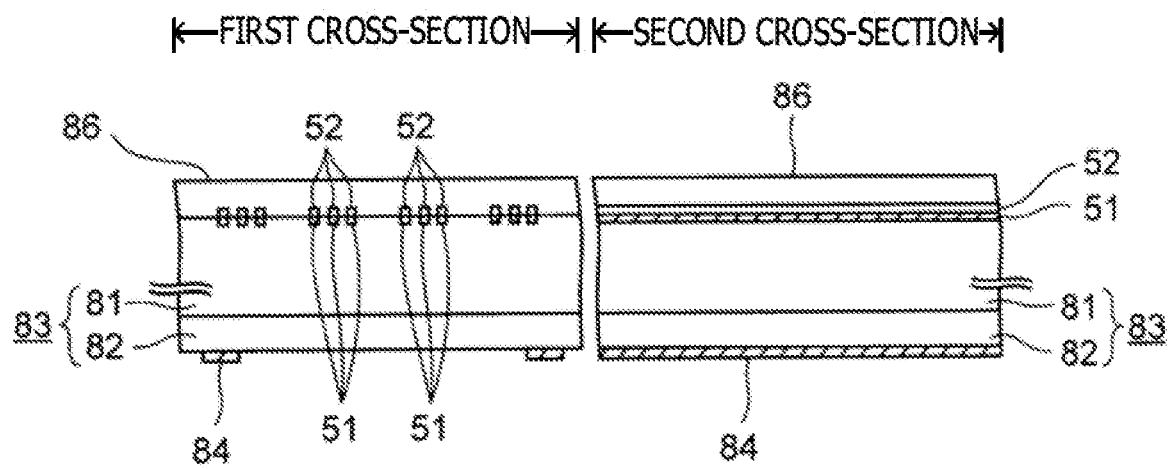
FIGS. 35A and 35B are cross-sectional views of the photodetector according to the third embodiment in the manufacturing process.

As illustrated in FIG. 35A, an n-type GaAs layer is then formed on the n-type semiconductor substrate 81 and the silicon oxide layer 52 by MOVPE, and the GaAs layer is used an n-type semiconductor layer 86.

After that, the upper surface of the n-type semiconductor layer 86 is polished and planarized by CMP.

Figure 35B:
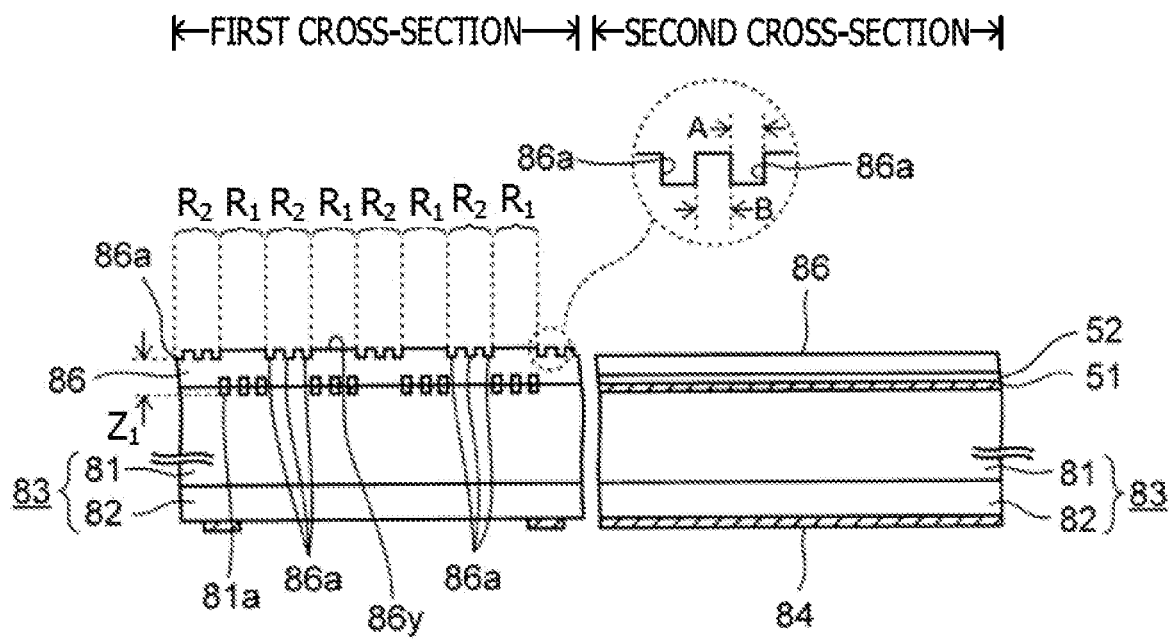

As illustrated in FIG. 35B, patterning is then performed on the n-type semiconductor layer 86, so that a plurality of second fine grooves 86a is formed in the upper surface 86y of the n-type semiconductor layer 86 in the second regions $R_2$. Chlorine gas may be used as the etching gas in the patterning, for example.

The size of the second fine grooves 86a is not limited to any particular size. For example, the width A of each second fine groove 86a is about 100 nm, and the interval B between each two adjacent second fine grooves 86a is about 100 nm. The depth of the second fine grooves 86a is about 100 nm, for example.

Further, the distance D between the bottom surface of each first fine groove 81a and the bottom surface of each corresponding second fine groove 86a is about 0.45 μm, for example.

The second fine grooves 86a are formed only in the second regions $R_2$, and are not formed in the first regions $R_1$.

Figure 36A:
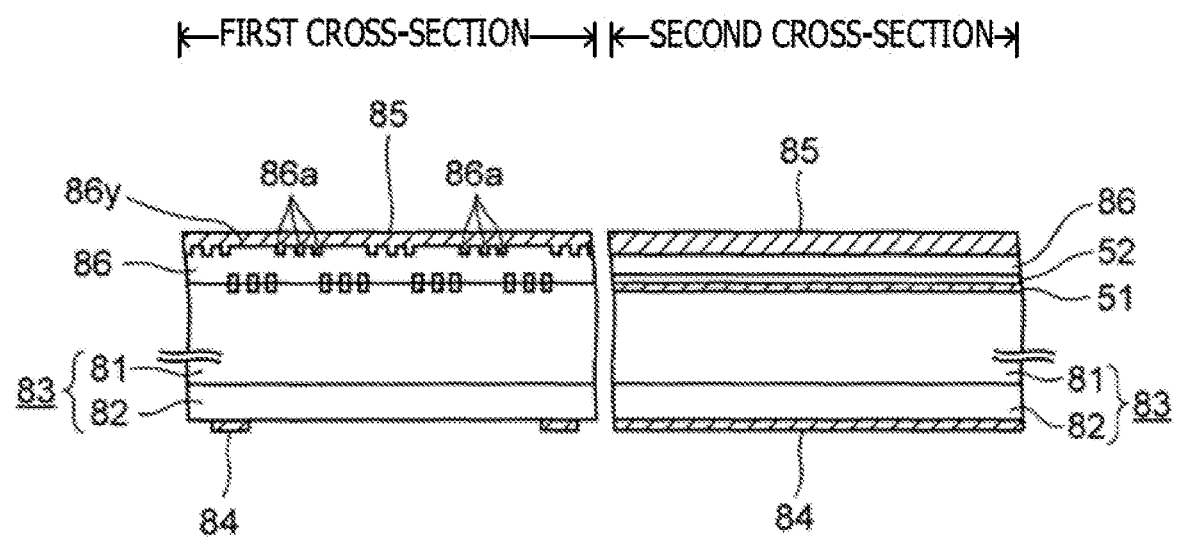
FIGS. 36A and 36B are cross-sectional views of the photodetector according to the third embodiment in the manufacturing process.

As illustrated in FIG. 36A, a platinum layer of about 10 nm in thickness is then formed on the upper surface 86y of the n-type semiconductor layer 86 by sputtering. A gold layer of about 200 nm in thickness is further formed on the platinum layer by electrolytic plating, and the second fine grooves 86a are filled with a metal layer 85 including the platinum layer and the gold layer.

Figure 36B:
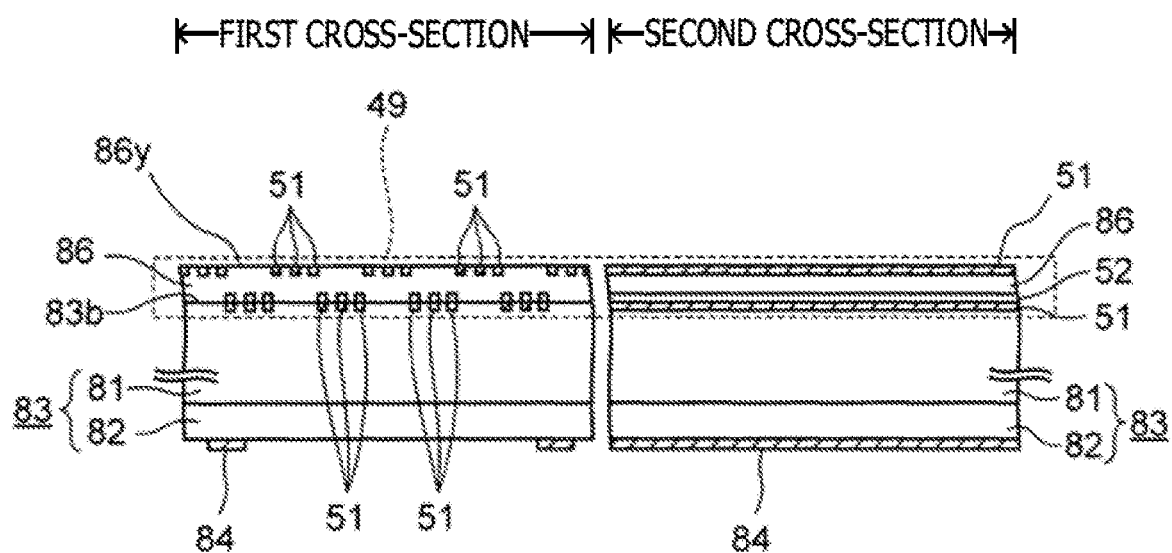

After that, as illustrated in FIG. 36B, the metal layer 85 is polished by CMP, and is removed from the upper surface 86y. The metal layer 85 is left as metal wires 51 only in the second fine grooves 86a.

Like the metal wires 51 formed in FIG. 34A, the width of each metal wire 51 formed in this step is about 100 nm, and the interval between each two adjacent metal wires 51 is about 100 nm. The thickness of each metal wire 51 is about 100 nm.

Through the steps described so far, a first diffraction grating 49 having the plurality of metal wires 51 formed on its surface is formed on the side of the second principal surface 83b of the photoelectric conversion layer 83.

Figure 39:
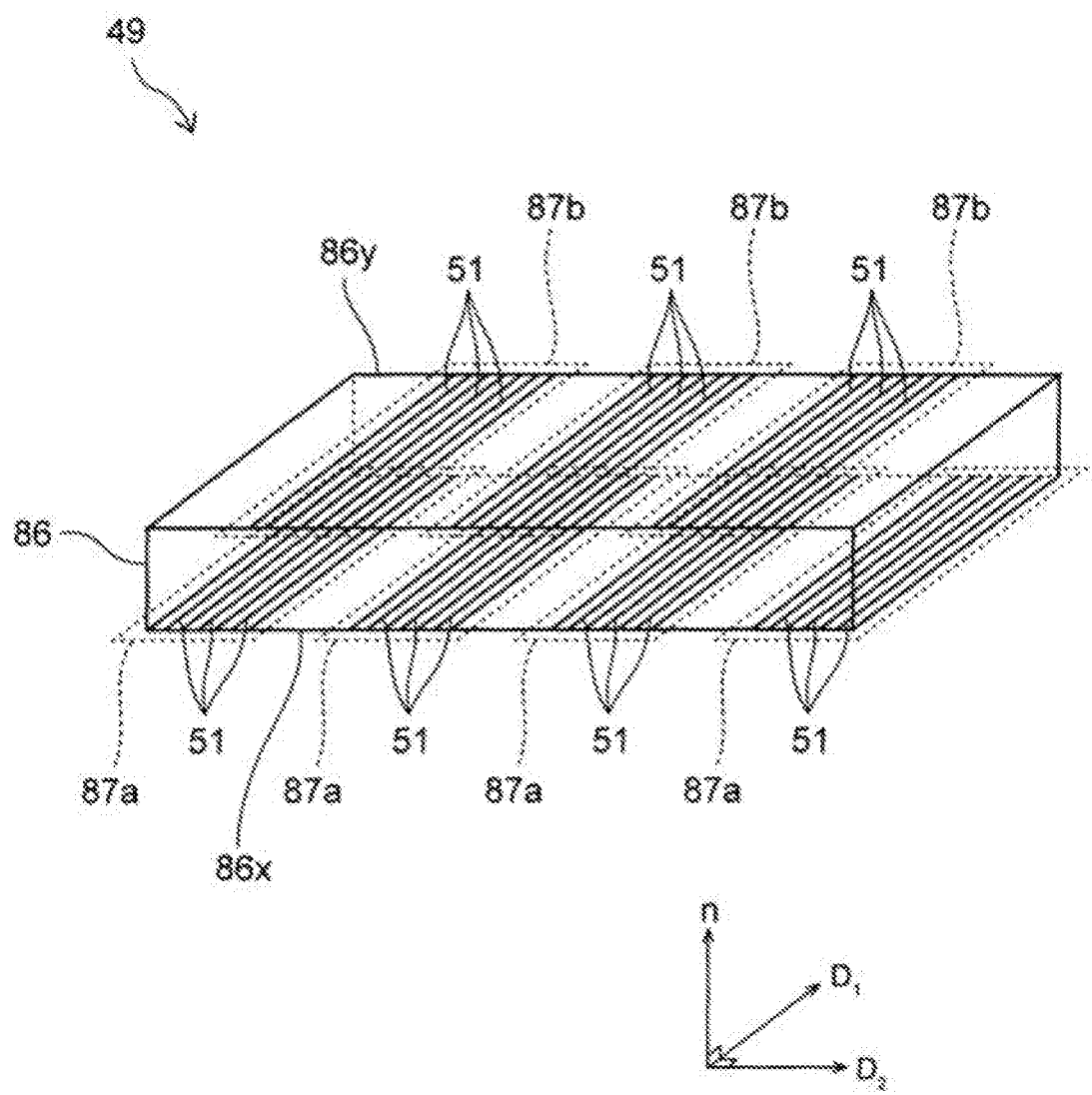
FIG. 39 is a perspective view of a first diffraction grating according to the third embodiment.

FIG. 39 is a perspective view of the first diffraction grating 49.

As illustrated in FIG. 39, a plurality of first surfaces 87a and a plurality of second surfaces 87b are alternately formed in the first diffraction grating 49, and there is a difference in height between the first surfaces 87a and the second surfaces 87b.

The first surfaces 87a are surfaces located in the above described first regions $R_1$ (see FIG. 35B) of the lower surface 86x of the n-type semiconductor layer 86, and extend in a stripe state in the first direction $D_1$ perpendicular to the normal direction n of the substrate 81. The second surfaces 87b are surfaces located in the above described second regions $R_2$ (see FIG. 35B) of the upper surface 86y of the n-type semiconductor layer 86, and extend in a stripe state in the first direction $D_1$.

The above described metal wires 51 are formed on the respective first surfaces 87a and the respective second surfaces 87b, and are not formed on the lower surface 86x and the upper surface 86y excluding these surfaces 87a and 87b.

Further, the metal wires 51 are formed to extend in the first direction $D_1$ on each of these surfaces 87a and 87b. These metal wires 51 function as wire grid polarizers that transmit or reflect light, depending on the polarization direction of the light, as in the second embodiment.

The first cross-section in each of FIGS. 32A through 38B is a cross-section taken along a section plane perpendicular to the first direction $D_1$, and the second cross-section is a cross-section taken along a section plane perpendicular to the second direction $D_2$.

Figure 37A:
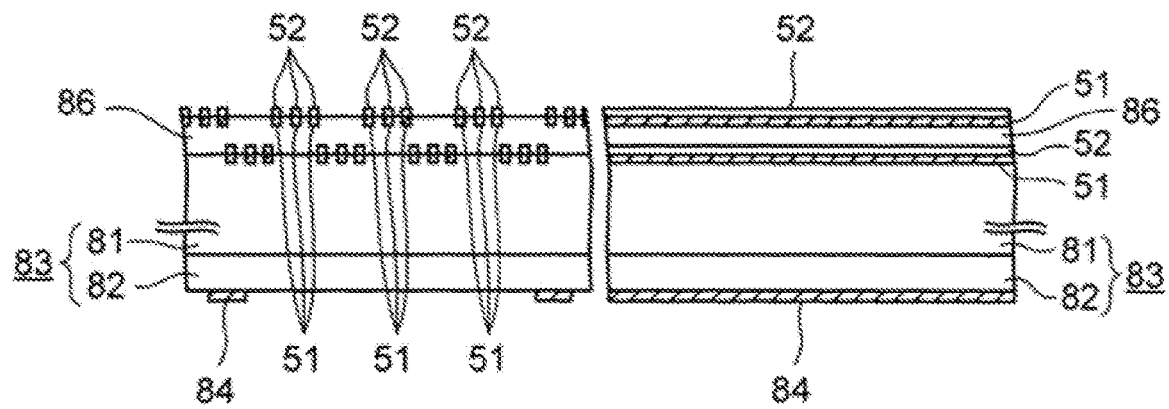
FIGS. 37A and 37B are cross-sectional views of the photodetector according to the third embodiment in the manufacturing process.

As illustrated in FIG. 37A, a silicon oxide layer 52 is then formed on the metal wires 51 in the same manner as in the step illustrated in FIG. 34B.

Figure 37B:
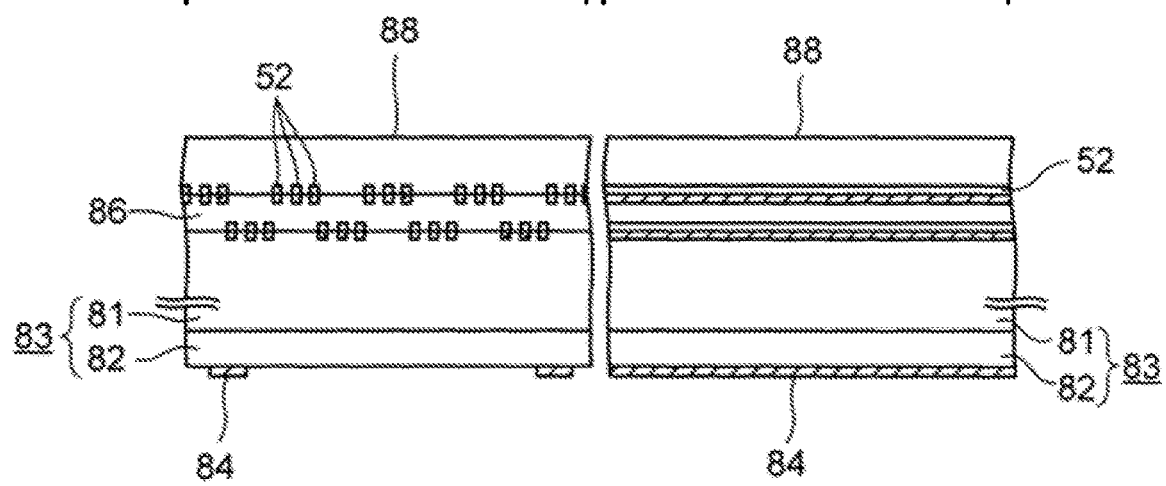

As illustrated in FIG. 37B, an n-type GaAs layer of about 2 μm in thickness is then formed on the n-type semiconductor layer 86 and the silicon oxide layer 52 by MOVPE, and the GaAs layer is used an n-type semiconductor layer 88.

After that, the surface of the n-type semiconductor layer 88 is polished and planarized by CMP.

Figure 38A:
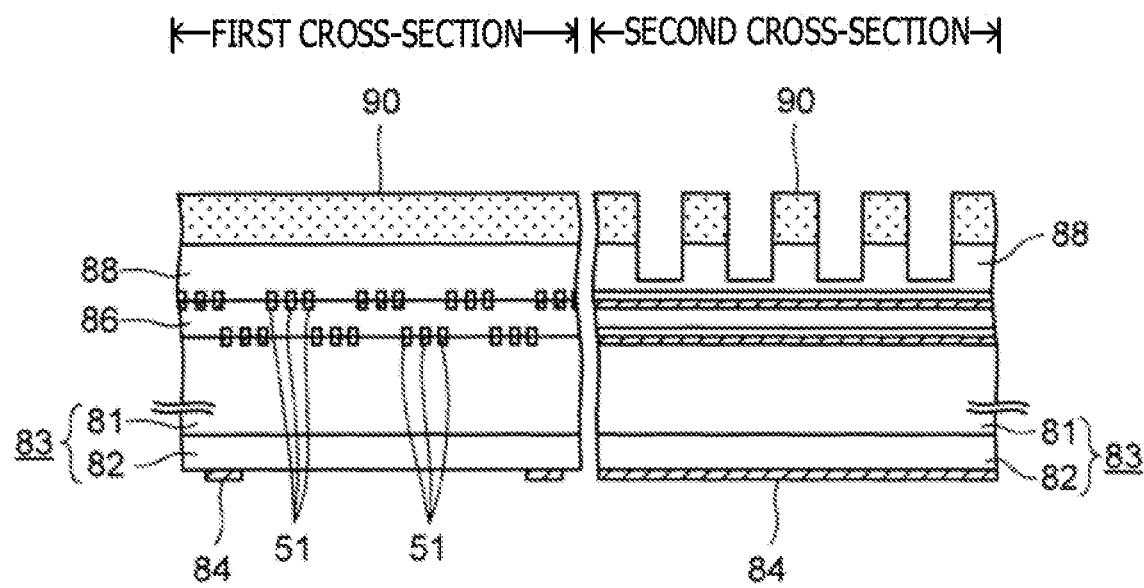
FIGS. 38A and 38B are cross-sectional views of the photodetector according to the third embodiment in the manufacturing process.

As illustrated in FIG. 38A, a second resist layer 90 is then formed on the n-type semiconductor layer 88.

With the second resist layer 90 being used as a mask, dry etching is then performed on the n-type semiconductor layer 88, so that a plurality of irregularities is formed in the n-type semiconductor layer 88. The etching gas to be used in the dry etching may be chlorine gas, for example.

After that, the second resist layer 90 is removed.

Figure 38B:
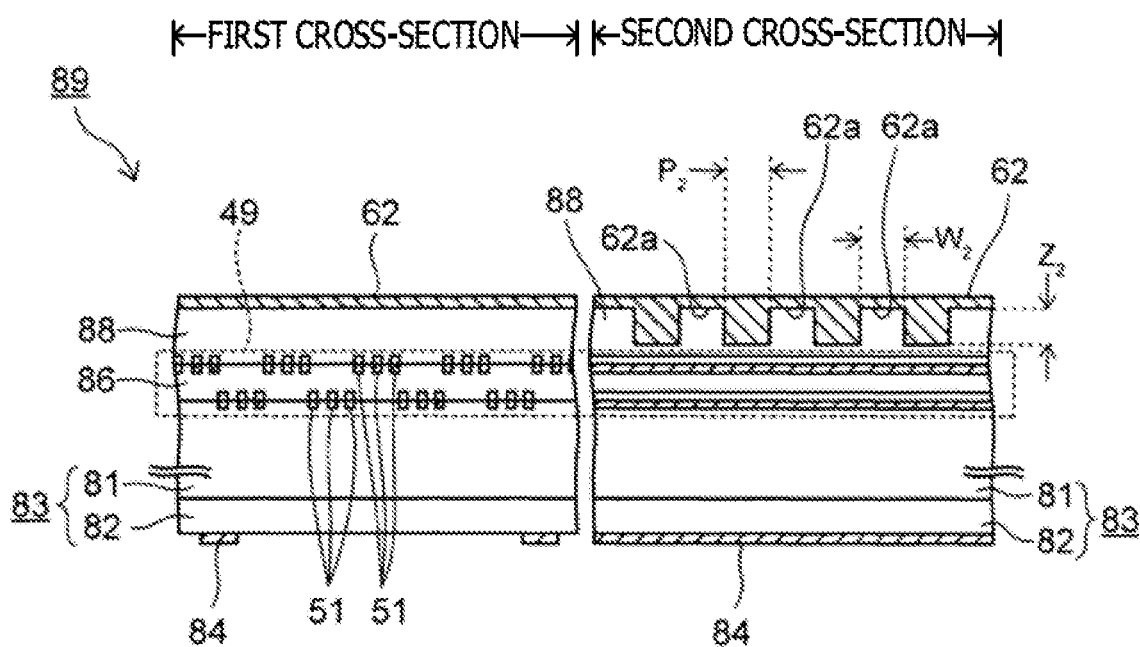

As illustrated in FIG. 38B, a metal layer of about 200 nm in thickness is then formed on the n-type semiconductor layer 88 by a vapor deposition technique, and the metal layer is used as a second diffraction grating 62.

The material of the metal layer is not limited to any particular material. In this example, a laminated film in which an alloy layer of gold and germanium and a gold layer are stacked in this order is formed as the metal layer.

As in the first embodiment, a plurality of second grooves 62a that reflects the irregularities of the n-type semiconductor layer 88 is formed in the second diffraction grating 62 formed as above.

The size of each second groove 62a is not limited to any particular size, but the depth $Z_2$ of each second groove 62a may be 0.45 µm, for example. The width $W_2$ of each second groove 62a is about 0.5 µm, and the interval $P_2$ between each two adjacent second grooves 62a is 0.5 µm, for example.

The second diffraction grating 62 also functions as a back electrode for extracting the photocurrent generated in the photoelectric conversion layer 83.

Figure 40:
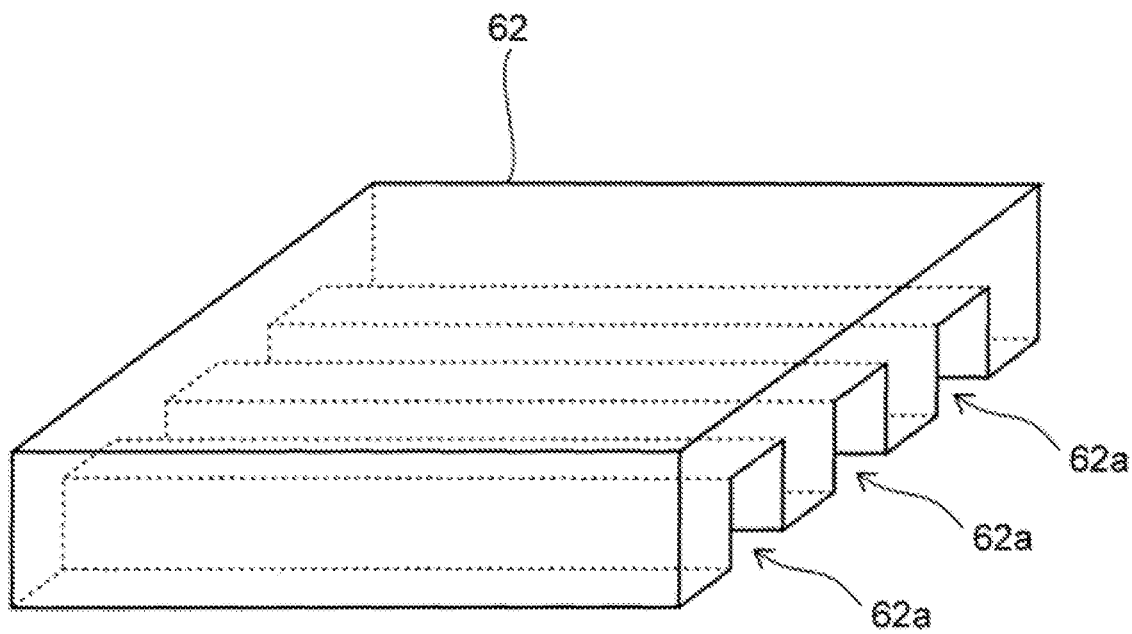
FIG. 40 is a perspective view of a second diffraction grating according to the third embodiment.

FIG. 40 is a perspective view of the second diffraction grating 62.

As illustrated in FIG. 40, the second grooves 62a extend in the second direction $D_2$ perpendicular to the first direction $D_1$, as in the first embodiment.

Through the above process, the fundamental structure of a photodetector 89 (see FIG. 38B) according to the present embodiment is completed.

Next, operation of the photodetector 89 is described.

Figure 41:
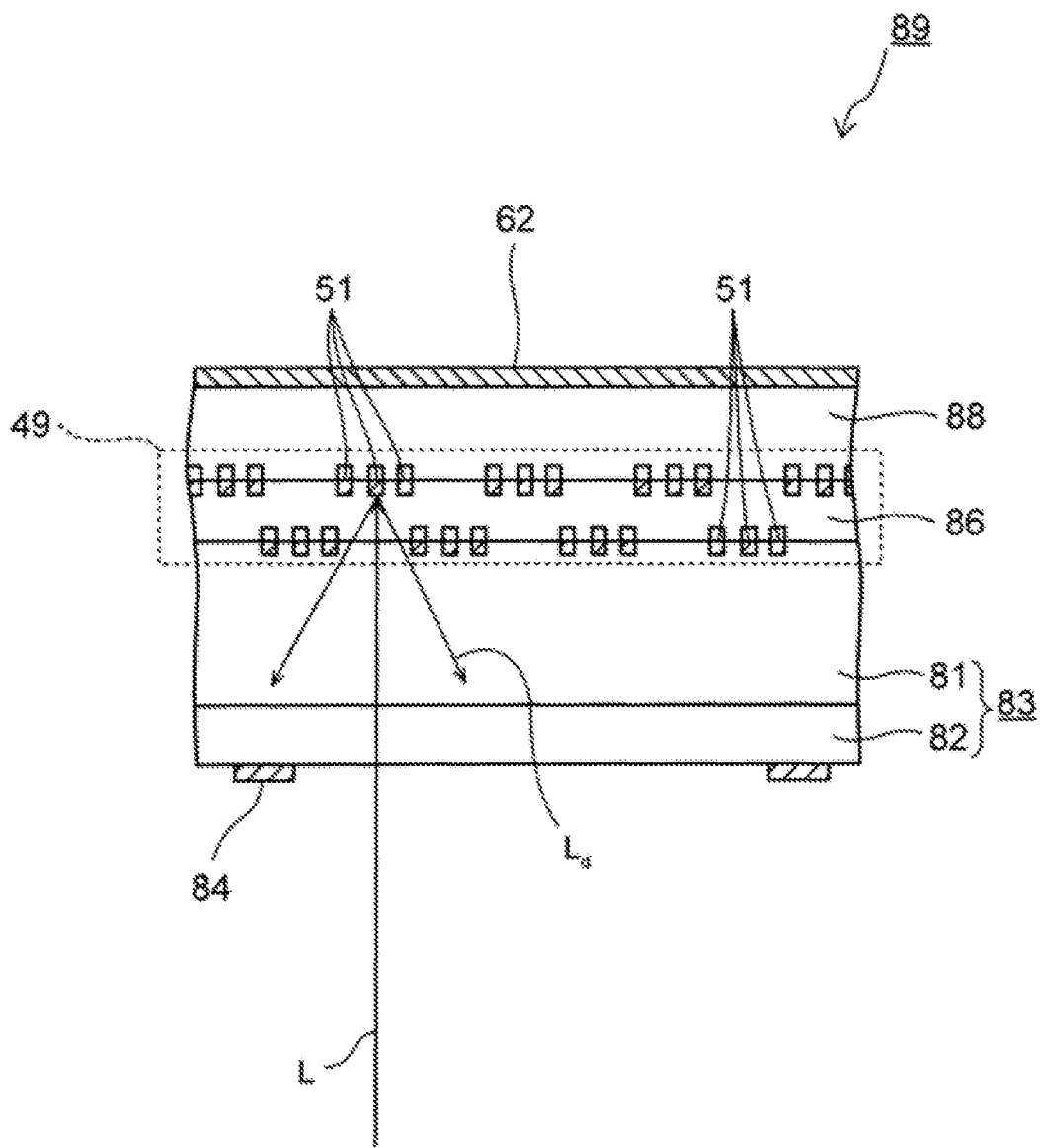
FIG. 41 is a schematic cross-sectional view for explaining operation of the photodetector according to the third embodiment.

FIG. 41 is a schematic cross-sectional view for explaining operation of the photodetector 89.

The photodetector 89 is a photovoltaic cell as described above, and a light L enters through the p-type semiconductor layer 82. Because of the light L, a photocurrent is then generated at the pn junction between the p-type semiconductor layer 82 and the n-type semiconductor substrate 81, and the photocurrent is extracted from the surface electrodes 84 and the second diffraction grating 62.

The light L that has entered the photodetector 89 is diffracted by the first diffraction grating 49 or the second diffraction grating 62, depending on the polarization state.

In the present embodiment, as illustrated in FIG. 39, the direction in which the metal wires 51 extend is the first direction $D_1$ as in the second embodiment. Accordingly, for the same reason as that in the second embodiment, the diffracted light $L_d$ generated in each of the diffraction gratings 49 and 62 is a TE wave, irrespective of the polarization state of the light L.

As described above, a TE wave is more likely to stay in a crystal layer such as the photoelectric conversion layer 83 than a TM wave, and its optical path is longer. Thus, the pn junction between the p-type semiconductor layer 82 and the n-type semiconductor substrate 81 has a greater chance of being exposed to a TM wave, and the photoelectric conversion efficiency in the photodetector 89 is enhanced.

Fourth Embodiment

In the present embodiment, an imaging device that uses a photodetector described in the first embodiment or the second embodiment is described.

Figure 42:
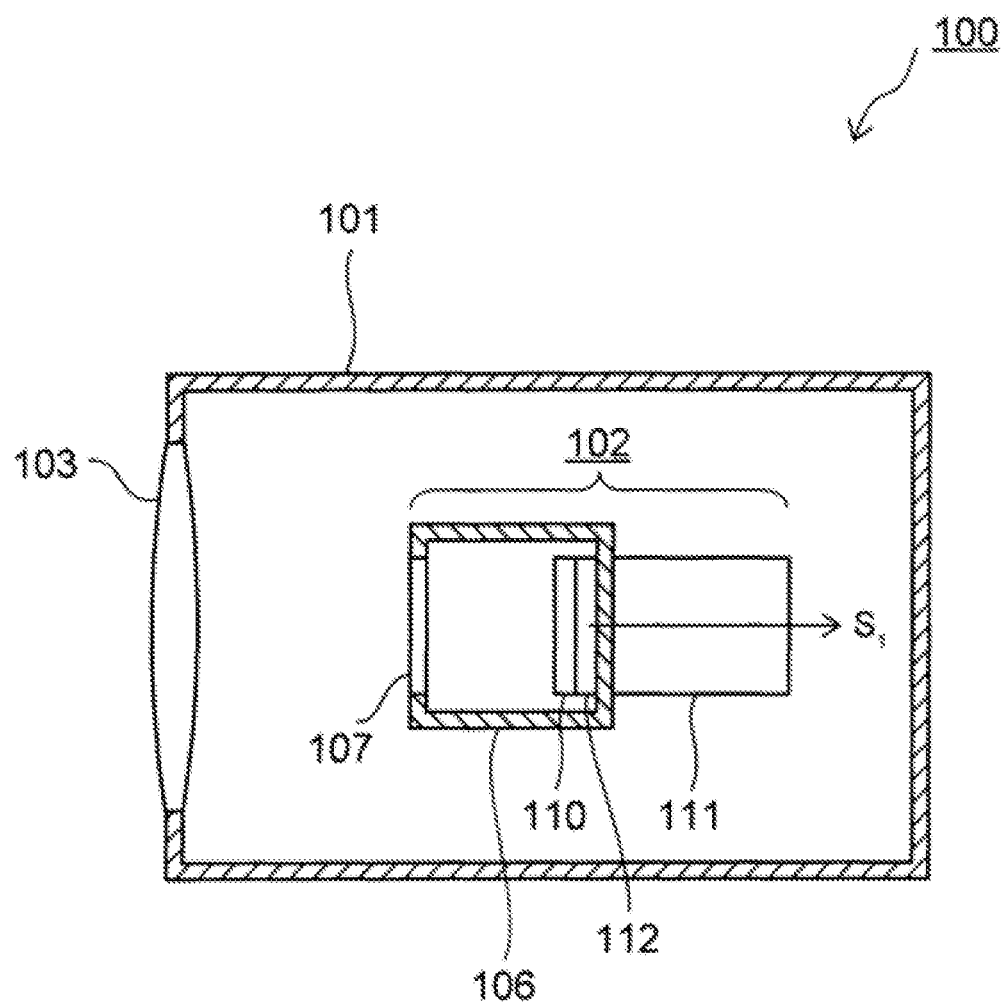
FIG. 42 is a configuration diagram of an imaging device according to a fourth embodiment.

FIG. 42 is a configuration diagram of an imaging device according to the present embodiment.

As illustrated in FIG. 42, an imaging device 100 includes a chassis 101, and an imaging unit 102 housed in the chassis 101.

In this imaging device 100, an imaging lens 103 for imaging an object is fixed to the chassis 101, and the imaging unit 102 is provided at a stage after the imaging lens 103.

The imaging unit 102 is a unit that converts an optical image of the object formed on the focal plane of the imaging lens 103 into an electrical signal, and includes a housing 106 and an optical window 107 fixed in the front face of the housing 106.

The optical window 107 is a flat plate that transmits light gathered by the imaging lens 103.

In the housing 106, the photodetector 68 according to the first embodiment or the photodetector 80 according to the second embodiment is housed as an imaging element 110 that acquires an optical image of the object.

The imaging element 110 is an element that receives medium to long wavelength infrared light having a wavelength of about 3 µm to 10 µm, and outputs a photocurrent corresponding to the intensity of the infrared light for each pixel. To avoid noise generation, the imaging element 110 is cooled by a cooler 111 that is a Peltier element or the like.

The interior of the housing 106 is evacuated so that condensation will not occur on the surfaces of the optical window 107 and the imaging element 110 when cooling is performed as above.

In the housing 106, a readout circuit 112 that reads out the photocurrent of the imaging element 110 for each pixel and outputs the photocurrent as an optical signal S1 is further provided.

Figure 43:
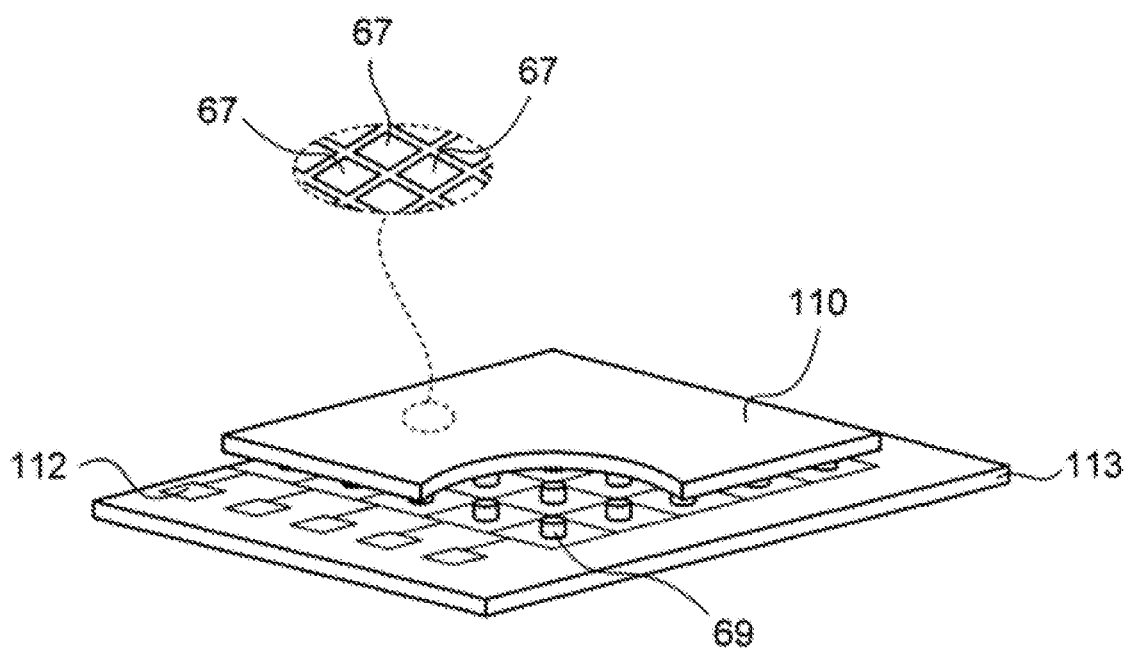
FIG. 43 is a perspective view of an imaging element according to the fourth embodiment.

FIG. 43 is a perspective view of the imaging element 110.

As illustrated in FIG. 43, the imaging element 110 is an FPA in which pixels 67 are arranged in an array in a plane.

The imaging element 110 is connected to a circuit board 113 via indium bumps 69, and is electrically connected to the readout circuit 112 provided on the circuit board 113.

Figure 44:
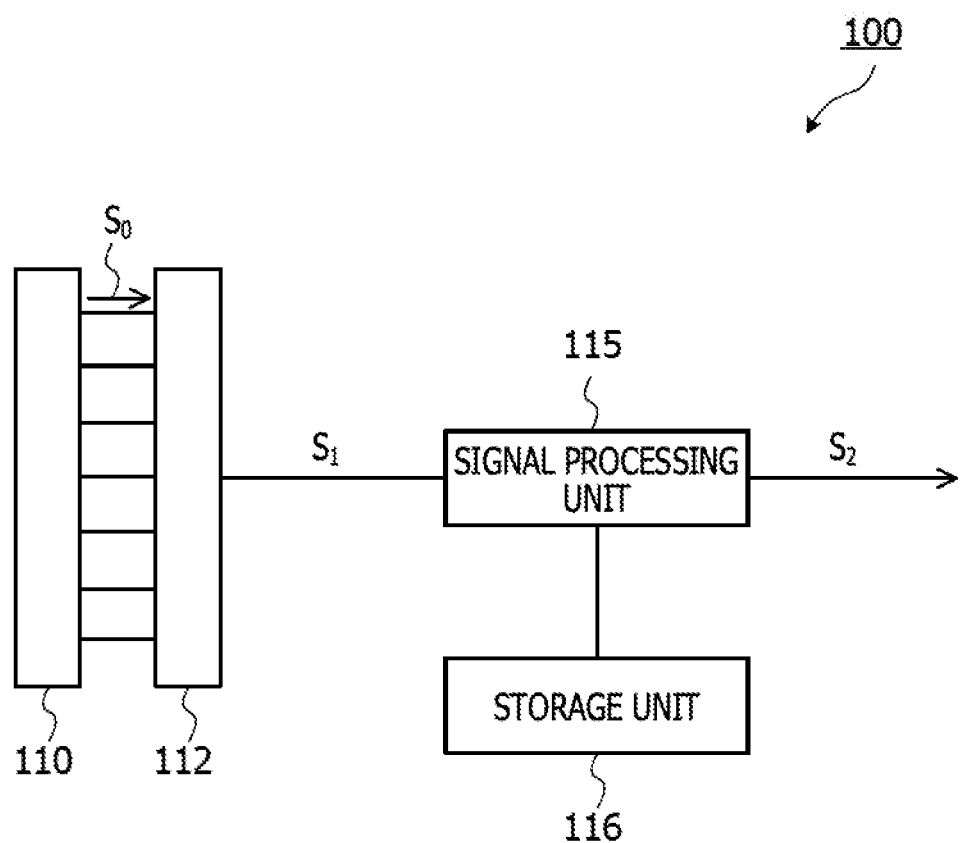
FIG. 44 is a functional block diagram of the imaging device according to the fourth embodiment.

FIG. 44 is a functional block diagram of the imaging device 100.

As illustrated in FIG. 44, a signal processing unit 115 and a storage unit 116 are provided in a stage after the readout circuit 112.

In this imaging device 100, the readout circuit 112 reads out the photocurrent $S_0$ output from the imaging element 110 for each pixel as described above, and outputs the optical signal S1 indicating the magnitude of the photocurrent $S_0$.

The signal processing unit 115 then performs correction such as sensitivity correction on the optical signal S1 for each pixel 67 (see FIG. 40), and outputs an image signal $S_2$ reflecting the correction.

The storage unit 116 stores correction coefficients for performing correction. For example, in a case where sensitivity correction is performed, the storage unit 116 stores a correction coefficient for offsetting variation in sensitivity among the pixels 67, and the signal processing unit 115 reads the correction coefficient from the storage unit 116. The signal processing unit 115 then multiplies the correction coefficient by the optical signal S1, to output the image signal $S_2$.

According to the present embodiment described above, either the photodetector 68 according to the first embodiment or the photodetector 80 according to the second embodiment is used as the imaging element 110. In these photodetectors 68 and 80, photoelectric conversion efficiency is enhanced by the first diffraction grating 49 and the second diffraction grating 62 as described above. Thus, it is possible to image an object with the imaging element 110 with high sensitivity.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A photodetector, comprising:
a photoelectric conversion layer including a first principal surface from which light enters and a second principal surface on the opposite side from the first principal surface and configured to perform photoelectric conversion on the light;
a first diffraction grating formed on a side of the second principal surface and including a configuration where a plurality of first surfaces which extend in a stripe state in a first direction and a plurality of second surfaces which extend in a stripe state in the first direction and have a height difference with respect to the first surfaces are alternately arranged;
a plurality of metal wires provided at intervals over each of the first surfaces and the second surfaces and which extend in the first direction or a second direction perpendicular to the first direction; and
a second diffraction grating formed over the first diffraction grating and including a plurality of grooves which are formed at intervals and extend in the second direction.

2. The photodetector according to claim 1, wherein the photoelectric conversion layer includes quantum well layers and barrier layers that are alternately stacked, and
the metal wires extend in the second direction.

3. The photodetector according to claim 1, wherein
the photoelectric conversion layer includes quantum dots and intermediate layers that are alternately stacked, and
the metal wires extend in the first direction.

4. The photodetector according to claim 2, further comprising:
a first semiconductor layer formed over the second principal surface of the photoelectric conversion layer and including the first surfaces and the second surfaces; and
a second semiconductor layer formed over the first semiconductor layer,
wherein the second diffraction grating is formed over the second semiconductor layer.

5. The photodetector according to claim 4, further comprising
a silicon oxide layer formed over the metal wires,
wherein the second semiconductor layer is formed over the silicon oxide layer.

6. The photodetector according to claim 1, wherein
the photoelectric conversion layer includes a semiconductor substrate of a first conductivity type, and a semiconductor layer of a second conductivity type formed over the semiconductor substrate, and
the metal wires extend in the first direction.

7. An imaging device comprising:
a plurality of pixels that are arranged in an array in a plane, and output photocurrent corresponding to intensity of received light; and
a readout circuit that reads out the photocurrent,
wherein the pixels each includes:
a photoelectric conversion layer including a first principal surface from which light enters and a second principal surface on the opposite side from the first principal surface and configured to perform photoelectric conversion on the light;
a first diffraction grating formed on a side of the second principal surface and including a configuration where a plurality of first surfaces which extend in a stripe state in a first direction and a plurality of second surfaces which extend in a stripe state in the first direction and have a height difference with respect to the first surfaces are alternately arranged;
a plurality of metal wires provided at intervals over each of the first surfaces and the second surfaces and which extend in the first direction or a second direction perpendicular to the first direction; and
a second diffraction grating formed over the first diffraction grating and including a plurality of grooves which are formed at intervals and extend in the second direction.

8. The imaging device according to claim 7, wherein the photoelectric conversion layer includes quantum well layers and barrier layers that are alternately stacked, and
the metal wires extend in the second direction.

9. The imaging device according to claim 7, wherein
the photoelectric conversion layer includes quantum dots and intermediate layers that are alternately stacked, and
the metal wires extend in the first direction.

10. The imaging device according to claim 8, wherein the pixels each further includes:
a first semiconductor layer formed over the second principal surface of the photoelectric conversion layer and including the first surfaces and the second surfaces; and
a second semiconductor layer formed over the first semiconductor layer,
wherein the second diffraction grating is formed over the second semiconductor layer.

11. The imaging device according to claim 10, wherein the pixels each further includes:
a silicon oxide layer formed over the metal wires,
wherein the second semiconductor layer is formed over the silicon oxide layer.

12. The imaging device according to claim 7, wherein
the photoelectric conversion layer includes a semiconductor substrate of a first conductivity type, and a semiconductor layer of a second conductivity type formed over the semiconductor substrate, and
the metal wires extend in the first direction.

* * * * *